(12) United States Patent
Shimomura et al.

(10) Patent No.: US 8,981,379 B2
(45) Date of Patent: Mar. 17, 2015

(54) SEMICONDUCTOR DEVICE

(75) Inventors: Akihisa Shimomura, Isehara (JP); Hidekazu Miyairi, Isehara (JP); Fumito Isaka, Zama (JO); Yasuhiro Jinbo, Atsugi (JP); Junya Maruyama, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/239,853

(22) Filed: Sep. 22, 2011

(65) Prior Publication Data
US 2012/0007078 A1   Jan. 12, 2012

Related U.S. Application Data

(63) Continuation of application No. 11/826,228, filed on Jul. 13, 2007, now Pat. No. 8,034,724.

(30) Foreign Application Priority Data

Jul. 21, 2006   (JP) .................................. 2006-199241

(51) Int. Cl.
| | | |
|---|---|---|
| H01L 29/04 | (2006.01) | |
| H01L 21/20 | (2006.01) | |
| H01L 27/12 | (2006.01) | |
| H01L 29/786 | (2006.01) | |

(52) U.S. Cl.
CPC ........ *H01L 21/2026* (2013.01); *H01L 27/1214* (2013.01); *H01L 27/1266* (2013.01); *H01L 29/78603* (2013.01)

USPC ............................................................ 257/75

(58) Field of Classification Search
USPC ....................................................... 257/65, 75
See application file for complete search history.

(56) References Cited

U.S. PATENT DOCUMENTS

| | | | |
|---|---|---|---|
| 4,692,190 | A | 9/1987 | Komatsu |
| 4,888,305 | A | 12/1989 | Yamazaki et al. |
| 4,986,213 | A | 1/1991 | Yamazaki et al. |
| 5,171,710 | A | 12/1992 | Yamazaki et al. |
| 5,173,129 | A | 12/1992 | Nishiike et al. |
| 5,296,405 | A | 3/1994 | Yamazaki et al. |

(Continued)

FOREIGN PATENT DOCUMENTS

| | | |
|---|---|---|
| EP | 0211634 A | 2/1987 |
| EP | 1553643 A | 7/2005 |

(Continued)

*Primary Examiner* — Bradley K Smith
(74) *Attorney, Agent, or Firm* — Eric J. Robinson; Robinson Intellectual Property Law Office, P.C.

(57) ABSTRACT

It is an object to provide a method of manufacturing a crystalline silicon device and a semiconductor device in which formation of cracks in a substrate, a base protective film, and a crystalline silicon film can be suppressed. First, a layer including a semiconductor film is formed over a substrate, and is heated. A thermal expansion coefficient of the substrate is $6 \times 10^{-7}/°$ C. to $38 \times 10^{-7}/°$ C., preferably $6 \times 10^{-7}/°$ C. to $31.8 \times 10^{-7}/°$ C. Next, the layer including the semiconductor film is irradiated with a laser beam to crystallize the semiconductor film so as to form a crystalline semiconductor film. Total stress of the layer including the semiconductor film is $-500$ N/m to $+50$ N/m, preferably $-150$ N/m to $0$ N/m after the heating step.

13 Claims, 24 Drawing Sheets

(56) References Cited

U.S. PATENT DOCUMENTS

| | | |
|---|---|---|
| 5,306,651 A | 4/1994 | Masumo et al. |
| 5,352,291 A | 10/1994 | Zhang et al. |
| 5,389,450 A | 2/1995 | Kennedy et al. |
| 5,411,563 A | 5/1995 | Yeh et al. |
| 5,578,520 A | 11/1996 | Zhang et al. |
| 5,640,045 A | 6/1997 | Krausse, III |
| 5,753,542 A | 5/1998 | Yamazaki et al. |
| 5,861,337 A | 1/1999 | Zhang et al. |
| 5,874,175 A | 2/1999 | Li |
| 5,962,869 A | 10/1999 | Yamazaki et al. |
| 6,168,980 B1 | 1/2001 | Yamazaki et al. |
| 6,174,374 B1 | 1/2001 | Zhang et al. |
| 6,380,558 B1 | 4/2002 | Yamazaki et al. |
| 6,423,586 B1 | 7/2002 | Yamazaki et al. |
| 6,494,162 B1 | 12/2002 | Zhang et al. |
| 6,645,826 B2 | 11/2003 | Yamazaki et al. |
| 6,770,143 B2 | 8/2004 | Zhang et al. |
| 6,834,943 B2 | 12/2004 | Ogawa et al. |
| 6,881,615 B2 | 4/2005 | Yamazaki et al. |
| 7,015,505 B2 | 3/2006 | Yamazaki et al. |
| 7,019,385 B1 | 3/2006 | Zhang et al. |
| 7,091,110 B2 | 8/2006 | Ohnuma |
| 7,132,686 B2 | 11/2006 | Yamazaki et al. |
| 7,282,380 B2 | 10/2007 | Maruyama et al. |
| 7,329,906 B2 | 2/2008 | Yamazaki et al. |
| 7,416,907 B2 | 8/2008 | Yamazaki et al. |
| 7,435,635 B2 | 10/2008 | Yamazaki et al. |
| 7,575,959 B2 | 8/2009 | Tokunaga |
| 7,576,362 B2 | 8/2009 | Takayama et al. |
| 7,608,527 B2 | 10/2009 | Tanaka et al. |
| 7,619,251 B2 | 11/2009 | Sato et al. |
| 7,838,346 B2 | 11/2010 | Tokunaga |
| 8,044,397 B2 | 10/2011 | Takayama et al. |
| 8,053,290 B2 | 11/2011 | Tokunaga |
| 8,338,238 B2 | 12/2012 | Tokunaga |
| 2002/0034698 A1 | 3/2002 | Uno et al. |
| 2003/0032221 A1 | 2/2003 | Kasahara et al. |
| 2003/0057489 A1 | 3/2003 | Yamazaki |
| 2003/0232468 A1* | 12/2003 | Ohnuma ................. 438/166 |
| 2004/0130005 A1* | 7/2004 | Guzman et al. ............. 257/636 |
| 2004/0238827 A1* | 12/2004 | Takayama et al. ............. 257/79 |
| 2006/0043510 A1 | 3/2006 | Yamazaki et al. |
| 2006/0270130 A1 | 11/2006 | Sato et al. |
| 2007/0096107 A1 | 5/2007 | Brown |
| 2012/0018729 A1 | 1/2012 | Takayama et al. |

FOREIGN PATENT DOCUMENTS

| | | |
|---|---|---|
| JP | 05-182923 | 7/1993 |
| JP | 3105396 | 10/2000 |
| JP | 2003-249661 | 9/2003 |
| JP | 2004-281182 A | 10/2004 |
| JP | 2005-210102 A | 8/2005 |
| JP | 2006-179874 A | 7/2006 |
| KR | 96-001466 B | 1/1996 |
| KR | 0131062 B | 11/1997 |

* cited by examiner

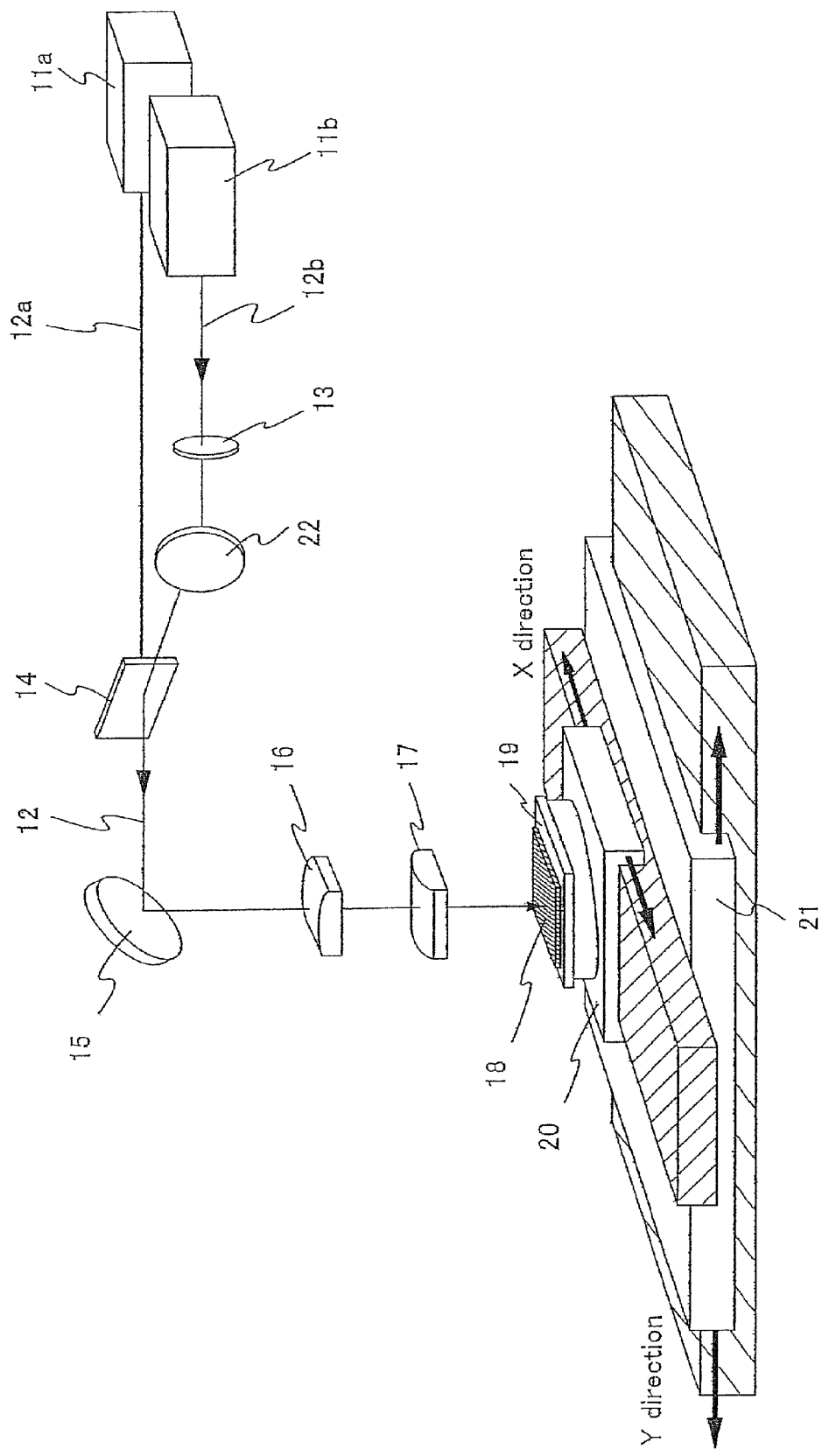

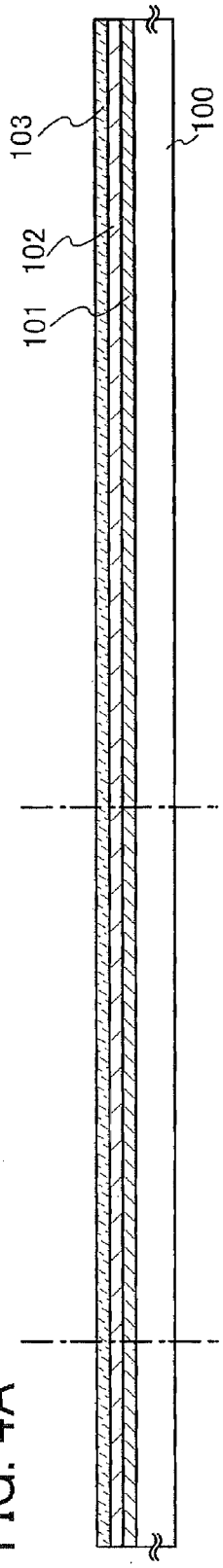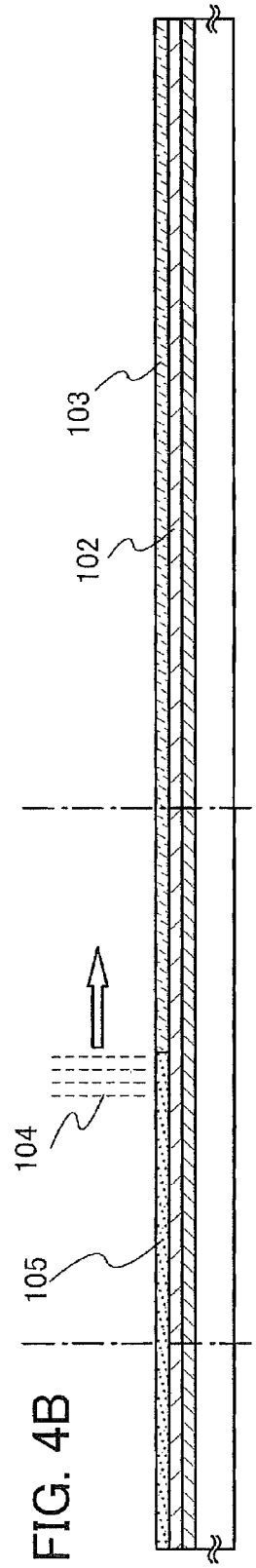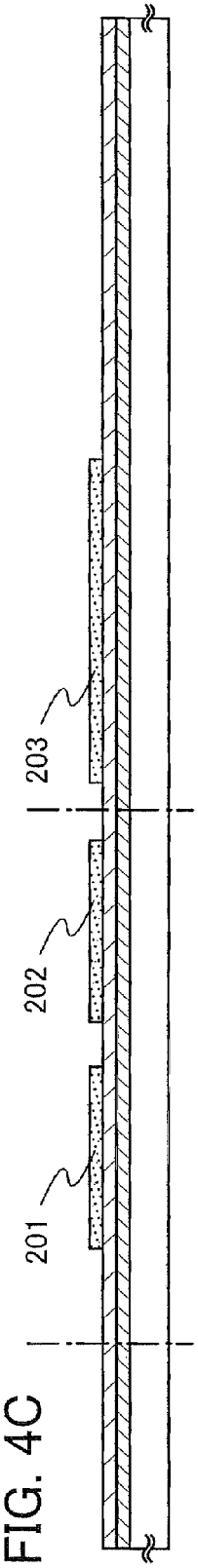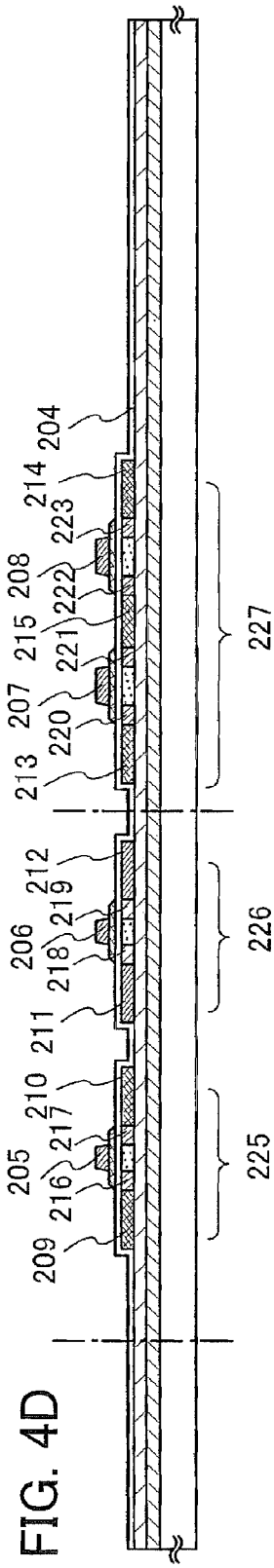

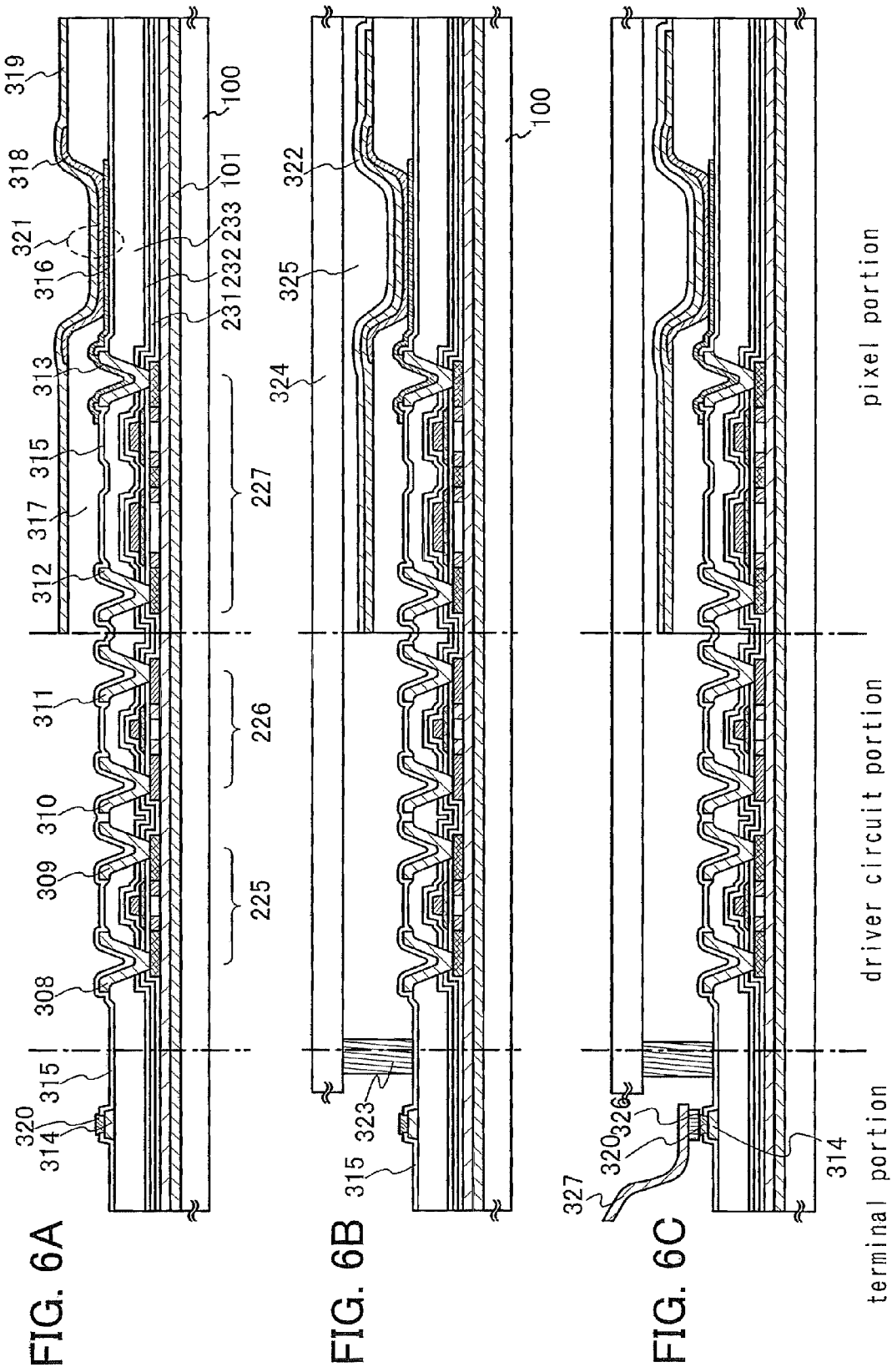

SEMICONDUCTOR DEVICE

BACKGROUND OF THE INVENTION

1. Field of the Invention

The present invention relates to a method for manufacturing a semiconductor device having a semiconductor element over a substrate with an insulating film therebetween.

2. Description of the Related Art

As a conventional method for manufacturing a polycrystalline semiconductor used for a thin film device such as an insulated-gate field-effect transistor, there is a method which employs a laser annealing method (for example, see Patent Document 1: Japanese Published patent application No. H 5-182923). Specifically, a silicon oxide film which is a base protective film is formed over a glass substrate, and an amorphous silicon film is formed over the silicon oxide film. Subsequently, heat annealing is performed to reduce the concentration of hydrogen contained in the amorphous silicon film, and a KrF excimer laser beam is irradiated onto the amorphous silicon film to crystallize the amorphous silicon film, thereby forming a polycrystalline silicon film.

SUMMARY OF THE INVENTION

However, in a case where the above-described laser annealing method is used, there is a problem in that when the power of the laser beam is high, a crack may form in the substrate, the base protective film, or the crystalline silicon film. Consequently, the yield of semiconductor devices having the thin film device is reduced.

Therefore, an object of the present invention is to provide a method for manufacturing a crystalline silicon film and a method for manufacturing a semiconductor device in which the formation of a crack in a substrate, a base protective film, and a crystalline silicon film can be suppressed.

In the present invention, a layer including a semiconductor film is formed over a substrate which has a thermal expansion coefficient of greater than $6\times10^{-7}/°$ C. and less than or equal to $38\times10^{-7}/°$ C., preferably greater than $6\times10^{-7}/°$ C. and less than or equal to $31.8\times10^{-7}/°$ C., and the layer is heated. Next, the heated layer is irradiated with a laser beam to crystallize the semiconductor film, thereby forming a crystalline semiconductor film. Stress of the layer including the semiconductor film, which is formed over the substrate, may be tensile stress or compressive stress after it is formed, as appropriate. However, as the layer including the semiconductor film, a layer whose total stress (stress integrated in a film thickness direction) after the above-mentioned heating is −500 N/m to +50 N/m, inclusive, preferably −150 N/m to 0 N/m, inclusive, is formed.

When the layer formed over the substrate which has a thermal expansion coefficient of greater than $6\times10^{-7}/°$ C. and less than or equal to $38\times10^{-7}/°$ C., preferably greater than $6\times10^{-7}/°$ C. and less than or equal to $31.8\times10^{-7}/°$ C., is irradiated with the laser beam, energy of the laser beam which is irradiated onto the layer reaches a surface of the substrate, and an irradiation part of the laser beam and also the substrate surface located in the vicinity thereof are heated. Directly below the irradiation part of the laser beam, the transmissibility of the energy of the laser beam is high, so the substrate surface softens. Further, in the vicinity of the irradiation part of the laser beam, the substrate surface is heated and its volume expands, so compressive stress occurs. Meanwhile, outside the region where compressive stress has occurred, tensile stress occurs as a reaction to the compressive stress. When the laser beam moves, the softened substrate surface also gradually cools and its volume contracts, so tensile stress occurs. Meanwhile, in the vicinity of the irradiation part of the laser beam, the heated substrate surface cools to room temperature. However, compressive stress remains. Due to the difference between the tensile stress and the compressive stress, a heat distortion remains in the substrate. If this heat distortion becomes larger than the rupture stress of the substrate, a crack forms in the substrate, and a crack also forms in the layer formed over the substrate surface. However, by forming a layer including a semiconductor film whose total stress after being heated is −500 N/m to +50 N/m, inclusive, preferably −150 N/m to 0 N/m, inclusive, over the substrate, the heat distortion which is generated in the substrate surface can be eased. As a result, the number of cracks in the substrate and the layer formed over the substrate can be reduced.

As the layer including a semiconductor film which is formed over the substrate surface, a layer having a film thickness and a film stress such that after being heated the layer has a total stress in the range of −500 N/m to +50 N/m, inclusive, preferably −150 N/m to 0 N/m, inclusive, is formed.

Here, given that the film stress of each layer included in the layer including a semiconductor film contributes to linearity with respect to the total stress, if the stress of each layer is σ and the film thickness of each layer is d, the total stress S is approximately calculated by the mathematical formula below. Therefore, even if there is a layer in which tensile stress is generated in the layers included in the layer including a semiconductor film, if compressive stress is generated in another layer, the total stress of the layer including a semiconductor film after being heated can be in the range of −500 N/m to +50 N/m, inclusive, preferably −150 N/m to 0 N/m, inclusive.

$$S = \sum_i \sigma_i d_i \qquad \text{[Mathematical Formula 1]}$$

By forming a layer whose total stress after being heated is −500 N/m to +50 N/m, inclusive, preferably −150 N/m to 0 N/m, inclusive, over a substrate whose thermal expansion coefficient is greater than $6\times10^{-7}/°$ C. and less than or equal to $38\times10^{-7}/°$ C., preferably greater than $6\times10^{-7}/°$ C. and less than or equal to $31.8\times10^{-7}/°$ C., the formation of cracks in the substrate and the layer formed over the substrate when the layer formed over the substrate is irradiated with a continuous wave laser beam or a pulsed laser beam having a frequency of 10 MHz or more can be suppressed. That is, when the layer is irradiated with the laser beam, energy of the laser beam reaches the substrate, and in a part of the substrate having a thermal expansion coefficient of greater than $6\times10^{-7}/°$ C. and less than or equal to $38\times10^{-7}/°$ C., preferably greater than $6\times10^{-7}/°$ C. and less than or equal to $31.8\times10^{-7}/°$ C., a heat distortion is generated as a result of the heating by the laser beam irradiation and cooling. Due to the heat distortion, tensile stress is generated in a part of the substrate surface. However, since a layer having compressive stress is formed over the substrate, the tensile stress of the substrate surface can be eased. Therefore, the formation of cracks in the substrate and the layer can be suppressed. As a result, the number of defective semiconductor devices can be reduced, and yield can be improved.

BRIEF DESCRIPTION OF DRAWINGS

FIG. 3 shows an outline of a laser irradiation apparatus which can be applied to the invention.

FIGS. 4A to 4D illustrate cross-sectional views of a method of manufacturing a semiconductor device of the invention.

FIGS. 6A to 6C illustrate cross-sectional views of a method of manufacturing a semiconductor device of the invention.

DETAILED DESCRIPTION OF THE INVENTION

Embodiment modes of the invention will be described below, with reference to the drawings. However, the invention can be carried out in many different modes, and it will be readily apparent to those skilled in the art that various changes can be made to the modes and details described herein without departing from the spirit and scope of the invention. Therefore, the invention should not be construed as being limited to the description of the embodiment modes.

Embodiment Mode 1

Figure 1A:
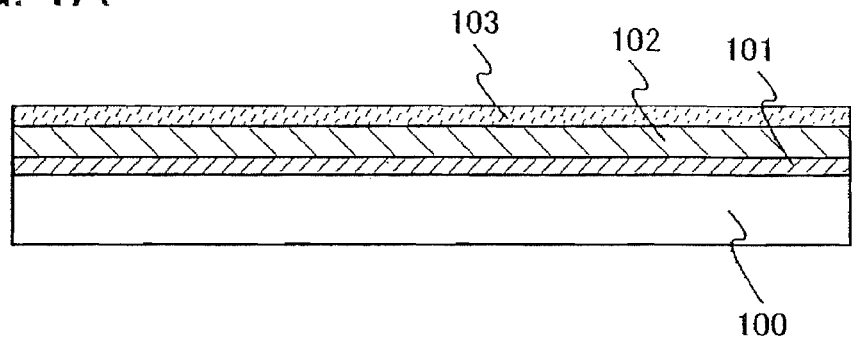
FIGS. 1A to 1D illustrate cross-sectional views of a method of manufacturing a semiconductor device of the invention.

As shown in FIG. 1A, over one surface of a substrate 100 having an insulating surface, insulating films 101 and 102 which serve as base protective films are formed, and an amorphous semiconductor film 103 is formed over the insulating film 102. Next, in order to remove hydrogen of the amorphous semiconductor film, the amorphous semiconductor film is heated. At this time, the substrate and the insulating films which serve as base protective films are also heated. The insulating films 101 and 102 which serve as base protective films and the amorphous semiconductor film 103 are formed such that the total stress of the insulating films 101 and 102 and the amorphous semiconductor film 103 after the heating is −500 N/m to +50 N/m, inclusive, preferably −150 N/m to 0 N/m, inclusive.

As the substrate 100 having an insulating surface, a substrate which has a thermal expansion coefficient of greater than $6 \times 10^{-7}$/° C. and less than or equal to $38 \times 10^{-7}$/° C., preferably greater than $6 \times 10^{-7}$/° C. and less than or equal to $31.8 \times 10^{-7}$/° C., is used. As representative examples of a substrate having a thermal expansion coefficient of greater than $6 \times 10^{-7}$/° C. and less than or equal to $38 \times 10^{-7}$/° C., preferably greater than $6 \times 10^{-7}$/° C. and less than or equal to $31.8 \times 10^{-7}$/° C., an AN100 substrate (manufactured by Asahi Glass Co., Ltd), an EAGLE2000 substrate (manufactured by Corning, Inc.), and the like can be given. Further, as the substrate 100 having an insulating surface, a substrate with a thickness of 0.5 mm to 1.2 mm, inclusive, can be used. Here, for example, an AN100 glass substrate with a thickness of 0.7 mm is used.

Subsequent to forming the insulating films 101 and 102 and the amorphous semiconductor film 103 over one surface of the substrate, heat treatment may be conducted at a temperature at which the hydrogen contained in the amorphous semiconductor film can be removed. Further, during the heat treatment, hydrogen contained in the insulating films 101 and 102 which serve as base protective films may also be removed. By removing the hydrogen contained in the amorphous semiconductor film, emission of hydrogen from the amorphous semiconductor film when the amorphous semiconductor film is subsequently irradiated with a laser beam can be avoided, and the tolerance of the film irradiated with the laser beam can be improved. Concerning such heating conditions, heating can be conducted using an annealing furnace at a temperature of 500° C. to 550° C., inclusive, for one to ten hours, inclusive, preferably one to five hours, inclusive. Alternatively, heating can be conducted using a rapid thermal annealing method (an RTA method) at a temperature of 550° C. to 750° C., inclusive, preferably 600° C. to 650° C., inclusive, for from one second to ten minutes, preferably from three minutes to eight minutes.

Further, instead of the above-described heat treatments, a heat treatment which crystallizes the amorphous semiconductor film may be conducted. In that case, the heat treatment may be conducted after doping the amorphous semiconductor film with a metal element that promotes crystallization, or the like. Representatively, by doping the amorphous semiconductor film with a very small amount of a metal element such as nickel, palladium, germanium, iron, tin, lead, cobalt, platinum, copper, or gold, and subsequently conducting the heat treatment, a crystalline semiconductor film can be formed.

Here, in order to remove hydrogen contained in the amorphous semiconductor film and hydrogen contained in the insulating films 101 and 102 which serve as base protective films, heating is conducted at 650° C. for six minutes.

As the insulating films 101 and 102 which serve as base protective films, a film including a compound, such as a silicon oxide film, a silicon nitride film, a silicon oxynitride film, a silicon nitride oxide film, an aluminum nitride film, an aluminum oxynitride film, or an alumina film, or a film including an aforementioned compound which contains hydrogen, or the like can be used.

Note that here, a silicon oxynitride film refers to a film which contains 1.8 to 2.3 times as much oxygen as silicon, preferably 1.92 to 2.16 times as much oxygen as silicon. Further, the film may contain 0.001 to 0.05 times as much nitrogen as silicon, preferably 0.001 to 0.01 times as much nitrogen as silicon. Furthermore, the film may contain hydrogen at a proportion of 0.01 to 0.3 times as much hydrogen as silicon, preferably 0.04 to 0.24 times as much hydrogen as silicon. Moreover, the film may contain carbon at a proportion of 0.0 to 0.001 times as much carbon as silicon, preferably 0.0 to 0.003 times as much carbon as silicon. Such a film is sometimes referred to as SiON. Further, a silicon nitride oxide film refers to a film which contains 0.1 to 0.3 times as much oxygen as silicon, preferably 0.13 to 0.42 times as much oxygen as silicon, and 1 to 2 times as much nitrogen as silicon, preferably 1.1 to 1.6 times as much nitrogen as silicon. Further, the film may contain hydrogen at a proportion of 0.3 to 1.2 times as much hydrogen as silicon, preferably 0.51 to 0.91 times as much hydrogen as silicon. Such a film is sometimes referred to as SiNO.

As the amorphous semiconductor film 103, silicon, germanium, silicon germanium ($Si_{1-x}Ge_x$, where $0<x<0.1$), or the like can be used.

For the insulating films 101 and 102 which serve as base protective films and the amorphous semiconductor film 103, a plasma CVD method, a sputtering method, an evaporation method, or the like can be used as appropriate. Note that just after the insulating films 101 and 102 which serve as base protective films and the amorphous semiconductor film 103 are formed, that is, before they are heated, their stress may be either tensile stress or compressive stress.

After being heated, the layer including a semiconductor film which is formed over the substrate has a total stress of −500 N/m to +50 N/m, inclusive, preferably −150 N/m to 0 N/m, inclusive.

Here, as the layer which is formed over the substrate, the insulating films 101 and 102 and the amorphous semiconductor film 103 are formed. A silicon nitride oxide film with a thickness of zero to 100 nm, a silicon oxynitride film with a thickness of 30 to 120 nm, and an amorphous semiconductor film with a thickness of 30 to 200 nm are formed as these films.

Further, an insulating film which serves as a base protective film is not limited to a structure in which two insulating films are stacked. It may have a single-layer structure. That is, as the layer including a semiconductor film, a silicon oxynitride film with a thickness of 30 to 120 nm can be formed as a base protective film, and an amorphous semiconductor film with a thickness of 30 to 200 nm can be formed over the base protective film. Further, instead of the silicon oxynitride film, an aluminum nitride film, aluminum oxynitride film, or alumina film with a thickness of 30 to 120 nm can be used. In these cases too, the total stress of the insulating film and the amorphous semiconductor film after heating is −500 N/m to +50 N/m, inclusive, preferably −150 N/m to 0 N/m, inclusive. That is, the product of the film thickness and the film stress of the insulating film after heating equals the value obtained when the product of the film thickness of the amorphous semiconductor film and the film stress of the amorphous semiconductor film after heating is subtracted from the total stress after heating.

Further, as the insulating film which serves as a base protective film, three or more layers may be formed. That is, as the layer including a semiconductor film, an aluminum nitride film with a thickness of 30 to 120 nm, a silicon nitride oxide film with a thickness of 0 to 100 nm, and a silicon oxynitride film with a thickness of 30 to 120 nm can be formed as base protective films, and an amorphous semiconductor film with a thickness of 30 to 200 nm can be formed over the base protective films. Note that concerning the stacking order of the base protective films at this time, a combination in which the aluminum nitride film, the silicon nitride oxide film, and the silicon oxynitride film are stacked over the substrate in that order, a combination in which the silicon nitride oxide film, the aluminum nitride film, and the silicon oxynitride film are stacked over the substrate in that order, a combination in which the silicon nitride oxide film, the silicon oxynitride film, and the aluminum nitride film are stacked over the substrate in that order, or the like can be used as appropriate. Further, in the above three-layer structure, an aluminum oxynitride film or an alumina film can be used instead of an aluminum nitride film. In these cases too, the total stress of the insulating films and the amorphous semiconductor film after heating is −500 N/m to +50 N/m, inclusive, preferably −150 N/m to 0 N/m, inclusive.

Figure 1B:
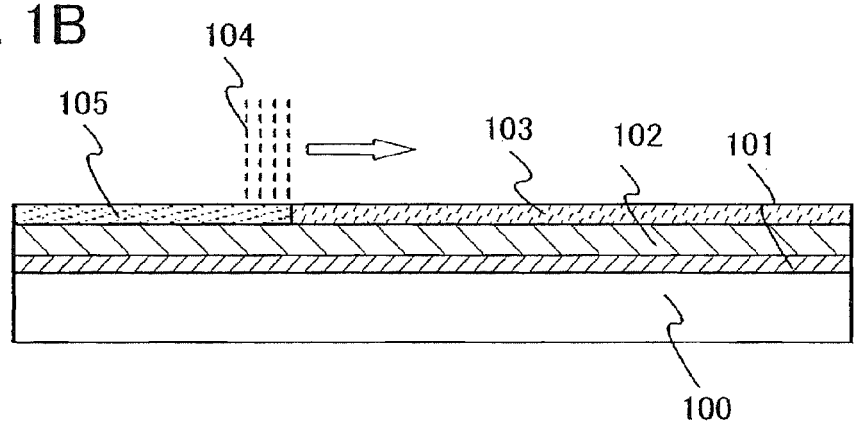

Next, as shown in FIG. 1B, the amorphous semiconductor film 103 is irradiated with a laser beam. FIG. 1B is a schematic diagram showing irradiation with a laser beam. The amorphous semiconductor film which has been irradiated with a laser beam 104 becomes a crystalline semiconductor film 105.

Figure 2A:
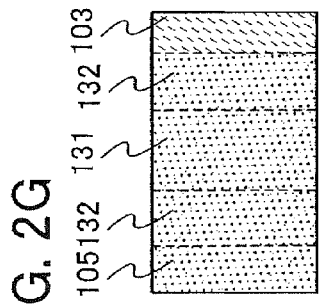
FIGS. 2A to 2I are top views of substrates showing when a semiconductor film has been irradiated with a laser beam, and graphs showing the temperature distributions of the substrates and the stress of the substrate surfaces.
Figure 2B:
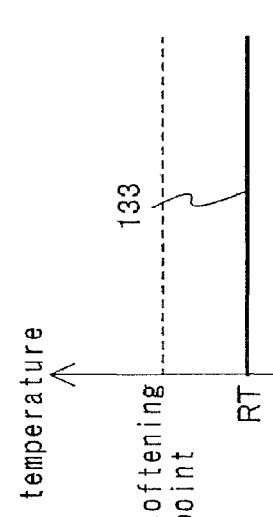
Figure 2D:
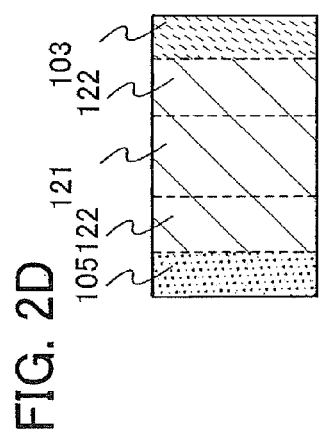
Figure 2E:
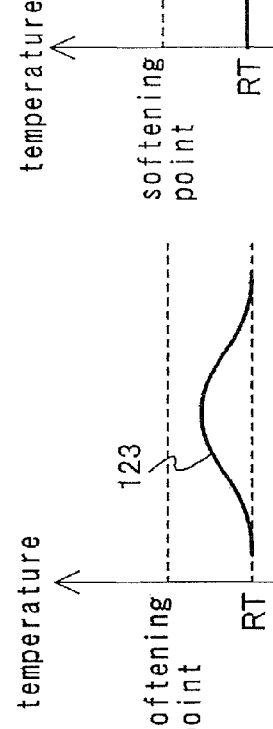
Figure 2G:
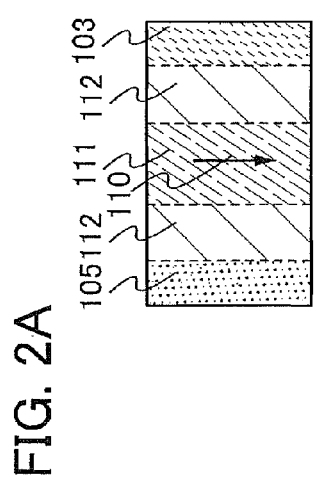
Figure 2H:
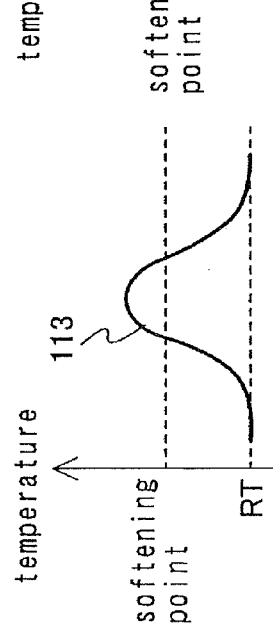
Figure 2C:
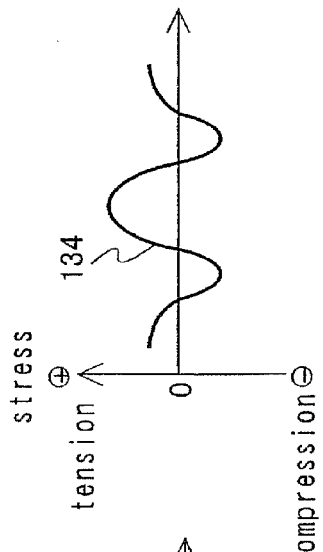

When the amorphous semiconductor film 103 is irradiated with the laser beam, the laser beam is absorbed by the amorphous semiconductor film 103, and as the amorphous semiconductor film 103 is heated, the heat is conducted to the substrate 100 and the substrate 100 is also heated. The temperature and stress of the substrate surface at this time are shown in FIGS. 2A to 2C. FIG. 2A shows a top view of the substrate 100 in the vicinity of a region which has been irradiated with the laser beam. Here, a mode in which a laser beam is scanned over the substrate in the direction 110 of the arrow is shown. Further, the crystalline semiconductor film 105 is a region where the laser beam has already been scanned and the amorphous semiconductor film has been crystallized. The amorphous semiconductor film 103 is a region of the amorphous semiconductor film where the laser beam will be scanned next. Regions 111 and 112 are regions which are being irradiated with the laser beam.

When the laser beam is irradiated onto the amorphous semiconductor film, the laser beam that has been irradiated onto the amorphous semiconductor film is absorbed by the amorphous semiconductor film. As the amorphous semiconductor film is heated, the heat is transmitted to the substrate 100 and the substrate 100 is also heated. The surface of the substrate 100 is locally heated, and part of the surface of the substrate softens. Further, the softened region 111 of the substrate has the heated regions 112 of the substrate on either side.

Further, as shown by the temperature trajectory 113 of the substrate surface when the laser beam has been irradiated thereon in FIG. 2B, the temperature exceeds the softening point in the region 111 where the substrate has softened, and in the heated regions 112 of the substrate on either side of the softened region 111, the temperature is higher than room temperature (RT) and lower than the softening point. Further, the temperature of the crystalline semiconductor film 105 which has already been crystallized and of the amorphous semiconductor film 103 which has not yet been irradiated with the laser beam is room temperature.

Further, the stress of the substrate surface at this time is shown by the stress trajectory 114 in FIG. 2C. In the region 111 where the substrate has softened, viscosity is low and stress is not generated, so the stress is zero. Meanwhile, the heated regions 112 on either side of the softened region 111 are in a heated state in which the temperature is higher than room temperature and lower than the softening point, so their volume expands. Therefore, compressive stress is generated in the substrate surface. Further, on the periphery of the area of the substrate surface where compressive stress has been generated, that is, in the crystalline semiconductor film 105 which has been crystallized and in the amorphous semiconductor film 103 which has not yet been irradiated with the laser beam, tensile stress is generated.

Figure 2F:
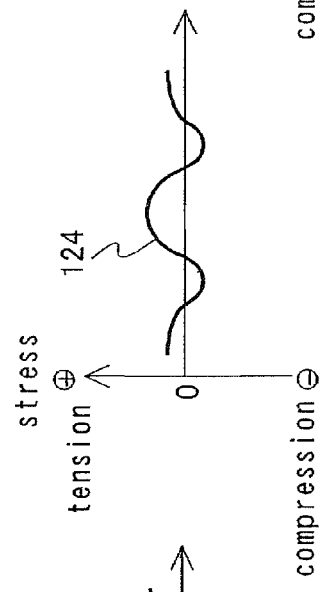

When the laser beam is scanned, the irradiation region of the laser beam moves, and in the substrate directly below the irradiation region of the laser beam, the softened region and the heated regions on either side of the softened region start to cool down. FIG. 2D shows a top view of the substrate at this time in the vicinity of the region where irradiation has been conducted with the laser beam. Further, FIGS. 2E and 2F show the temperature and stress of the substrate surface. The softened region of the substrate solidifies. In FIG. 2D, the solidified region is indicated by reference numeral 121. Further, heated regions 122 are formed on either side of the solidified region 121. The temperature of the substrate surface which has been scanned with the laser beam is shown by the temperature trajectory 123 in FIG. 2E. As shown by the temperature trajectory 123, the temperature of the substrate surface in the solidified region 121 and in the heated regions 122 on either side of the solidified region 121 is higher than room temperature (RT) and lower than the softening point. The stress of the substrate surface at this time is shown by the stress trajectory 124 in FIG. 2F. The region 121, which softened when the temperature of the substrate rose to greater than or equal to the softening point due to the laser beam irradiation, solidifies due to cooling, and contracts. Therefore, tensile stress is generated. Force which acts to prevent the part which has started to contract from contracting is applied to the part which has started to contract by adjacent parts. Therefore, compressive stress is generated.

Figure 2I:
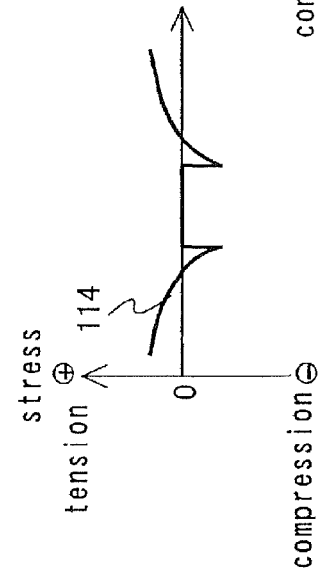

The substrate surface falls to room temperature due to further cooling. FIG. 2G shows a top view of the substrate at this time in the vicinity of the region where irradiation has been conducted with the laser beam. Due to cooling, the solidified region and the heated regions cool to room temperature and become crystalline semiconductor films 131 and 132. The temperature and stress of the substrate surface at this time are shown in FIGS. 2G to 2I. As shown by the temperature trajectory 133 of the substrate surface where the laser beam has been scanned in FIG. 2H, the temperature of the substrate surface at the solidified crystalline semiconductor film 131 and the heated regions 132 on either side of the solidified crystalline semiconductor film 131 is room temperature (RT). The stress of the substrate surface at this time is shown by the stress trajectory 134 in FIG. 2I. As the temperature of the substrate decreases to room temperature, the softened region contracts further. However, because it is prevented from contracting by adjacent parts, the tensile stress further increases.

The laser beam irradiation is not conducted over the entire substrate surface simultaneously. Rather, the substrate is irradiated portion by portion when the whole substrate is scanned with the laser beam, and thus the whole substrate is irradiated. Therefore, in the substrate surface, there is a region which is heated by irradiation with the laser beam and a region which is not heated by irradiation with the laser beam. Further, when the laser beam moves from the region which has been irradiated with the laser beam, the region which has been irradiated with the laser beam gradually cools to room temperature. Therefore, tensile stress and compressive stress occur sectionally in a part of the surface of the substrate. This is referred to as a heat distortion. The larger the thermal expansion coefficient of the substrate and the lower the softening point of the substrate, the larger the heat distortion which is generated along with the heating, softening and cooling becomes, and the more likely it is that a crack will form. Specifically, in the region irradiated by the laser beam, a large amount of tensile stress is generated in a direction which is perpendicular to the scanning direction of the laser beam or the direction of movement of the substrate.

If the heat distortion, that is, the tensile stress, in the region of the substrate surface which has been irradiated with the laser beam becomes larger than the rupture stress of the substrate, a crack will form in the substrate. Once a crack has formed, stress concentrates in the crack area, so the crack progresses. The direction in which the crack progresses is perpendicular to the distribution of tensile stress. That is, it is parallel with the scanning direction of the laser beam.

However, if a layer which has compressive stress after being heated is formed on the surface of the substrate, the tensile stress in the substrate surface can be reduced. For this reason, when a layer including a semiconductor film is formed over a substrate which has a thermal expansion coefficient of greater than $6 \times 10^{-7}/° C.$ and less than or equal to $38 \times 10^{-7}/° C.$, preferably greater than $6 \times 10^{-7}/° C.$ and less than or equal to $31.8 \times 10^{-7}/° C.$, and after heating the layer including a semiconductor film, the amorphous semiconductor film is irradiated with a laser beam and thereby a crystalline semiconductor film is formed, the number of cracks that form in the substrate and the layer including a semiconductor film can be reduced.

A laser oscillator and an optical system which forms a beam spot, which are used for crystallization, will be described below. As shown in FIG. 3, as laser oscillators 11a and 11b, laser oscillators which emit a wavelength which is absorbed by the amorphous semiconductor film 103 at a rate of several tens of percent or more are used. Representatively, from a fundamental wave to a fourth harmonic can be used. Here, a continuous wave laser ($YVO_4$, a second harmonic (a wavelength of 532 nm)) with LD excitation (laser diode excitation) which has a maximum total output of 20 W is prepared. It is not particularly necessary to limit the wavelength of the laser to a second harmonic. However, a second harmonic is superior to a further higher order harmonic in terms of energy efficiency.

When the amorphous semiconductor film 103 is irradiated with the continuous wave laser, energy is continuously provided to the amorphous semiconductor film 103. Therefore, once the semiconductor film has been brought to a molten state, the molten state can be maintained. Further, a solid-liquid interface of the semiconductor film can be moved by scanning the continuous wave laser, so crystal grains which are long in one direction, which is the direction in which the laser moves, can be formed. A solid-state laser is used because compared with a gas laser or the like, the output of a solid-state laser is highly stable, so stable processing can be expected. Note that the laser is not limited to a continuous wave laser. A pulsed laser with a repetition rate of greater than or equal to 10 MHz can also be used. When a pulsed laser with a high repetition rate is used, as long as a pulse interval of the laser is shorter than the period of time it takes for the semiconductor film to solidify after being melted, the semiconductor film can be kept in a molten state. Thus, a semiconductor film composed of crystal grains which are long in one direction can be formed by the movement of the solid-liquid interface. Note that FIG. 3 shows a case where two laser oscillators are prepared; however, one laser oscillator may be prepared as long as output is sufficient.

For example, as a gas laser, an Ar laser, a Kr laser, a $CO_2$ laser, or the like may be used. As a solid-state laser, a YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like may be used. Further, a ceramic laser such as a YAG laser, a $Y_2O_3$ laser, a $GdVO_4$ laser, or a $YVO_4$ laser may be used. As a metal vapor laser, a helium cadmium laser or the like may be used.

Further, concerning the laser oscillators 11a and 11b, it is preferable to emit a laser beam with oscillation of $TEM_{00}$ (a single transverse mode), because by doing so, a light-concentrating property of a linear beam spot that is obtained on the surface to be irradiated 18 can be improved, and energy density of the linear beam spot that is obtained on the surface to be irradiated 18 can be increased.

A brief description of the laser irradiation follows. Laser beams 12a and 12b are each emitted with the same energy from the laser oscillators 11a and 11b. A polarization direction of the laser beam 12b emitted from the laser oscillator 11b is changed through a wavelength plate 13. The polarization direction of the laser beam 12b is changed because the two laser beams which have different polarization directions to one another are synthesized by a polarizer 14. After the laser beam 12b is passed through the wavelength plate 13, the laser beam 12b is reflected by a mirror 22 and made to enter the polarizer 14. Then, the laser beam 12a and the laser beam 12b are synthesized into a laser beam 12 by the polarizer 14. The wavelength plate 13 and the polarizer 14 are adjusted so that light that has transmitted through the wavelength plate 13 and the polarizer 14 has an appropriate energy. Note that in this embodiment mode, the polarizer 14 is used for synthesizing the laser beams; however, other optical elements such as a polarization beam splitter may also be used.

The laser beam 12 that has been synthesized by the polarizer 14 is reflected by a mirror 15, and a cross section of the laser beam is formed into a linear shape on the surface to be irradiated 18 by a cylindrical lens 16 with a focal length of, for example, 150 mm, and a cylindrical lens 17 with a focal length of, for example, 20 mm. The mirror 15 may be provided depending on setup conditions of an optical system of a laser irradiation apparatus. The cylindrical lens 16 operates in the lengthwise direction of the beam spot that is funned on the surface to be irradiated 18, while the cylindrical lens 17 operates in the crosswise direction of the beam spot that is formed on the surface to be irradiated 18. Accordingly, in the surface to be irradiated 18, a linear beam spot having a length of approximately 500 μm and a width of approximately 20 μM, for example, is formed. Note that in this embodiment mode, the cylindrical lenses are used to form the linear beam spot into a linear shape. However, the invention is not limited to this, and other optical elements such as spherical lenses may also be used. Further, the focal lengths of the cylindrical lenses are not limited to the above values, and can be set freely.

Further, in this embodiment mode, the laser beam is formed using the cylindrical lenses 16 and 17; however, an optical system for extending the laser beam into a linear shape and an optical system for concentrating the light narrowly on the surface to be irradiated may be additionally provided. For example, in order to make the cross section of the laser beam linear, a cylindrical lens array, a diffractive optical element, an optical waveguide, or the like can be used. Further, if a medium of the laser which has a rectangular shape is used, the cross section of the laser beam can be made linear at emission stage. A ceramic laser can form a shape of a medium of a laser relatively freely, so a ceramic laser is suitable for manufacturing such a laser. Note that the cross-section of the laser beam which is made into a linear shape is preferably as narrow as possible. This increases energy density of the laser beam in the semiconductor film, and therefore, processing time can be reduced.

Next, an irradiation method of the laser beam will be described. In order to move the surface to be irradiated 18 over which the amorphous semiconductor film 103 is formed at a relatively high speed, the surface to be irradiated 18 is fixed to a wafer stage 19. The wafer stage 19 can be moved in X and Y directions on a plane parallel to the surface to be irradiated 18 by an x-axis one-axis robot 20 and a y-axis one-axis robot 21. The one-axis robots 20 and 21 are disposed such that the lengthwise direction of the linear beam spot corresponds to the y-axis. Next, the surface to be irradiated 18 is moved in line with the crosswise direction of the beam spot, that is, in line with the x-axis, and the surface to be irradiated 18 is irradiated with the laser beam. Here, a scanning speed of the x-axis one-axis robot 20 is 35 cm/sec, and each of the two laser oscillators emits a laser beam whose energy is 7.0 W. The laser output after the laser beams have been synthesized is 14 W.

When the semiconductor film is irradiated with the laser beam, a region which is completely melted is formed in the semiconductor film. Crystals grow during a solidifying process, so a crystalline semiconductor film can be formed. Note that energy distribution of the laser beams emitted from the laser oscillators in a $TEM_{00}$ mode generally corresponds to a Gaussian distribution. Note also that the intensity of the laser beams can be made uniform by the optical system used for the laser beam irradiation. For example, intensity of the laser beam can be made uniform by using a lens array such as a cylindrical lens array or a fly eye lens; a diffractive optical element; an optical waveguide; or the like. An appropriate scanning speed for the x-axis one-axis robot 20 is approximately several tens to several hundreds of cm/sec. The speed may be decided as appropriate by a worker in accordance with the output of the laser oscillators.

Note that in this embodiment mode, a mode is used in which the amorphous semiconductor film 103, which is the surface to be irradiated 18, is moved using the x-axis one-axis robot 20 and the y-axis one-axis robot 21. The invention is not limited to this, and the laser beam can be scanned using a method for moving an irradiation system in which the surface to be irradiated 18 is fixed while an irradiation position of the laser beam is moved; a method for moving a surface to be irradiated in which the irradiation position of the laser beam is fixed while the surface to be irradiated 18 is moved; or a method in which these two methods are combined.

Note that as described above, the energy distribution of the beam spot, which is formed by the above-described optical system, is in a Gaussian distribution in the major axis direction. Therefore, a small grain crystal is formed at places where the energy density is low, at both major axis ends of the beam. Thus, part of the laser beam may be cut by providing a slit or the like in front of the surface to be irradiated 18, so that the surface to be irradiated 18 is irradiated only with sufficient energy to form a large grain crystal. Further, in order to utilize the laser beam emitted from the laser oscillators 11a and 11b more efficiently, the energy of the beam spot may be uniformly distributed in the lengthwise direction by using a beam homogenizer such as a lens array or a diffractive optical element.

Further, the y-axis one-axis robot 21 is moved by a distance equal to the width of the crystalline semiconductor film that is formed, and the x-axis one-axis robot 20 is rescanned at a predetermined speed, which is 35 cm/sec here. By repeating a series of such operations, an entire surface of the semiconductor film can be efficiently crystallized.

Figure 1C:
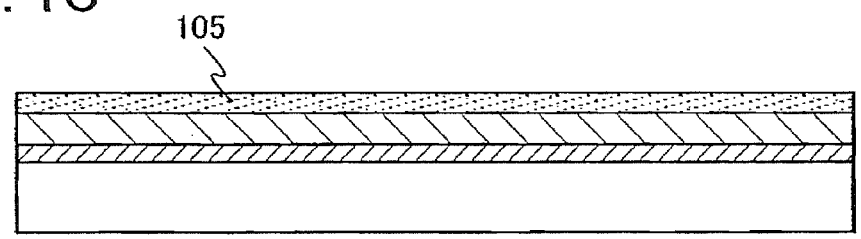

By the above-described process, the whole amorphous semiconductor film is irradiated with the laser beam, thereby forming the crystalline semiconductor film 105, as shown in FIG. 1C.

Figure 1D:
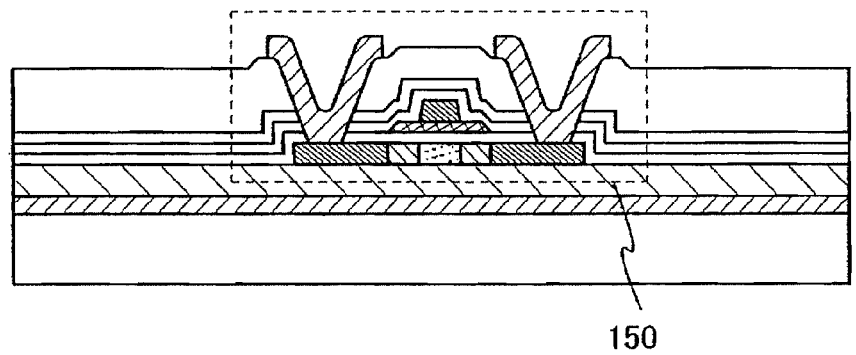

Subsequently, the crystalline semiconductor film is selectively etched to form a semiconductor film, and the semiconductor film is used to form a semiconductor element. As the semiconductor element, a thin film transistor, a nonvolatile memory element having a floating gate or a charge storage layer, a diode, a capacitor, a resistor, or the like can be formed. Here, a thin film transistor 150 is formed, as shown in FIG. 1D.

Further, the semiconductor element can be used to manufacture a semiconductor device.

Note that in this embodiment mode, a separation film may be provided between the insulating film 101 and the substrate 100, and after processing, the semiconductor element formed over the insulating film 101 may be separated from the substrate 100. Then, by attaching the semiconductor element to a substrate having flexibility, a thin and lightweight semiconductor device can be manufactured.

Below, a method for measuring stress which is used in this specification will be described. The stress referred to in this specification is measured using a Tencor FLX-2320 (manufactured by KLA Tencor Corporation). The Tencor FLX-2320 measures the change in the curvature radius of a substrate having a thin film which is under stress. Stress of the thin film is found using Mathematical Formula 2.

$$\sigma = \frac{Eh^2}{(1-v)6Rt} \quad \text{[Mathematical Formula 2]}$$

Figure 25A:
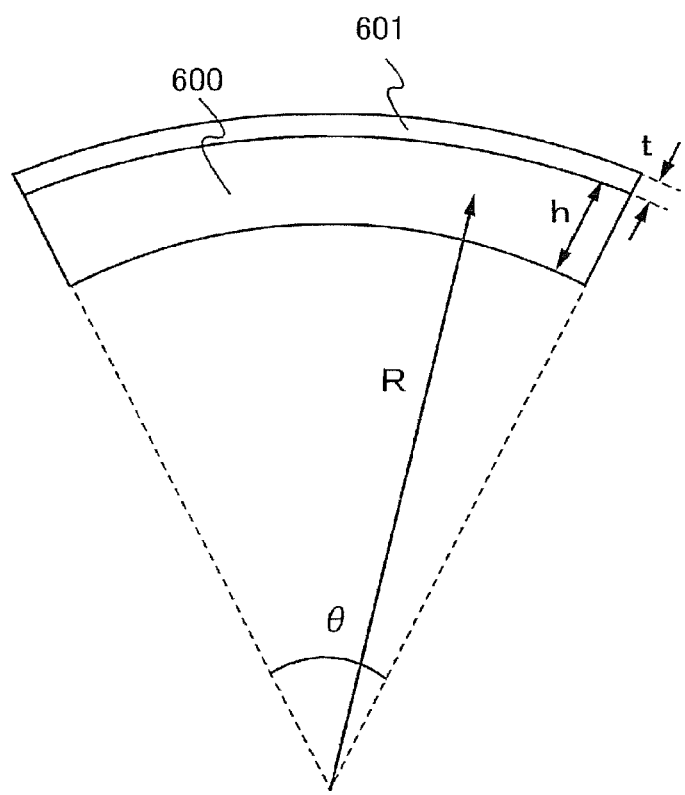
FIGS. 25A to 25C illustrate a method of calculating stress, and stress.
Figure 25B:
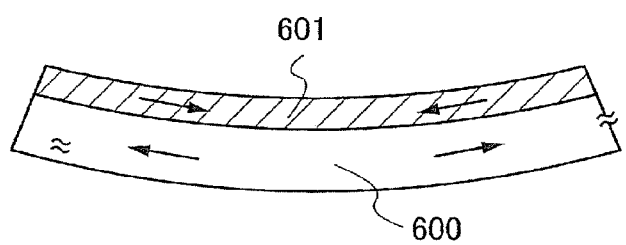
Figure 25C:
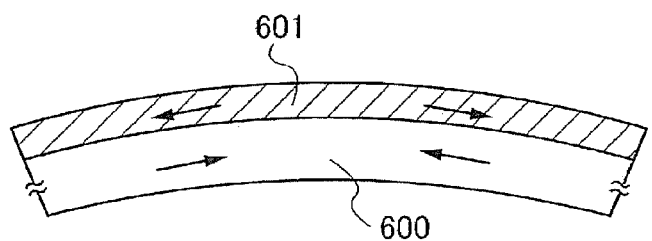

In Mathematical Formula 2, E/(1−v) represents a biaxial elasticity coefficient of the substrate, E represents a Young's modulus of the substrate, and v represents a Poisson's ratio of the substrate. Further, as shown in FIGS. 25A to 25C, h represents the thickness (m) of a substrate 600, t represents the thickness (m) of a thin film 601, R represents the curvature radius (m) of the substrate 600, and represents a stress (Pa) of the thin film 601 which is formed over the substrate 600.

Note that in this specification, for the AN100 substrate which is used as a substrate, the Poisson's ratio is 0.22 and the Young's modulus is 77 GPa. Therefore, its biaxial elasticity coefficient is 98.7 GPa. For the EAGLE2000 substrate which is used as a substrate, the Poisson's ratio is 0.23 and the Young's modulus is 70.9 GPa. Therefore, its biaxial elasticity coefficient is 92.07 GPa.

Further, generally, types of stress include tensile stress and compressive stress. As shown in FIG. 25B, when the thin film 601 contracts with respect to the substrate 600, the substrate 600 stretches in a direction which prevents the contraction. Therefore, the substrate 600 changes to a shape which has the thin film 601 on its inner side. Stress generated when the thin film 601 contracts in this manner is referred to as tensile stress. Meanwhile, as shown in FIG. 25C, when the thin film 601 expands, the substrate 600 contracts and pushes against the inner side of the thin film 601. Stress generated when the thin film 601 expands in this manner is referred to as compressive stress. Generally, it is often the case that tensile stress is indicated with a + (plus) sign and compressive stress is indicated with a − (minus) sign.

Embodiment Mode 2

In this embodiment mode, a liquid crystal display device which is an example of a semiconductor device will be described with reference to FIGS. 4A to 4D and FIGS. 5A to 5C.

As in Embodiment Mode 1, the insulating film 101 is formed over the substrate 100 which has a thermal expansion coefficient of greater than $6 \times 10^{-7}$/° C. and less than or equal to $38 \times 10^{-7}$/° C., preferably greater than $6 \times 10$/° C. and less than or equal to $31.8 \times 10^{-7}$/° C., and the amorphous semiconductor film 103 is formed over the insulating film 101, as shown in FIG. 4A. Here, an AN100 substrate with a thermal expansion coefficient of $38 \times 10^{-7}$/° C. and a thickness of 0.7 cm is used as the substrate 100. Further, as the insulating film 101, a silicon nitride film containing oxygen with a thickness of 40 to 60 nm and a silicon oxide film containing nitrogen with a thickness of 80 to 120 nm are each formed by a plasma CVD method. Further, as the amorphous semiconductor film 103, an amorphous semiconductor film with a thickness of 20 to 80 nm is formed by a plasma CVD method.

Next, the substrate 100 is heated. Here, heating for removing hydrogen which is in the amorphous semiconductor film formed over the substrate 100 is performed. Alternatively, heating for crystallizing the amorphous semiconductor film may be performed. When the substrate 100 is heated, the total stress of the layer over the substrate becomes −500 N/m to +50 N/m, inclusive, preferably −150 N/m to 0 N/m, inclusive. Even when a layer such as this is subsequently irradiated with the laser beam 104, the number of cracks that form in the substrate and the layer over the substrate can be reduced. Here, the substrate 100 is heated for one hour at 500° C., then heated for four hours at 550° C.

Next, as shown in FIG. 4B, the amorphous semiconductor film 103 is irradiated with the laser beam 104. An energy level selected for the laser beam 104 is an energy level at which the laser beam 104 can melt the amorphous semiconductor film 103. Further, a wavelength selected for the laser beam 104 is a wavelength which can be absorbed by the amorphous semiconductor film 103. As a result, the crystalline semiconductor film 105 can be formed over the insulating film 101. Here, a second harmonic of a $YVO_4$ laser (wavelength 532 nm) is used as the laser beam 104.

Next, as shown in FIG. 4C, the crystalline semiconductor film 105 is selectively etched to form semiconductor films 201, 202, and 203. Here, as a method for etching the crystalline semiconductor film 105, dry etching, wet etching, or the like can be used. Here, after a resist is applied over the crystalline semiconductor film 105, exposure and development are conducted to form a resist mask. Next, using the resist mask, the crystalline semiconductor film 105 is selectively etched by a dry etching method in which the flow ratio of $SF_6:O_2$ is 4:15. Subsequently, the resist mask is removed.

Then, as shown in FIG. 4D, a gate insulating film 204 is formed over the semiconductor films 201 to 203. The gate insulating film is formed of silicon nitride, silicon nitride containing oxygen, silicon oxide, silicon oxide containing nitrogen, or the like, as a single layer or a stacked layer structure. Here, silicon oxide containing nitrogen which is formed by a plasma CVD method to a thickness of 115 nm is used as the gate insulating film.

Next, gate electrodes 205, 206, 207, and 208 are formed. The gate electrodes 205 to 208 can be formed of a metal or of a polycrystalline semiconductor doped with an impurity which has one conductivity type. In the case of using a metal, tungsten (W), molybdenum (Mo), titanium (Ti), tantalum (Ta), aluminum (Al), or the like can be used. Further, a metal nitride obtained by nitriding the metal can be used. Alternatively, a structure in which a first layer including the metal nitride and a second layer including the metal are stacked may be used. Further, a droplet discharge method can be used to discharge a paste containing minute particles over the gate insulating film, and the paste can be dried or baked to form the gate electrode. Further, a paste containing minute particles can be printed over the gate insulating film by a printing method, and dried or baked to form the gate electrode. As representative examples of the minute particles, minute particles containing gold, copper, an alloy of gold and silver, an alloy of gold and copper, an alloy of silver and copper, or an alloy of gold, silver and copper as a main component may be used. Here, a tantalum nitride film with a thickness of 30 nm and a tungsten film with a thickness of 370 nm are formed over the gate insulating film 204 by a sputtering method. Then, a resist mask formed by a photolithography process is used in selectively etching the tantalum nitride film and the tungsten film to form gate electrodes 205 to 208 in which an end portion of the tantalum nitride film protrudes out more than an end portion of the tungsten film.

Next, using the gate electrodes 205 to 208 as masks, the semiconductor films 201 to 203 are each doped with an impurity element which imparts an n-type conductivity and an impurity element which imparts a p-type conductivity to form source regions and drain regions 209, 210, 211, 212, 213, and 214, and a high concentration impurity region 215. Further, low concentration impurity regions 216, 217, 218, 219, 220, 221, 222, and 223, which overlap with a part of the gate electrodes 205 to 208, are formed. Here, the source regions and drain regions 209, 210, and 213 to 215, and the low concentration impurity regions 216, 217, and 220 to 223 are doped with boron, which is an impurity element that imparts a p-type conductivity. Further, the source regions and drain regions 211 and 212 and the low concentration impurity regions 218 and 219 are doped with phosphorus, which is an impurity element that imparts an n-type conductivity.

Subsequently, heat treatment is performed to activate the impurity elements with which the semiconductor film has been doped. Here, heating is performed for four hours at 550° C. under a nitrogen atmosphere. Through the above process steps, thin film transistors 225, 226, and 227 are formed. Note that as the thin film transistors 225 and 227, p-channel thin film transistors are formed, while as the thin film transistor 226, an n-channel thin film transistor is formed. Further, a driver circuit is formed by the p-channel thin film transistor 225 and the n-channel thin film transistor 226. Further, the p-channel thin film transistor 227 serves as an element which applies a voltage to a pixel electrode.

Figure 5A:
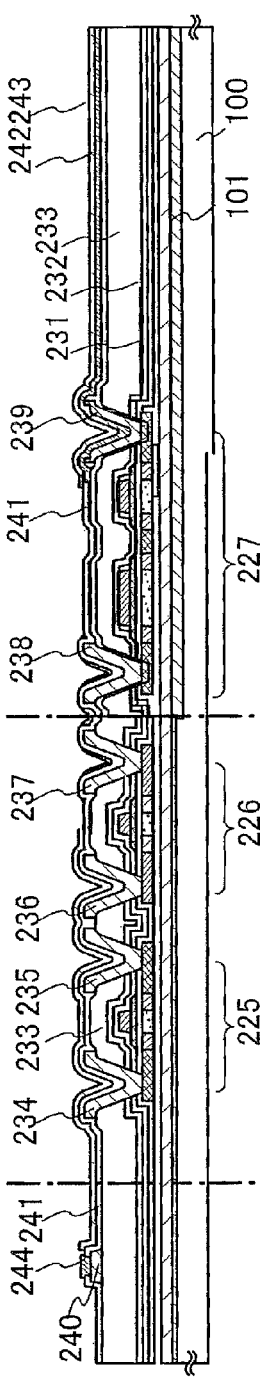
FIGS. 5A to 5C illustrate cross-sectional views of a method of manufacturing a semiconductor device of the invention.

Next, as shown in FIG. 5A, a first interlayer insulating film which insulates the gate electrodes and wirings of the thin film transistors 225 to 227 is formed. Here, a silicon oxide film 231, a silicon nitride film 232, and a silicon oxide film 233 are stacked to form the first interlayer insulating film. Further, wirings 234, 235, 236, 237, 238, and 239, which are connected to the source regions and drain regions of the thin film transistors 225 to 227, and a connecting terminal 240 are formed over the silicon oxide film 233, which is a part of the first interlayer insulating film. Here, after a 100 nm Ti film, a 333 nm Al film, and a 100 nm Ti film are formed in sequence by a sputtering method. Then, the films are selectively etched, using a resist mask formed by a photolithography process as a resist mask, to form the wirings 234 to 239 and the connection terminal 240. After that, the resist mask is removed.

Next, a second interlayer insulating film 241 is formed over the first interlayer insulating film, the wirings 234 to 239, and the connecting terminal 240. As the second interlayer insulating film 241, an inorganic insulating film such as a silicon oxide film, a silicon nitride film, or a silicon oxynitride film can be used. The second interlayer insulating film 241 may be a single layer or a plurality of layers including two or more layers of these insulating films. Further, as a method of forming the inorganic insulating film, a sputtering method, an LPCVD method, a plasma CVD method, or the like may be used. Here, a plasma CVD method is used to form a silicon nitride film containing oxygen with a thickness of 100 nm to 150 nm. Then, using a resist mask formed by a photolithography process as a resist mask, the silicon nitride film containing oxygen is selectively etched to form the second interlayer insulating film 241, as well as the wiring 239 of the thin film transistor 227 and a contact hole which reaches the connecting terminal 240. Subsequently, the resist mask is removed.

By forming the second interlayer insulating film 241, as in this embodiment mode, exposure of TFTs of a driver circuit portion, wirings, and the like can be prevented, and the TFTs can be protected from contaminants.

Next, a first pixel electrode 242, which connects to the wiring 239 of the thin film transistor 227, and a conductive film 244 which connects to the connection terminal 240 are formed. In a case where the liquid crystal display device is a light-transmitting liquid crystal display device, the first pixel electrode 242 is formed with a conductive film having a light-transmitting property. Further, in a case where the liquid crystal display device is a reflective liquid crystal display device, the first pixel electrode 242 is formed with a conductive film having a reflective property. Here, a sputtering method is used to form ITO containing silicon oxide to a thickness of 125 nm. Then, the ITO containing silicon oxide is selectively etched, using a resist mask formed by a photolithography process as a resist mask, to form the first pixel electrode 242 and the conductive film 244.

Next, an insulating film 243 which serves as an orientation film is formed. The insulating film 243 can be formed by forming a macromolecular compound film such as a polyimide film or a polyvinyl alcohol film by a printing method, a roll coating method, or the like, then performing rubbing. Further, the insulating film 243 can be formed by depositing SiO obliquely with respect to the substrate. Furthermore, the insulating film 243 can be formed by irradiating a photoreactive macromolecular compound with polarized UV light to polymerize the photoreactive macromolecular compound. Here, the insulating film 243 is formed by printing a macromolecular compound film such as a polyimide film or a polyvinyl alcohol film using a printing method, baking the macromolecular compound film, then rubbing the macromolecular compound film.

Figure 5B:
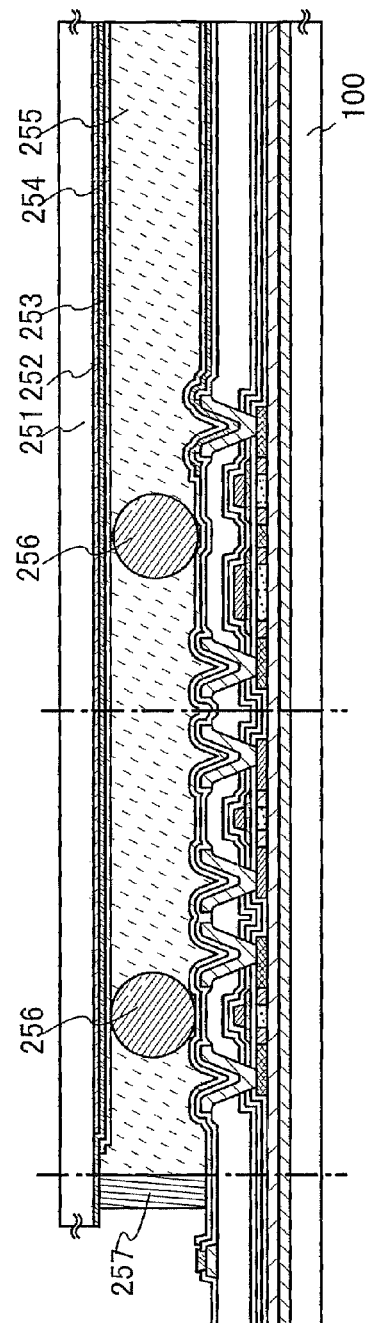

Next, as shown in FIG. 5B, a second pixel electrode 253 is formed over a counter substrate 251, and an insulating film 254 which serves as an orientation film is formed over the second pixel electrode 253. Note that a coloring film 252 may be provided between the counter substrate 251 and the second pixel electrode 253.

As the counter substrate 251, similar materials as for the substrate 100 can be selected as appropriate. Further, the second pixel electrode 253 can be formed using similar methods as for the first pixel electrode 242. Furthermore, the insulating film 254 which serves as an orientation film can be formed similarly to the insulating film 243. Concerning the coloring film 252, which is a film that is necessary when color display is conducted, in the case of a RGB method, coloring films, in which dyes or pigments which correspond to each color, red, green, and blue, are dispersed, are formed corresponding to each pixel.

Next, the substrate 100 and the counter substrate 251 are bonded together using a sealant 257. Further, a liquid crystal layer 255 is formed between the substrate 100 and the counter substrate 251. Furthermore, the liquid crystal layer 255 can be formed by using a vacuum injection method which utilizes capillarity to inject a liquid crystal material into a region which is enclosed by the insulating films 243 and 254 which serve as orientation films and the sealant 257. Alternatively, the liquid crystal layer 255 can be formed by forming a sealant 257 over one surface of the counter substrate 251, then adding a liquid crystal material dropwise to a region enclosed by the sealant, and then attaching the counter substrate 251 and the substrate 100 together by pressure using the sealant, under reduced pressure.

As the sealant 257, a thermosetting epoxy resin, a UV-curable acrylic resin, a thermoplastic nylon, a polyester, or the like can be formed using a dispensing method, a printing method, a thermocompression method, or the like. Note that by dispersing a filler in the sealant 257, the distance between the substrate 100 and the counter substrate 251 can be maintained. Here, a thermosetting epoxy resin is used to form the sealant 257.

Further, in order to maintain the space between the substrate 100 and the counter substrate 251, spacers 256 may be provided the insulating films 243 and 254 which serve as orientation films. A spacer can be formed by applying an organic resin and etching the organic resin into a desired shape; representatively, a columnar shape or a cylindrical shape. Further, spacer beads may be used as the spacers. Here, spacer beads are used as the spacers 256.

Further, one or both of the substrate 100 and the counter substrate 251 are provided with a polarizing plate, although this is not shown in the drawings.

Figure 5C:
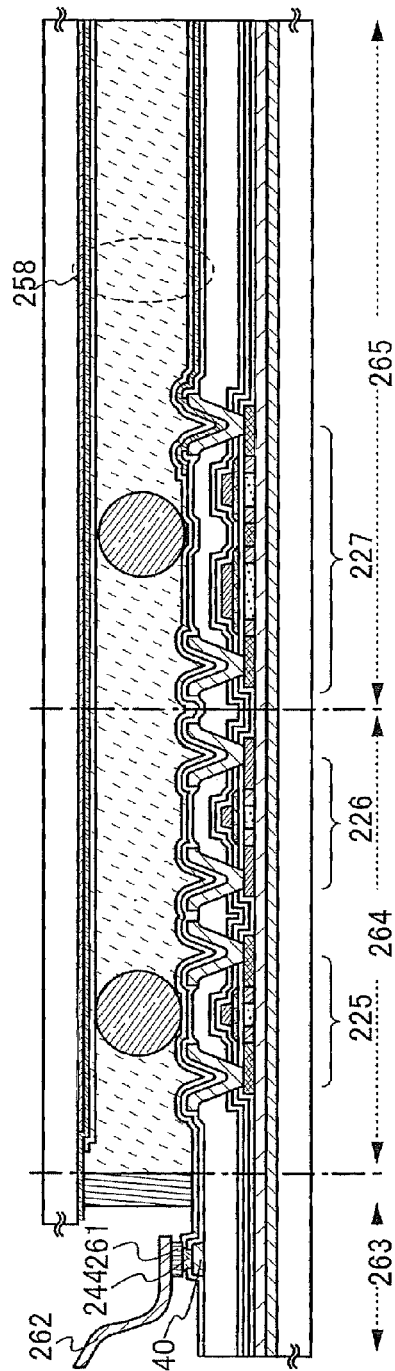

Next, as shown in FIG. 5C, in a terminal portion 263, a connection terminal which is connected to a gate wiring or a source wiring of a thin film transistor (in FIG. 5C, the connection terminal 240 which is connected to a source wiring or a drain wiring is shown) is formed. An FPC (flexible printed circuit) 262 which serves as an external input terminal is connected to the connection terminal 240 through the conductive film 244 and an anisotropic conductive film 261. The connection terminal 240 receives video signals and clock signals through the conductive film 244 and the anisotropic conductive film 261.

A circuit which drives a pixel, such as a source driver or a gate driver, is formed in a driver circuit portion 264. Here, an n-channel thin film transistor 226 and a p-channel thin film transistor 225 are disposed. Note that the n-channel thin film transistor 226 and the p-channel thin film transistor 225 form a CMOS circuit.

A plurality of pixels is formed in a pixel portion 265, and a liquid crystal element 258 is formed in each pixel. The liquid crystal element 258 is a portion in which the first pixel electrode 242, the second pixel electrode 253, and the liquid crystal layer 255, which fills the gap between the first pixel electrode 242 and the second pixel electrode 253, overlap with each other. The first pixel electrode 242 included in the liquid crystal element 258 is electrically connected to the thin film transistor 227.

The liquid crystal display device can be manufactured by the above-described process. In the liquid crystal display device described in this embodiment mode, the number of cracks that form in the substrate and the layer over the substrate during the manufacturing process can be reduced. Therefore, liquid crystal display devices can be manufactured with a high yield rate.

Embodiment Mode 3

In this embodiment mode, a manufacturing process of a light emitting device having a light emitting element which is an example of a semiconductor device will be described.

As shown in FIG. 6A, the thin film transistors 225 to 227 are formed over the substrate 100 with the insulating film 101 therebetween using similar processing steps to those in Embodiment Mode 2. Further, the silicon oxide film 231, the silicon nitride film 232, and a silicon oxide film 233 are stacked as a first interlayer insulating film which insulates the gate electrodes and wirings of the thin film transistors 225 to 227. Further, wirings 308, 309, 310, 311, 312, and 313 which are connected to a semiconductor film of the thin film transistors 225 to 227, and a connecting terminal 314 are formed over the silicon oxide film 233, which is a part of the first interlayer insulating film.

Next, a second interlayer insulating film 315 is formed over the first interlayer insulating film, the wirings 308 to 313, and the connecting terminal 314. Next, first electrode 316 which is connected to the wiring 313 of the thin film transistor 227 and a conductive film 320 which connects to the connecting terminal 314 are formed. To form the first electrode 316 and the conductive film 320, a sputtering method is used to form ITO containing silicon oxide to a thickness of 125 nm, and then the ITO containing silicon oxide is selectively etched, using a resist mask formed by a photolithography process as a resist mask.

By forming the second interlayer insulating film 315, as in this embodiment mode, exposure of TFTs of a driver circuit portion, wirings, and the like can be prevented, and the TFTs can be protected from contaminants.

Next, an organic insulating film 317 which covers an end portion of the first electrode 316 is formed. Here, a photosensitive polyimide is applied and baked. Then, exposure and development is conducted to form the organic insulating film 317 such that a driver circuit, the first electrode 316 in a pixel region, and the second interlayer insulating film 315 on the periphery of the pixel region are exposed.

Next, a layer 318 containing a light-emitting substance is formed by an evaporation method over a part of the first electrode 316 and the organic insulating film 317. The layer 318 containing a light-emitting substance is formed of an organic or inorganic compound having a light-emitting property. Further, the layer 318 containing a light-emitting substance may be formed of an organic compound having a light-emitting property and an inorganic compound having a light-emitting property. Moreover, a red-light-emitting pixel, a blue-light-emitting pixel, and a green-light-emitting pixel can be formed by using a red-light-emitting substance, a blue-light-emitting substance, and a green-light-emitting substance, respectively, for the layer 318 containing a light-emitting substance.

Here, the layer containing a red-light-emitting substance is formed by stacking DNTPD which is 50 nm thick, NPB which is 10 nm thick, NPB which is 30 nm thick to which bis[2,3-bis(4-fluorophenyl)quinoxalinato]iridium(acetylacetonate) (abbr.: Ir(Fdpq)$_2$(acac)) is added, Alq$_3$ which is 60 nm thick, and LiF which is 1 nm thick.

Further, the layer containing a green-light-emitting substance is formed by stacking DNTPD which is 50 nm thick, NPB which is 10 nm thick, Alq$_3$ which is 40 nm thick to which coumarin 545T (C545T) is added, Alq$_3$ which is 60 nm thick, and LiF which is 1 nm thick.

The layer containing a blue-light-emitting substance is formed by stacking DNTPD which is 50 nm thick, NPB which is 10 nm thick, 9-[4-(N-carbazolyl)]phenyl-10-phenylanthracene (abbr.: CzPA) which is 30 nm thick to which 2,5,8,11-tetra(tert-butyl)perylene (abbr.: TBP) is added, Alq$_3$ which is 60 nm thick, and LiF which is 1 nm thick.

Moreover, in addition to the red-light-emitting pixel, the blue-light-emitting pixel, and the green-light-emitting pixel, a white-light-emitting pixel may be formed, by forming the layer containing a light-emitting substance using a white light-emitting substance. By providing a white-light-emitting pixel, power consumption can be reduced.

Next, a second electrode 319 is formed over the layer 318 containing a light-emitting substance and the organic insulating film 317. Here, an Al film is formed to a thickness of 200 nm by an evaporation method. Accordingly, a light-emitting element 321 is formed by the first electrode 316, the layer 318 containing a light-emitting substance, and the second electrode 319.

A structure of the light-emitting element 321 will be described below.

When the layer 318 containing a light-emitting substance is formed by a layer which uses an organic compound and which has a light-emitting function (hereinafter, this layer will be referred to as a light-emitting layer 343), the light-emitting element 321 functions as an organic EL element.

As an organic compound with a light-emitting property, for example, 9,10-di(2-naphthyl)anthracene (abbr.: DNA); 2-tert-butyl-9,10-di(2-naphthyl)anthracene (abbr.: t-BuDNA); 4,4'-bis(2,2-diphenylvinyl)biphenyl (abbr.: DPVBi); coumarin 30; coumarin 6; coumarin 545; coumarin 545T; perylene; rubrene; periflanthene; 2,5,8,11-tetra(tert-butyl)perylene (abbr.: TBP); 9,10-diphenylanthracene (abbr.: DPA); 5,12-diphenyltetracene; 4-(dicyanomethylene)-2-methyl-6-[p-(dimethylamino)styryl]-4H-pyran (abbr.: DCM1); 4-(dicyanomethylene)-2-methyl-6-[2-(julolidine-9-yl)ethenyl]-4H-pyran (abbr.: DCM2); 4-(dicyanomethylene)-2,6-bis[p-(dimethylamino)styryl]-4H-pyran (abbr.: BisDCM); or the like may be used. Further, the following compounds capable of emitting phosphorescent light can also be used: bis[2-(4',6'-difluorophenyl)pyridinato-N,C$^{2'}$](picolinato)iridium (abbr.: FIrpic); bis{2-[3',5'-bis(trifluoromethyl)phenyl]pyridinato-N,C$^{2'}$}(picolinato)iridium (abbr.: Ir(CF$_3$ppy)$_2$(pic)); tris(2-phenylpyridinato-N,C$^{2'}$)iridium (abbr.: Ir(ppy)$_3$); (acetylacetonato)bis(2-phenylpyridinato-N,C$^{2'}$)iridium (abbr.: Ir(ppy)$_2$(acac)); (acetylacetonato)bis[2-(2'-thienyl)pyridinato-N,C$^{3'}$]iridium (abbr.: Ir(thp)$_2$(acac)); (acetylacetonato)bis(2-phenylquinolinato-N,C$^{2'}$)iridium (abbr.: Ir(pq)$_2$(acac)); (acetylacetonato)bis[2-(2'-benzothienyl)pyridinato-N,C$^{3'}$]iridium (abbr.: Ir(btp)$_2$(acac)); and the like.

Figure 7A:
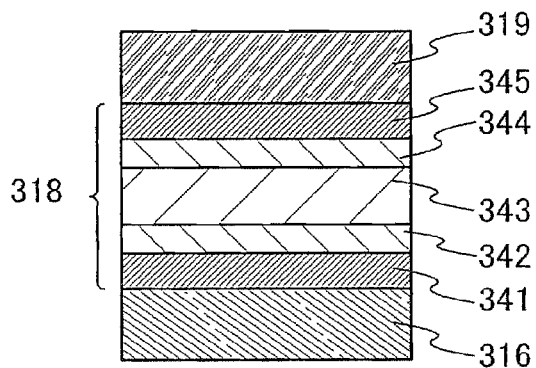
FIGS. 7A to 7E illustrate cross-sectional views of structures of a light emitting element that can be applied to the invention.

Further, as shown in FIG. 7A, the light-emitting element 321 may include the first electrode 316 and also the layer 318 containing a light-emitting substance and the second electrode 319, which are formed over the first electrode 316. The layer 318 containing a light-emitting substance includes a hole-injecting layer 341 formed of a material with a hole-injecting property, a hole-transporting layer 342 formed of a material with a hole-transporting property, the light-emitting layer 343 formed of an organic compound with a light-emitting property, an electron-transporting layer 344 formed of a material with an electron-transporting property, and an electron-injecting layer 345 formed of a material with an electron-injecting property.

As the material with a hole-transporting property, phthalocyanine (abbr.: H$_2$Pc); copper phthalocyanine (abbr.: CuPc); vanadyl phthalocyanine (abbr.: VOPc); 4,4',4"-tris(N,N-diphenylamino)triphenylamine (abbr.: TDATA); 4,4',4"-tris[N-(3-methylphenyl)-N-phenylamino]triphenylamine (abbr.: MTDATA); 1,3,5-tris[N,N-di(m-tolyl)amino]benzene (abbr.: m-MTDAB); N,N'-diphenyl-N,N'-bis(3-methylphenyl)-1,1'-biphenyl-4,4'-diamine (abbr.: TPD); 4,4'-bis[N-(1-naphthyl)-N-phenylamino]biphenyl (abbr.: NPB); 4,4'-bis{N-[4-di(m-tolyl)amino]phenyl-N-phenylamino}biphenyl (abbr.: DNTPD); 4,4'-bis[N-(4-biphenylyl)-N-phenylamino]biphenyl (abbr.: BBPB); 4,4',4"-tri(N-carbazolyl)triphenylamine (abbr.: TCTA); and the like may be used. Note that the invention is not limited to these. Among the above compounds, an aromatic amine compound typified by TDATA, MTDATA, m-MTDAB, TPD, NPB, DNTPD, BBPB, TCTA, or the like is preferable as the organic compound because it easily generates holes. The substances mentioned here generally have a hole mobility of $10^{-6}$ cm$^2$/Vs or more.

As a material with a hole-injecting property, the aforementioned materials with a hole-transporting property can be used. Further, a chemically-doped conductive macromolecular compound can also be used. For example, polyethylene dioxythiophene (abbr.: PEDOT) doped with polystyrene sulfonate (abbr.: PSS); polyaniline (abbr.: PAni); or the like can also be used. Further, a thin film of an inorganic semiconductor such as molybdenum oxide, vanadium oxide, or nickel oxide, or an ultrathin film of an inorganic insulator such as aluminum oxide is also effective.

Here, a material with an electron-transporting property may be a material including a metal complex with a quinoline skeleton or a benzoquinoline skeleton, or the like such as the following: tris(8-quinolinolato)aluminum (abbr.: Alq$_3$), tris(4-methyl-8-quinolinolato)aluminum (abbr.: Almq$_3$), bis(10-hydroxybenzo[h]-quinolinato)beryllium (abbr.: BeBq$_2$), bis(2-methyl-8-quinolinolato)-4-phenylphenolato-aluminum (abbr.: BAlq), or the like. Further, a metal complex having an oxazole ligand or a thiazole ligand, or the like can also be used, such as bis[2-(2-hydroxyphenyl)benzoxazolato]zinc (abbr.: Zn(BOX)$_2$), or bis[2-(2-hydroxyphenyl)benzothiazolato]zinc (abbr.: Zn(BTZ)$_2$). As an alternative to metal complex, 2-(4-biphenylyl)-5-(4-tert-butylphenyl)-1,3,4-oxadiazole (abbr.: PBD), 1,3-bis[5-(p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used. The substances mentioned here generally have an electron mobility of $10^{-6}$ cm$^2$/Vs or more.

As a material with an electron-injecting property, the aforementioned materials with an electron-transporting property may be used. Further, an ultrathin film of an insulator such as the following is often used: a halide of an alkali metal, such as lithium fluoride or cesium fluoride; a halide of an alkaline-earth metal, such as calcium fluoride; or an oxide of an alkali metal, such as lithium oxide. Further, an alkali metal complex such as lithium acetyl acetonate (abbr.: Li(acac)) or 8-quinolinolato-lithium (abbr.: Liq) is also effective. Furthermore, a material mixed by, for example, co-evaporating an aforementioned material with an electron-transporting property and a metal with a low work function such as Mg, Li, or Cs can also be used.

Figure 7B:
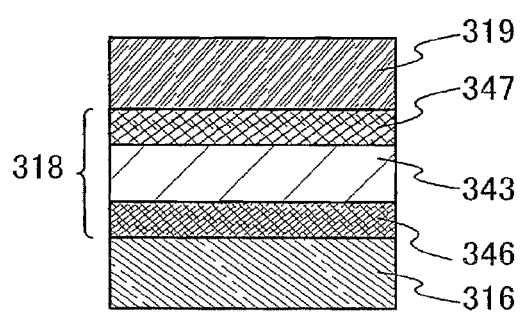

As shown in FIG. 7B, the light-emitting element 321 may be formed by the first electrode 316, the layer 318 containing a light-emitting substance, and the second electrode 319. The layer 318 containing a light-emitting substance includes a hole-transporting layer 346 formed of an organic compound with a light emitting property and an inorganic compound having an electron-accepting property with respect to the organic compound with a light emitting property, the light-emitting layer 343 formed of an organic compound with a light-emitting property, and an electron-transporting layer 347 formed of an organic compound with a light emitting property and an inorganic compound having an electron-donating property with respect to the organic compound with a light-emitting property.

As the organic compound for the hole-transporting layer 346 formed of the organic compound with a light-emitting property and the inorganic compound having an electron-accepting property with respect to the organic compound with a light-emitting property, an aforementioned organic compound with a hole-transporting property may be used as appropriate. Further, the inorganic compound may be any kind of inorganic compound as long as it can easily accept electrons from the organic compound. As the inorganic compound, various metal oxides or metal nitrides can be used. In particular, an oxide of a transition metal belonging to any of Group 4 to Group 12 in the periodic table is preferable because it is likely to exhibit electron-accepting properties. Specifically, titanium oxide, zirconium oxide, vanadium oxide, molybdenum oxide, tungsten oxide, rhenium oxide, ruthenium oxide, zinc oxide, or the like can be used. Among these metal oxides, oxides of transition metals belonging to any of Group 4 to Group 8 in the periodic table are preferable because many of them easily accept electrons. In particular, vanadium oxide, molybdenum oxide, tungsten oxide, and rhenium oxide are preferable because they can be formed by vacuum evaporation and are easy to handle.

As the organic compound for the electron-transporting layer 347 formed of the organic compound with a light-emitting property and the inorganic compound having an electron-donating property with respect to the organic compound with a light-emitting property, an aforementioned organic compound with an electron-transporting property may be used as appropriate. Further, the inorganic compound may be any kind of inorganic compound as long as it can easily donate electrons to the organic compound. As the inorganic compound, various metal oxides or metal nitrides can be used. In particular, an oxide of an alkali metal, an oxide of an alkaline-earth metal, an oxide of a rare-earth metal, a nitride of an alkali metal, a nitride of an alkaline-earth metal, and a nitride of a rare-earth metal are preferable because they are likely to exhibit an electron-donating property. Specifically, lithium oxide, strontium oxide, barium oxide, erbium oxide, lithium nitride, magnesium nitride, calcium nitride, yttrium nitride, lanthanum nitride, and the like are preferable. In particular, lithium oxide, barium oxide, lithium nitride, magnesium nitride, and calcium nitride are preferable because they can be formed by vacuum evaporation and are easy to handle.

The electron-transporting layer 347 and the hole-transporting layer 346 which are each formed of an organic compound with a light-emitting property and an inorganic compound are superior in electron injecting/transporting properties. Therefore, various materials can be used for the first electrode 316 and the second electrode 319 without limiting their work functions very much at all. Moreover, the drive voltage can be reduced.

Further, the light-emitting element 321 functions as an inorganic EL element by having a layer which uses an inorganic compound and which has a light-emitting function (this layer is hereinafter referred to as a light-emitting layer 349) as the layer 318 containing a light-emitting substance. Inorganic EL elements are classified as dispersion-type inorganic EL elements or thin-film inorganic EL elements, depending on their structure. They differ from one another in that the former include a light emitting layer in which particles of a light emitting material are dispersed in a binder and the latter include a light emitting layer formed of a thin film of a light-emitting material. However, they share the fact that they both require electrons accelerated by a high electric field. Further, mechanisms for obtaining light emission include donor-acceptor recombination light emission, which utilizes a donor level and an acceptor level, and localized light emission, which utilizes a core electron transition of a metal ion. In many cases, dispersion-type inorganic EL elements utilize donor-acceptor recombination light emission, while thin-film inorganic EL elements utilize localized light emission. A structure of an inorganic EL element is described below.

A light-emitting material that can be used in this embodiment mode includes a host material and an impurity element which serves as a light-emitting center. By varying the impurity element that is included, various colors of light emission can be obtained. Various methods can be used to manufacture the light-emitting material, such as a solid phase method or a liquid phase method (e.g., a coprecipitation method) can be used. Further, a liquid phase method, such as a spray pyrolysis method, a double decomposition method, a method which employs a pyrolytic reaction of a precursor, a reverse micelle method, a method in which one or more of the above methods is combined with high-temperature baking, a freeze-drying method, or the like can be used.

In the solid phase method, the host material and an impurity element or a compound containing an impurity element are weighed, mixed in a mortar, and reacted by being heated and baked in an electric furnace. Thereby, the impurity element is included in the host material. Baking temperature is preferably 700 to 1500° C. This is because if the temperature is too low, the solid phase reaction will not proceed, and if the temperature is too high, the host material will decompose. The materials may be baked in powdered form. However, it is preferable to bake the materials in pellet form. Baking at a relatively high temperature is necessary in the solid phase method. However, due to its simplicity, this method has high productivity and is suitable for mass production.

The liquid phase method (e.g., a coprecipitation method) is a method in which the host material or a compound containing the host material, and an impurity element or a compound containing an impurity element, are reacted in a solution, dried, and then baked. Particles of the light-emitting material are distributed uniformly, and the reaction can proceed even if the particles are small and the baking temperature is low.

As a host material for the light-emitting material of the inorganic EL element, a sulfide, an oxide, or a nitride can be used. As a sulfide, zinc sulfide, cadmium sulfide, calcium sulfide, yttrium sulfide, gallium sulfide, strontium sulfide, barium sulfide, or the like can be used, for example. Further, as an oxide, zinc oxide, yttrium oxide, or the like can be used, for example. Moreover, as a nitride, aluminum nitride, gallium nitride, indium nitride, or the like can be used, for example. Further, zinc selenide, zinc telluride, or the like can also be used. A ternary mixed crystal such as calcium gallium sulfide, strontium gallium sulfide, or barium gallium sulfide may also be used.

As a light-emitting center for localized light emission, manganese (Mn), copper (Cu), samarium (Sm), terbium (Tb), erbium (Er), thulium (Tm), europium (Eu), cerium (Ce), praseodymium (Pr), or the like can be used. Further, as charge compensation, a halogen element such as fluorine (F) or chlorine (Cl) may be added.

Meanwhile, as a light-emitting center for donor-acceptor recombination light emission, a light-emitting material that includes a first impurity element which forms a donor level and a second impurity element which forms an acceptor level can be used. As the first impurity element, fluorine (F), chlorine (Cl), aluminum (Al), or the like can be used, for example. As the second impurity element, copper (Cu), silver (Ag), or the like can be used, for example.

In the case of using a solid phase method to synthesize a light-emitting material for donor-acceptor recombination light emission, the host material, the first impurity element or a compound containing the first impurity element, and the second impurity element or a compound containing the second impurity element are weighed, mixed in a mortar, then heated and baked in an electric furnace. As the host material, any of the above-mentioned host materials can be used. As the first impurity element, fluorine (F), chlorine (Cl), or the like can be used, for example. As the compound containing the first impurity element, aluminum sulfide or the like can be used, for example. As the second impurity element, copper (Cu), silver (Ag), or the like can be used, for example. As the compound containing the second impurity element, copper sulfide, silver sulfide, or the like can be used, for example. Baking temperature is preferably 700 to 1500° C. This is because if the temperature is too low, the solid phase reaction will not proceed, and if the temperature is too high, the host material will decompose. Baking may be conducted with the materials in powdered form; however, it is preferable to conduct baking with the materials in pellet form.

Further, in the case of employing a solid phase reaction, a compound including the first impurity element and the second impurity element may be used. In such a case, since the impurity elements diffuse readily and the solid phase reaction proceeds readily, a uniform light-emitting material can be obtained. Further, since an unnecessary impurity element does not enter the light-emitting material, a light-emitting material with high purity can be obtained. As a compound including the first impurity element and the second impurity element, for example, copper chloride, silver chloride, or the like can be used.

Note that the concentration of the impurity elements in the host material may be 0.01 to 10 atomic percent, and is preferably in the range of 0.05 to 5 atomic percent.

Figure 7C:
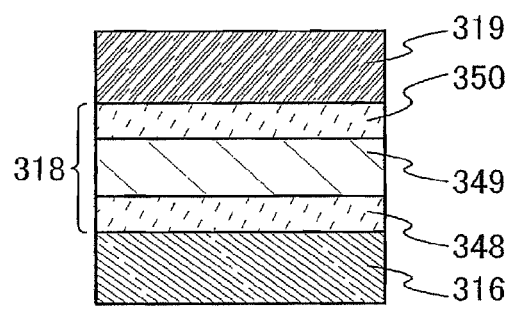

FIG. 7C shows a cross-section of an inorganic EL element in which the layer 318 containing a light-emitting substance is formed by a first insulating layer 348, a light emitting layer 349, and a second insulating layer 350.

In the case of thin film inorganic EL, the light emitting layer 349 includes an above-mentioned light-emitting material. As a method for forming the light emitting layer 349, resistive heating evaporation, a vacuum evaporation method such as an electron-beam evaporation (EB evaporation) method, a physical vapor deposition (PVD) method such as a sputtering method, a chemical vapor deposition (CVD) method such as a metalorganic CVD method or a low-pressure hydride transport CVD method, an atomic layer epitaxy (ALE) method, or the like can be used.

There is no particular limitation on the materials used for the first insulating layer 348 and the second insulating layer 350; however, preferably they have a high insulating property and form a dense film. In addition, preferably the material of the insulating layers has a high dielectric constant. For example, silicon oxide, yttrium oxide, aluminum oxide, hafnium oxide, tantalum oxide, barium titanate, strontium titanate, lead titanate, silicon nitride, zirconium oxide, or the like, or a mixed film or a stacked film containing two or more of these materials can be used. The first insulating layer 348 and the second insulating layer 350 can be formed by sputtering, an evaporation method, CVD, or the like. There is no particular limitation on the thickness of the first insulating layer 348 and the second insulating layer 350, but preferably it is in the range of 10 to 1000 nm. Note that a light emitting element of this embodiment mode does not necessarily require hot electrons, and therefore has the advantages that a thin film can be formed and drive voltage can be reduced. Film thickness is preferably less than or equal to 500 nm, more preferably less than or equal to 100 nm.

Although not shown, a buffer layer may be provided between the light-emitting layer 349 and the insulating layers 348 and 350 or between the light-emitting layer 349 and the electrodes 316 and 319. The buffer layer facilitates carrier injection and suppresses mixture of the layers. There is no particular limitation on the material of the buffer layer. However, for example, zinc sulfide, selenium sulfide, cadmium sulfide, strontium sulfide, barium sulfide, copper sulfide, lithium fluoride, calcium fluoride, barium fluoride, magnesium fluoride, or the like, which are host materials for the light-emitting layer, can be used.

Figure 7D:
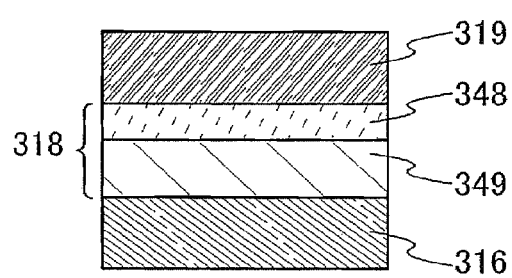

Moreover, as shown in FIG. 7D, the layer 318 containing a light-emitting substance may be formed by the light-emitting layer 349 and the first insulating layer 348. In this case, in FIG. 7D, the first insulating layer 348 is provided between the second electrode 319 and the light-emitting layer 349. Note that the first insulating layer 348 may be provided between the first electrode 316 and the light-emitting layer 349.

Further, the layer 318 containing a light-emitting substance may be formed by only the light-emitting layer 349. In other words, the light-emitting element 321 may be formed by the first electrode 316, the light-emitting layer 349, and the second electrode 319.

In the case of a dispersion-type inorganic EL element, a layer containing a light-emitting substance which is the form of a film is formed by dispersing particles of light-emitting material in a binder. When particles with a desired size cannot be satisfactorily obtained satisfactorily by a method of manufacturing the light-emitting material, the material may be processed into particles by being crushed in a mortar or the like. A binder refers to a material for fixing the dispersed particles of light-emitting material in place and maintaining the shape of the layer containing a light-emitting substance. The light-emitting material is dispersed evenly throughout the layer containing a light-emitting substance and fixed in place by the binder.

In the case of the dispersion-type inorganic EL element, the layer containing a light-emitting substance can be formed by a droplet discharge method that can selectively form the layer containing the light-emitting substance, a printing method (such as screen printing or offset printing), a coating method such as a spin coating method, a dipping method, a dispenser method, or the like. There is no particular limitation on the thickness of the layer. However, it is preferably in the range of 10 to 1000 nm. Further, the proportion of the light-emitting material in the layer containing a light-emitting substance, which includes the tight-emitting material and the binder, is preferably in the range of 50 to 80 wt %, inclusive.

Figure 7E:
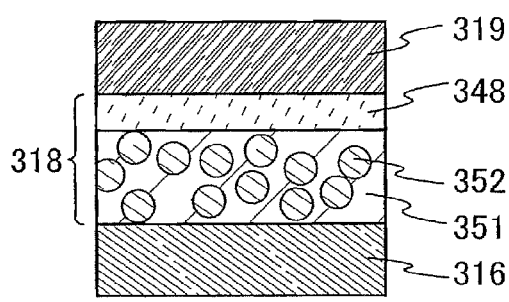

An element shown in FIG. 7E has the first electrode 316, the layer 318 containing a light-emitting substance, and the second electrode 319. The layer 318 containing a light-emitting substance is formed by the insulating layer 348 and a light-emitting layer in which a light-emitting material 352 is dispersed in a binder 351. FIG. 7E shows a structure in which the insulating layer 348 is in contact with the second electrode 319; however, a structure in which the insulating layer 348 is in contact with the first electrode 316 may also be used. Moreover, insulating layers may be formed in contact with each of the first electrode 316 and the second electrode 319 in the element. Further, the insulating layer does not have to be in contact with the first electrode 316 or the second electrode 319 in the element.

As a binder which can be used in this embodiment mode, an organic material or an inorganic material can be used. A mixed material containing an organic material and an inorganic material may also be used. As an organic insulating material, a polymer with a relatively high dielectric constant, such as a cyanoethyl cellulose resin, or a resin such as polyethylene, polypropylene, a polystyrene resin, a silicone resin, an epoxy resin, or vinylidene fluoride can be used. Further, a siloxane resin or a heat-resistant macromolecular material such as aromatic polyamide or polybenzimidazole may also be used. A siloxane resin is a resin which includes a Si—O—Si bond. Siloxane is a material which has a backbone formed of bonds between silicon (Si) and oxygen (O). As a substituent, an organic group containing at least hydrogen (for example, an alkyl group or an aryl group) can be used. Alternatively, a fluoro group may be used as a substituent. Further alternatively, both a fluoro group and an organic group containing at least hydrogen may be used as a substituent. Further, the following resin materials may also be used: a vinyl resin such as polyvinyl alcohol or polyvinylbutyral, a phenol resin, a novolac resin, an acrylic resin, a melamine resin, a urethane resin, an oxazole resin (e.g., polybenzoxazole), or the like. Further, a photocurable resin can be used. Fine particles with a high dielectric constant, such as particles of barium titanate or strontium titanate, can be mixed with these resins as appropriate to adjust the dielectric constant.

Further, the inorganic material used for the binder can be formed using silicon oxide, silicon nitride, silicon containing oxygen and nitrogen, aluminum nitride, aluminum containing oxygen and nitrogen, aluminum oxide, titanium oxide, barium titanate, strontium titanate, lead titanate, potassium niobate, lead niobate, tantalum oxide, barium tantalate, lithium tantalate, yttrium oxide, zirconium oxide, zinc sulfide, or other substances containing an inorganic material. By including an inorganic material with a high dielectric constant in the organic material (by doping or the like), the dielectric constant of the layer containing a light-emitting substance, which includes the light-emitting material and the binder, can be further controlled, and the dielectric constant can be further increased.

In the manufacturing process, the light-emitting material is dispersed in a solution containing a binder. As a solvent for the solution containing a binder that can be used in this embodiment mode, a solvent in which the binder material dissolves and which can form a solution with a viscosity that is suitable for the method of forming the light-emitting layer (the various wet processes) and for a desired film thickness may be selected appropriately. An organic solvent or the like can be used. For example, when a siloxane resin is used as the binder, propylene glycolmonomethyl ether, propylene glycolmonomethyl ether acetate (also called PGMEA), 3-methoxy-3-methyl-1-butanol (also called MMB), or the like can be used as the solvent.

In the inorganic EL light-emitting element, light emission is obtained when a voltage is applied between a pair of electrodes which sandwich the layer containing a light-emitting substance, and the element can be operated by either direct current drive or alternating current drive.

Next, as shown in FIG. 5B, a protective film 322 is formed over the second electrode 319. The protective film 322 is to prevent moisture, oxygen, and the like from penetrating the light-emitting element 321 and the protective film 322. The protective film 322 is preferably formed using silicon nitride, silicon oxide, silicon nitride oxide, silicon oxynitride, aluminum oxynitride, aluminum oxide, diamond-like carbon (DLC), carbon containing nitrogen, or another insulating material, by a thin-film formation method such as a plasma CVD method or a sputtering method.

Further, when a sealing substrate 324 is attached to the second interlayer insulating film 315, which is formed over the substrate 100, by using a sealant 323, the light-emitting element 321 is provided in a space 325 which is enclosed by the substrate 100, the sealing substrate 324, and the sealant 323. The space 325 is filled with filler, which may be an inert gas (such as nitrogen or argon) or the sealant 323.

An epoxy-based resin is preferably used for the sealant 323. Further, it is desirable that the material of the sealant 323 transmits as little moisture and oxygen as possible. As the sealing substrate 324, a glass substrate, a quartz substrate, or a plastic substrate formed of FRP (fiberglass reinforced plastic), PVF (polyvinyl fluoride), a polyester film, polyester, acrylic, or the like can be used.

Subsequently, as shown in FIG. 6C, an FPC 327 is attached to the conductive film 320 which is in contact with the connection terminal 314 using an anisotropic conductive film 326, similarly to in Embodiment Mode 3.

Through the above steps, a semiconductor device having an active matrix light-emitting element can be formed.

Figure 8:
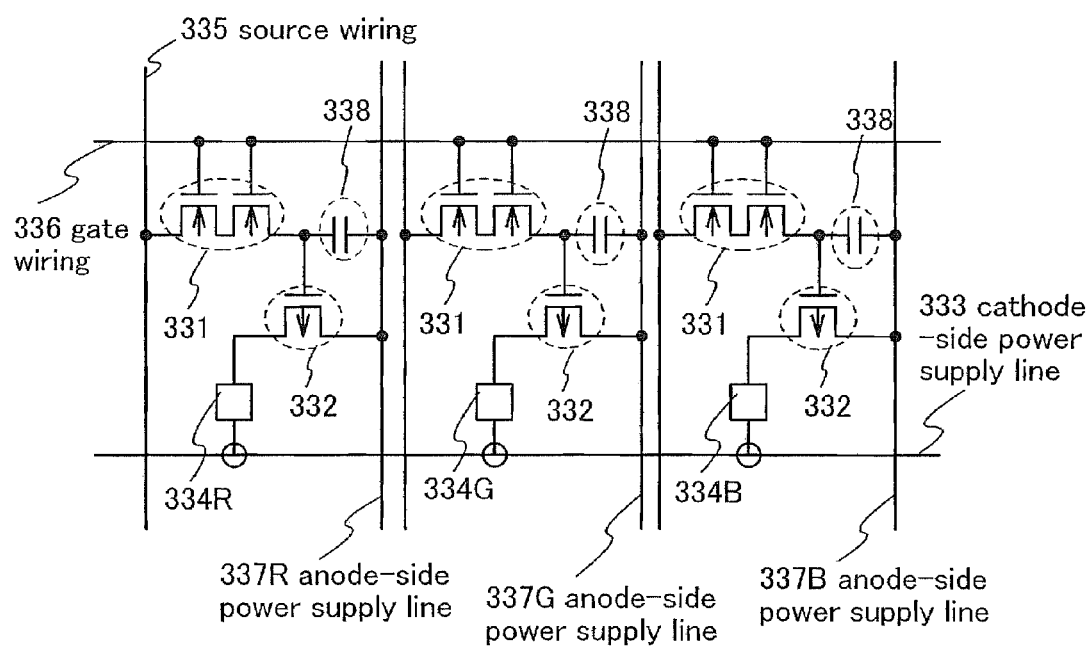
FIG. 8 illustrates an equivalent circuit of a light emitting element that can be applied to the invention.

Here, FIG. 8 shows an equivalent circuit diagram of a pixel in a case of full-color display in this embodiment mode. In FIG. 8, a thin film transistor 331 which is surrounded by a dashed line corresponds to a thin film transistor which switches the thin film transistor 227 for driving in FIG. 6A, while a thin film transistor 332 which is surrounded by a dashed line corresponds to the thin film transistor 227 which drives a light-emitting element. In the following description, an organic EL element (hereinafter referred to as an OLED) in which a layer containing a light-emitting substance is formed by a layer containing an organic compound with a light-emitting property is used as the light-emitting element.

In a pixel which displays red color, an OLED 334R which emits red light is connected to a drain region of the thin film transistor 332, and an anode-side power supply line 337R is provided in a source region of the thin film transistor 332. The OLED 334R is provided with a cathode-side power supply line 333. Further, the thin film transistor 331 for switching is connected to a gate wiring 336, and a gate electrode of the thin film transistor 332 for driving is connected to a drain region of the thin film transistor 331 for switching. The drain region of the thin film transistor 331 for switching is connected to a capacitor 338 which is connected to the anode-side power supply line 337R.

In a pixel displaying green color, an OLED 334G which emits green light is connected to a drain region of the thin film transistor 332 for driving, and an anode-side power supply line 337G is provided in a source region of the thin film transistor 332 for driving. The OLED 334G is provided with the cathode-side power supply line 333. The thin film transistor 331 for switching is connected to the gate wiring 336, and the gate electrode of the thin film transistor 332 for driving is connected to the drain region of the thin film transistor 331 for switching. The drain region of the thin film transistor 331 for switching is connected to the capacitor 338 which is connected to the anode-side power supply line 337G.

In a pixel displaying blue color, an OLED 334B which emits blue light is connected to a drain region of the thin film transistor 332 for driving, and an anode-side power supply line 337B is provided in a source region of the thin film transistor 332 for driving. The OLED 334B is provided with the cathode-side power supply line 333. The thin film transistor 331 for switching is connected to the gate wiring 336, and the gate electrode of the thin film transistor 332 for driving is connected to the drain region of the thin film transistor 331 for switching. The drain region of the thin film transistor 331 for switching is connected to the capacitor 338 which is connected to the anode-side power supply line 337B.

Different voltages are applied to each of the pixels having different colors to one another, depending on the material of the layer containing a light-emitting substance.

Here, although a source wiring 335 and the anode-side power supply lines 337R, 337G, and 337B are formed in parallel, the invention is not limited to this. The gate wiring 336 and the anode-side power supply lines 337R, 337G, and 337B may be formed in parallel. Further, the thin film transistor 332 for driving may have a multi-gate electrode structure.

In the light-emitting device, there is no particular limitation on the driving method of the screen display. For example, a dot-sequential driving method, a line-sequential driving method, a plane-sequential driving method, or the like may be used. Typically, a line sequential driving method is used, and may be combined as appropriate with a time-division grayscale driving method or an area grayscale driving method. Further, a video signal which is input to a source line of the light emitting device may be an analog signal or a digital signal. A driver circuit or the like may be designed as appropriate in accordance with the video signal.

Further, for a light-emitting device using a digital video signal, driving methods include one in which video signals input to a pixel are ones with a constant voltage (CV) and one in which video signals input to a pixel are ones with a constant current (CC). Further, concerning the driving method which employs video signals with a constant voltage (CV), there is a system in which voltage of a signal which is applied to a light emitting element is constant (CVCV), and a system in which current of a signal which is applied to a light emitting element is constant (CVCC). Further, concerning the driving method which employs video signals with a constant current (CC), there is a system in which voltage of a signal which is applied to a light emitting element is constant (CCCV), and a system in which current of a signal which is applied to a light emitting element is constant (CCCC).

A protection circuit for preventing electrostatic breakdown (such as a protection diode) may be provided in the light-emitting device.

Through the above steps, a light-emitting device having an active matrix light-emitting element can be manufactured. In the light-emitting device described in this embodiment mode, the number of cracks that form in the substrate and the layer over the substrate during the manufacturing process can be reduced. Therefore, light emitting devices can be manufactured with a high yield rate.

Embodiment Mode 4

In this embodiment mode, a manufacturing process of a semiconductor device which is capable of non-contact data transmission will be described with reference to FIGS. 9A to 12D. Further, a structure of the semiconductor device will be described with reference to FIG. 13. Further, applications of the semiconductor device described in this embodiment mode will be described with reference to FIGS. 14A to 14F.

Figure 9A:
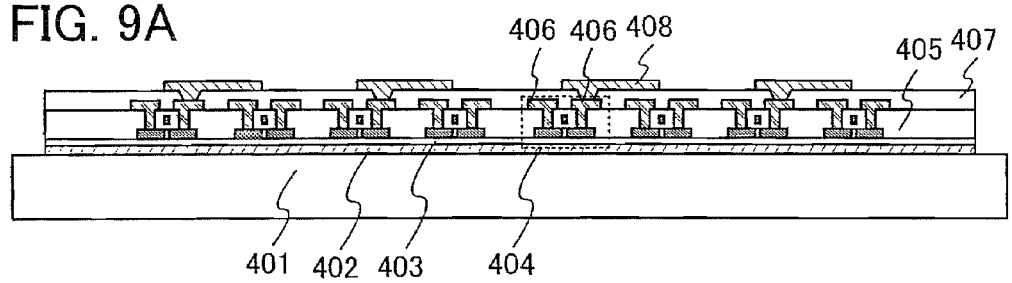
FIGS. 9A to 9E illustrate cross-sectional views of a method of manufacturing a semiconductor device of the invention.

As shown in FIG. 9A, a separation film 402 is formed over a substrate 401. Next, an insulating film 403 is formed over the separation film 402, and thereby a thin film transistor 404 is formed over the insulating film 403. Next, an interlayer insulating film 405 is formed to insulate a conductive film included in the thin film transistor 404, and source and drain electrodes 406 which are connected to a semiconductor film of the thin film transistor 404 are formed. After that, an insulating film 407 which covers the thin film transistor 404, the interlayer insulating film 405, and the source and drain electrodes 406 is formed. Then, a conductive film 408 which is connected to the source electrode 406 or the drain electrode 406 with the insulating film 407 interposed therebetween is formed.

As the substrate 401, a substrate similar to the substrate 100 can be used. Further, a metal substrate which has an insulating film formed on one surface, a stainless-steel substrate which has an insulating film formed on one surface, a plastic substrate which has heat resistance and which can withstand the treatment temperature of this process, a ceramic substrate, or the like can be used. Here, a glass substrate is used as the substrate 401.

The separation film 402 is formed of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon; an alloy material containing an above-mentioned element as its main component; or a compound material containing an above-mentioned element as its main component, and has a single-layer or a stacked-layer structure. A sputtering method, a plasma CVD method, a coating method, a printing method, or the like is used to form the separation film 402. The crystal structure of a separation film including silicon may be amorphous, microcrystalline, or polycrystalline.

When the separation film 402 has a single-layer structure, it is preferable to form a layer including tungsten or molybdenum, or a layer including a mixture of tungsten and molybdenum. Alternatively, a layer including an oxide of tungsten or tungsten oxynitride, a layer including molybdenum oxide or molybdenum oxynitride, or a layer including an oxide or an oxynitride of a mixture of tungsten and molybdenum is formed. The mixture of tungsten and molybdenum corresponds to, for example, an alloy of tungsten and molybdenum.

When the separation film 402 has a stacked-layer structure, a layer including tungsten or molybdenum or a layer including a mixture of tungsten and molybdenum is preferably formed as a first layer, and a layer including an oxide, a nitride, an oxynitride, or a nitride oxide of tungsten, molybdenum, or a mixture of tungsten and molybdenum is preferably formed as a second layer.

When the separation film 402 is formed as a stacked-layer structure including a layer which includes tungsten and a layer which includes an oxide of tungsten, the layer which includes tungsten may be formed and an insulating layer which includes an oxide may be formed thereover so that the layer which includes an oxide of tungsten is formed at the interface of the tungsten layer and the insulating layer. Further, the layer which includes an oxide of tungsten may be formed by processing a surface of the layer which includes tungsten using thermal oxidation treatment, oxygen plasma treatment, $N_2O$ plasma treatment, treatment using a solution with strong oxidizing power, such as ozone water, treatment using water to which hydrogen has been added, or the like. This also applies when forming a layer including tungsten nitride, a layer including tungsten oxynitride, and a layer including tungsten nitride oxide. After forming the layer which includes tungsten, a silicon nitride layer, a silicon oxynitride layer, and a silicon nitride oxide layer are preferably formed over the layer which includes tungsten.

An oxide of tungsten oxide is represented by $WO_x$, where x satisfies $2 \leq x \leq 3$. The x may be 2 ($WO_2$), 2.5 ($W_2O_5$), 2.75 ($W_4O_{11}$), 3 ($WO_3$), or the like.

Here, the tungsten film is formed by a sputtering method to a thickness of 20 to 100 nm, preferably 40 to 80 nm.

Although the separation film 402 is formed such that it is in contact with the substrate 401 in the above process, the invention is not limited to this process. An insulating film which serves as a base may be formed such that it is in contact with the substrate 401 and the separation film 402 may be provided such that it is in contact with the insulating film.

The insulating film 403 can be formed in a similar manner to the insulating film 101. Here, the insulating film is formed by generating plasma in the flow of $N_2O$ gas to faint a tungsten oxide film on a surface of the separation film 402, and then forming a silicon oxide film including nitrogen by a plasma CVD method.

The thin film transistor 404 can be formed in a similar manner to the thin film transistors 225 to 227 described in Embodiment Mode 2. The source and drain electrodes 406 can be formed similarly to the wirings 234 to 239 described in Embodiment Mode 2.

The interlayer insulating film 405 and the insulating film 407 can be formed by applying and baking a polyimide, an acrylic, or a siloxane polymer. Alternatively, they may be formed using an inorganic compound, by a sputtering method, a plasma CVD method, a coating method, a printing method, or the like, as a single layer or a stacked layer. Representative examples of the inorganic compound include silicon oxide, silicon nitride, and silicon oxynitride.

Figure 9B:
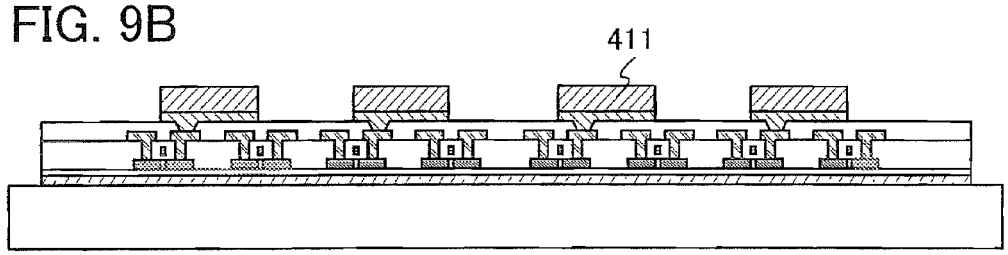

Next, as shown in FIG. 9B, a conductive film 411 is formed over the conductive film 408. Here, a composition including gold particles is printed by a printing method and heated at 200° C. for 30 minutes so that the composition is baked. Thus, the conductive film 411 is formed.

Figure 9C:
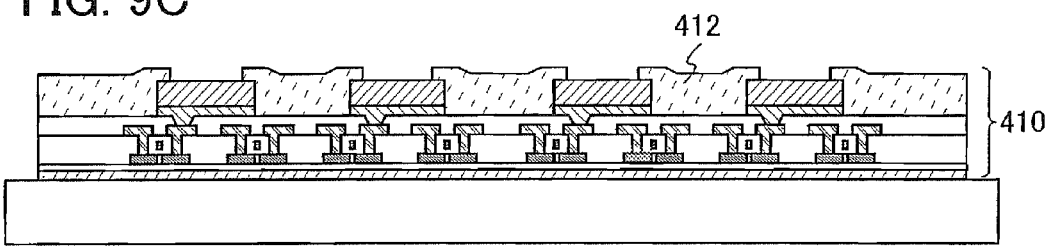

Next, as shown in FIG. 9C, an insulating film 412 which covers end portions of the insulating film 407 and the conductive film 411 is formed. Here, the insulating film 412 which covers end portions of the insulating film 407 and the conductive film 411 is formed using an epoxy resin. An epoxy resin composition is applied by a spin coating method and heated at 160° C. for 30 minutes. Then, a part of the insulating film which covers the conductive film 411 is removed to expose the conductive film 411. Thus, the insulating film 412 with a thickness of 1 to 20 μm, preferably 5 to 10 μm, is formed. Here, a stacked-layer body including from the insulating film 403 to the insulating film 412 is referred to as an element-forming layer 410.

Figure 9D:
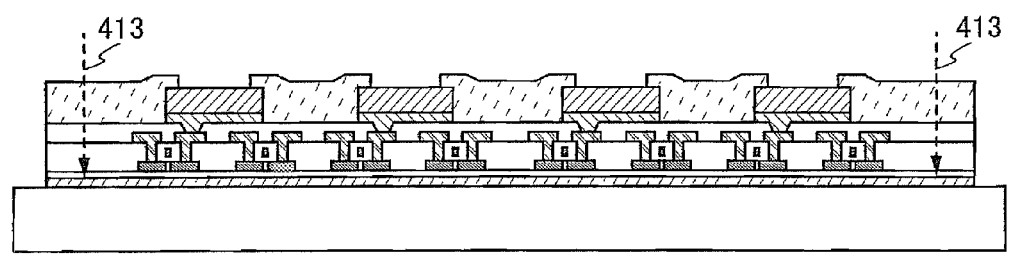
Figure 9E:
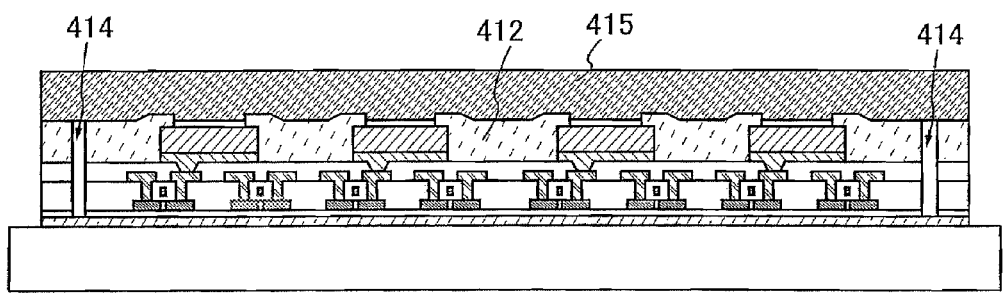

Next, as shown in FIG. 9D, the insulating films 403, 405, 407, and the insulating film 412 are irradiated with a laser beam 413 to form opening portions 414 such as those shown in FIG. 9E, in order to facilitate a subsequent separation step. Next, an adhesive member 415 is attached to the insulating film 412. The laser beam used to irradiate to form the opening portions 414 is preferably a laser beam with a wavelength that is absorbed by the insulating films 403, 405, 407, and the insulating film 412. Typically, a laser beam of an ultraviolet region, a visible region, or an infrared region is selected as appropriate and used to irradiate.

As a laser oscillator capable of emitting such a laser beam, an excimer laser such as an ArF excimer laser, a KrF excimer laser, or a XeCl excimer laser, or a laser oscillator similar to the laser oscillators 11a and 11b described in Embodiment Mode 1 can be used as appropriate. Note that in the case of using a solid-state laser, preferably any one of the fundamental wave to the fifth harmonic is used, as appropriate. As a result of the laser irradiation, the insulating films 403, 405, 407, and 412 absorb the laser beam and melt, and thereby the opening portions are formed.

Note that when the process step of irradiating the insulating films 403, 405, 407, and 412 with the laser beam is omitted, throughput can be improved.

Figure 10A:
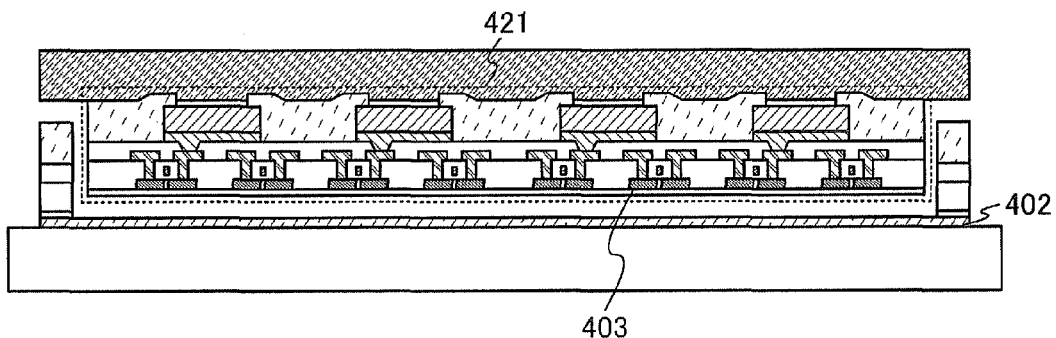
FIGS. 10A to 10D illustrate cross-sectional views of a method of manufacturing a semiconductor device of the invention.

Next, as shown in FIG. 10A, a part 421 of the element-forming layer is separated from the substrate 401 having the separation film by a physical means at a metal oxide film formed at the interface of the separation film 402 and the insulating film 403. A 'physical means' here refers to a dynamic means or a mechanical means which changes some kind of dynamic energy (or mechanical energy). A typical physical means refers to the application of mechanical power (for example, pulling by a human hand or a gripping tool, or separating while rolling a roller, using the roller as a fulcrum).

In this embodiment mode, a method is used in which a metal oxide film is formed between a separation film and an insulating film and a physical means is used to separate the part 421 of the element-forming layer at the metal oxide film. However, the invention is not limited to this. A method can be used in which a light-transmitting substrate is used as the substrate and an amorphous silicon layer containing hydrogen is used as the separation film. In such a method, subsequent to the process step in FIG. 9E, the amorphous silicon film is irradiated with a laser beam from the substrate side to vaporize hydrogen contained in the amorphous silicon film, and separation occurs between the substrate and the separation film.

Further, subsequent to the process step in FIG. 9E, alternatively, a method of removing the substrate by mechanical polishing, or a method of removing the substrate by using a solution such as HF which dissolves the substrate can be employed. In such a case, it is not necessary to use a separation film.

Further, a method can be used in which before attaching the adhesive member 415 to the insulating film 412 in FIG. 9E, a halogen fluoride gas such as $NF_3$, $BrF_3$, or $ClF_3$ is introduced into the opening portions 414 so that the separation film is etched away by the halogen fluoride gas; then, the adhesive member 415 is attached to the insulating film 412; and then, the part 421 of the element-forming layer is separated from the substrate.

Further, a method can be used in which before attaching the adhesive member 415 to the insulating film 412 in FIG. 9E, a halogen fluoride gas such as $NF_3$, $BrF_3$, or $ClF_3$ is introduced into the opening portions 414 so that the separation film is partially etched away by the halogen fluoride gas; then, the adhesive member 415 is attached to the insulating film 412; and then, the part 421 of the element-forming layer is separated from the substrate by a physical means.

Figure 10B:
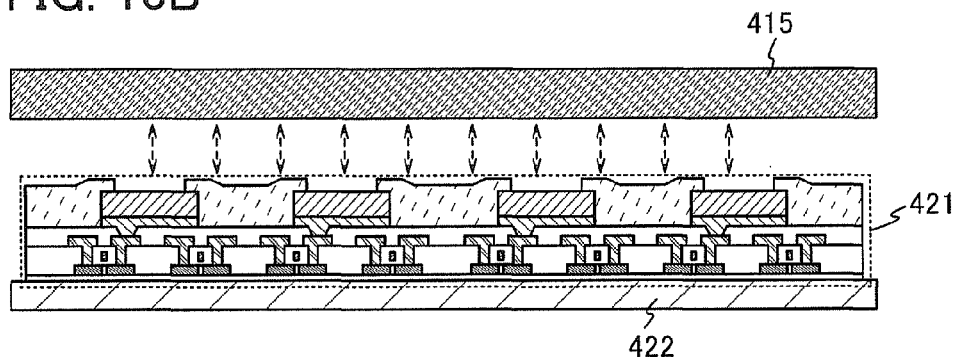

Next, as shown in FIG. 10B, a flexible substrate 422 is attached to the insulating film 403 in the part 421 of the element-forming layer. Then, the adhesive member 415 is separated from the part 421 of the element-forming layer. Here, a film formed of polyaniline by a cast method is used as the flexible substrate 422.

Figure 10C:
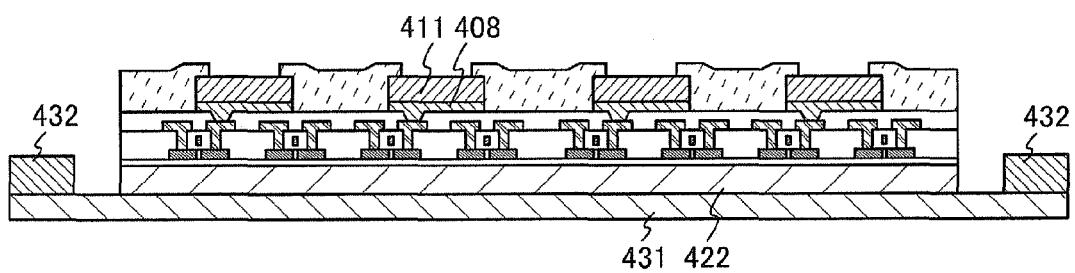

Then, the flexible substrate 422 is attached to a UV sheet 431 of a dicing frame 432, as shown in FIG. 10C. Since the UV sheet 431 is adhesive, the flexible substrate 422 is fixed on the UV sheet 431. Subsequently, the conductive film 411 may be irradiated with a laser beam to increase adhesiveness between the conductive film 411 and the conductive film 408.

Figure 10D:
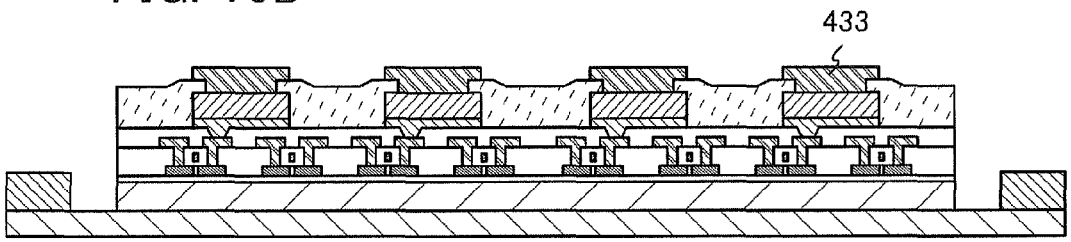

Next, a connection terminal 433 is formed over the conductive film 411, as shown in FIG. 10D. By forming the connection terminal 433, alignment and adhesion with the conductive film which subsequently functions as an antenna can be conducted easily.

Figure 11A:
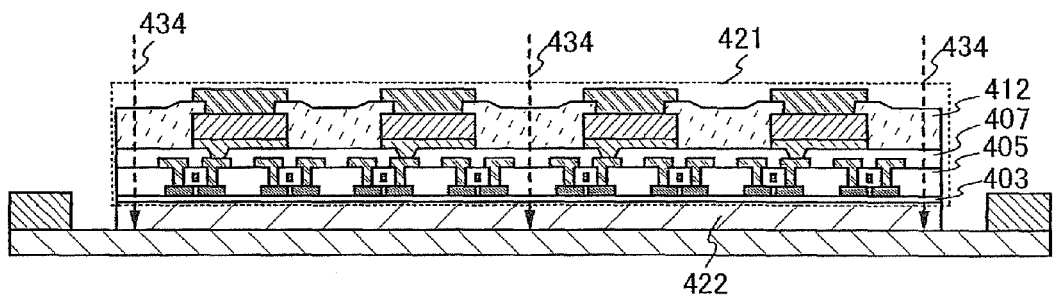
FIGS. 11A to 11C illustrate cross-sectional views of a method of manufacturing a semiconductor device of the invention.
Figure 11B:
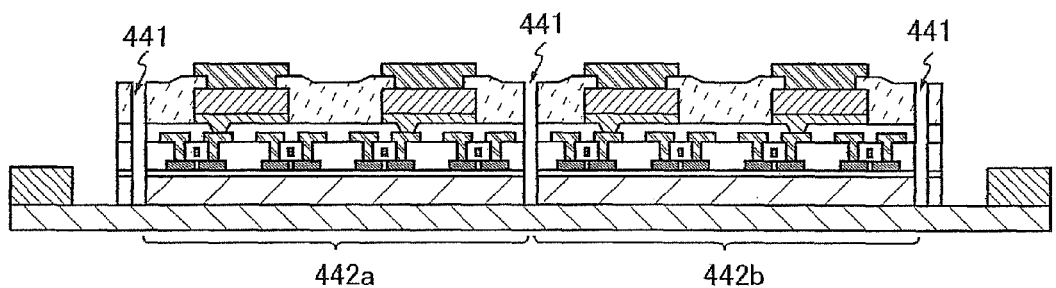

Next, as shown in FIG. 11A, the part 421 of the element-forming layer is divided into parts. Here, the part 421 of the element-forming layer is divided into plural parts, as shown in FIG. 11B, by irradiating the part 421 of the element-forming layer and the flexible substrate 422 with a laser beam 434. As the laser beam 434, any of the laser beams described above which may be used for the laser beam 413 can be used as appropriate. Here, preferably a laser beam which can be absorbed by the insulating films 403, 405, and 407, the insulating film 412, and the flexible substrate 422 is selected. Note that although the part of the element-forming layer is divided into plural parts by a laser cut method here, a dicing method, a scribing method, or the like can be used instead as appropriate. The element-forming layer which has been divided into parts is shown as thin film integrated circuits 442a and 442b.

Figure 11C:
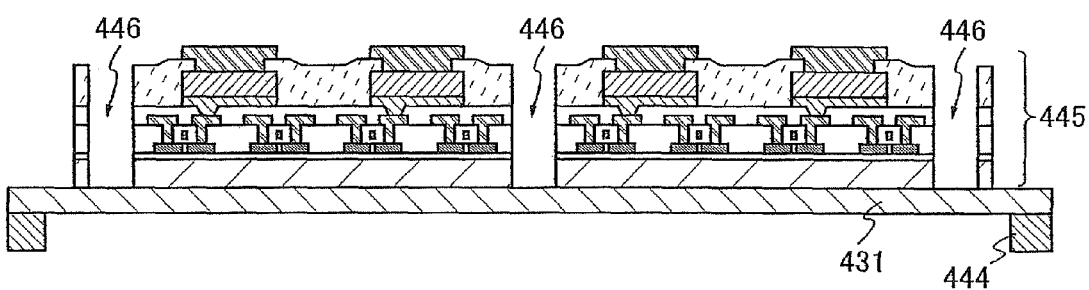

Next, as shown in FIG. 11C, the UV sheet of the dicing frame 432 is irradiated with UV light to decrease the adhesiveness of the UV sheet 431. Then, the UV sheet 431 is supported by an expander frame 444. At this time, by supporting the UV sheet 431 with the expander frame 444 while stretching the UV sheet 431, the width of a groove 441 which is formed between the thin film integrated circuits 442a and 442b can be increased. Note that preferably an expanded groove 446 corresponds to the size of an antenna substrate which is subsequently attached to the thin film integrated circuits 442a and 442b.

Figure 12A:
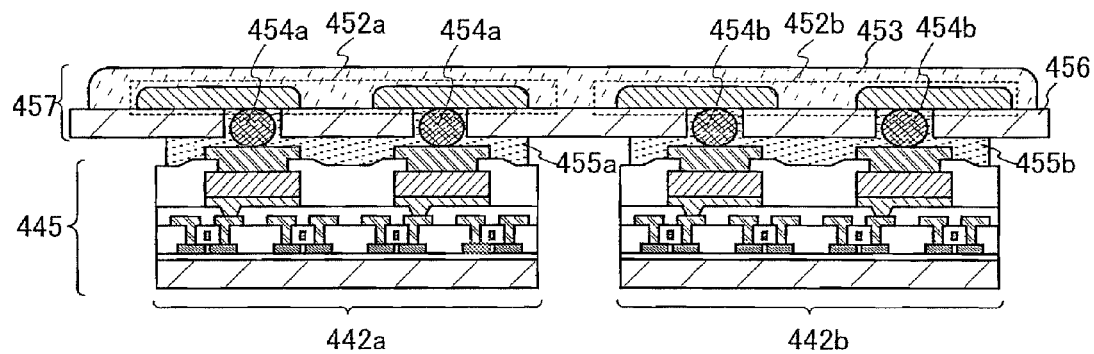
FIGS. 12A to 12D illustrate cross-sectional views of a method of manufacturing a semiconductor device of the invention.

Next, as shown in FIG. 12A, a flexible substrate 456 having conductive films 452a and 452b which function as antennas is attached to the thin film integrated circuits 442a and 442b using anisotropic conductive adhesives 455a and 455b. Note that the flexible substrate 456 having the conductive films 452a and 452b which function as antennas is provided with opening portions so as to partially expose the conductive films 452a and 452b. Accordingly, the flexible substrate 456 is attached to the thin film integrated circuits 442a and 442b while adjusting their positions such that the conductive films 452a and 452b which function as antennas are connected to connection terminals of the thin film integrated circuits 442a and 442b by conductive particles 454a and 454b which are included in the anisotropic conductive adhesives 455a and 455b.

Here, the conductive film 452a which functions as an antenna is connected to the thin film integrated circuit 442a by the conductive particles 454a within the anisotropic conductive adhesive 455a, while the conductive film 452b which functions as an antenna is connected to the thin film integrated circuit 442b by the conductive particles 454b within the anisotropic conductive adhesive 455b.

Figure 12B:
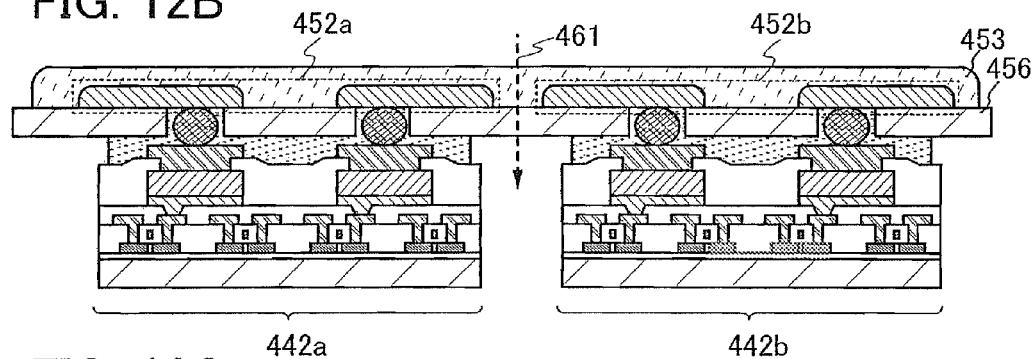

Subsequently, as shown in FIG. 12B, the flexible substrate 456 and an insulating film 453 are divided into parts in a region where the conductive films 452a and 452b which function as antennas and the thin film integrated circuits 442a and 442b are not formed. Here, they are divided into parts by a laser cutting method in which the insulating film 453 and the flexible substrate 456 are irradiated with a laser beam 461.

Figure 12C:
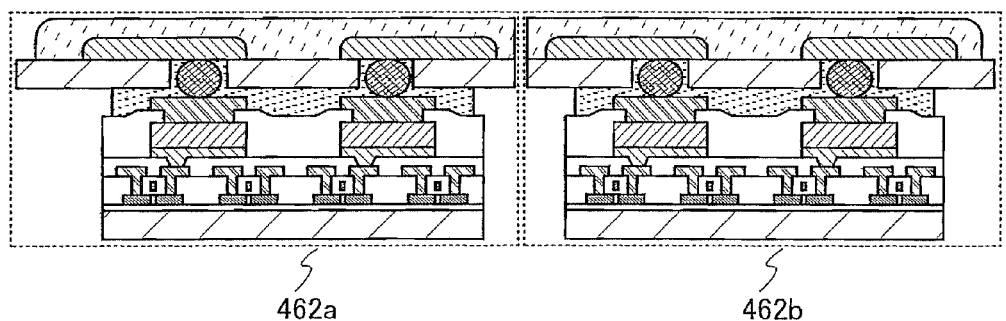
Figure 12D:
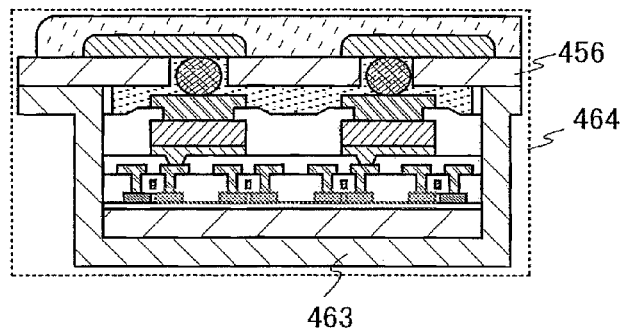

In accordance with the above steps, semiconductor devices 462a and 462b which are capable of non-contact data transmission can be manufactured, as shown in FIG. 12C.

Note that a semiconductor device 464 such as the one shown in FIG. 11D may be manufactured in such a way that the flexible substrate 456 having the conductive films 452a and 452b which function as antennas is attached to the thin film integrated circuits 442a and 442b using the anisotropic conductive adhesives 455a and 455b in FIG. 12A; then, a flexible substrate 463 is provided so as to seal the flexible substrate 456 and the thin film integrated circuits 442a and 442b; and the region where the conductive films 452a and 452b which function as antennas and the thin film integrated circuits 442a and 442b are not formed is irradiated with the laser beam 461, as shown in FIG. 12B. In this case, the thin film integrated circuits are sealed by the flexible substrates 456 and 463 which have been divided into parts. Therefore, deterioration of the thin film integrated circuits can be suppressed.

In accordance with the above steps, thin and lightweight semiconductor devices can be manufactured with a high yield. In the semiconductor device described in this embodiment mode, the number of cracks that form in the substrate and the layer over the substrate during the manufacturing process can be reduced. Therefore, semiconductor devices can be manufactured with a high yield.

Figure 13:
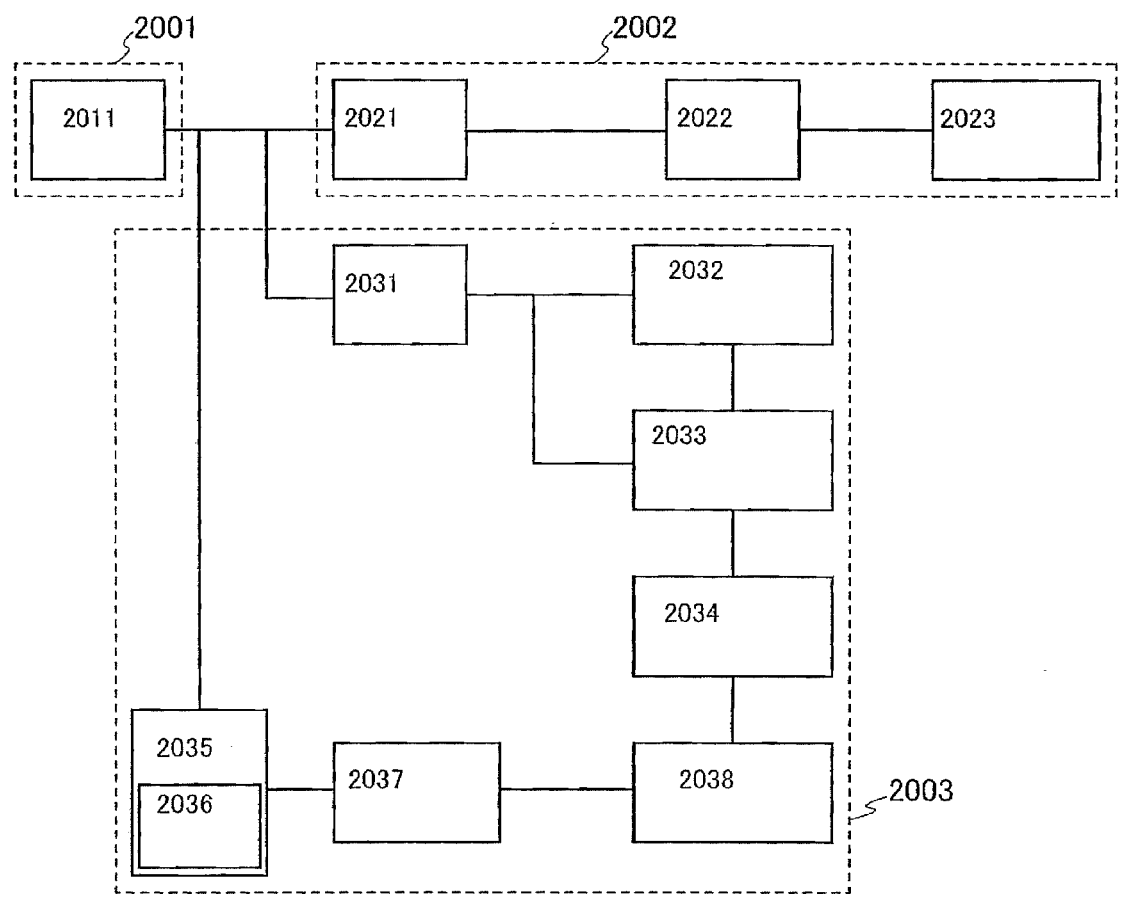
FIG. 13 illustrates a structure of a semiconductor device of the invention.

Next, a structure of the above-mentioned semiconductor device which is capable of non-contact data transmission will be described, with reference to FIG. 13.

The semiconductor device of this embodiment mode includes an antenna portion 2001, a power supply portion 2002, and a logic portion 2003 as its main components.

The antenna portion 2001 includes an antenna 2011 which receives external signals and transmits data. The signal transmission method of the semiconductor device can be an electromagnetic coupling method, an electromagnetic induction method, a microwave method, or the like. The transmission method may be selected as appropriate taking an intended use of the device into account, and an antenna which is suitable for the transmission method may be provided.

The power supply portion 2002 includes a rectifier circuit 2021 which produces power based on a signal received from the outside through the antenna 2011 and a storage capacitor 2022 for storing the produced power.

The logic portion 2003 includes a demodulation circuit 2031 which demodulates a received signal, a clock generating/compensating circuit 2032 which generates a clock signal, a code recognition and determination circuit 2033, a memory controller 2034 which produces a signal for reading data from a memory based on a received signal, a modulation circuit 2035 for changing an encoded signal to a received signal, an encoder circuit 2037 which encodes the read data, and a mask ROM 2038 which stores data. Further, the modulation circuit 2035 has a resistor 2036 for modulation.

A code recognized and determined by the code recognition and determination circuit 2033 is a frame termination signal (EOF, End of Frame), a frame starting signal (SOF, Start of Frame), a flag, a command code, a mask length, a mask value, or the like. The code recognition and determination circuit 2033 also has a cyclic redundancy check (CRC) function for identifying transmission errors.

Next, applications of the above-described semiconductor device which is capable of non-contact data transmission will be described with reference to FIGS. 14A to 14F. The above-described semiconductor device which is capable of non-contact data transmission has a wide range of applications, such as bills, coins, securities, bearer bonds, documents (e.g., driver's licenses or resident's cards; see FIG. 14A), packaging containers (e.g., wrapping paper or bottles; see FIG. 14C), storage media (e.g., DVD software or video tapes; see FIG.

Figure 14A:
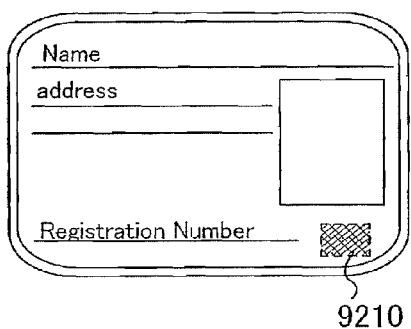
FIGS. 14A to 14F illustrate uses of a semiconductor device of the invention.
Figure 14B:
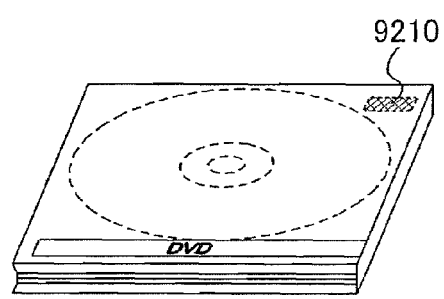
Figure 14C:
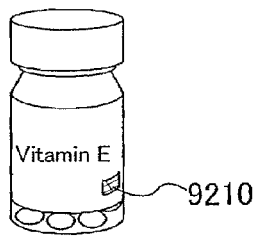
Figure 14D:
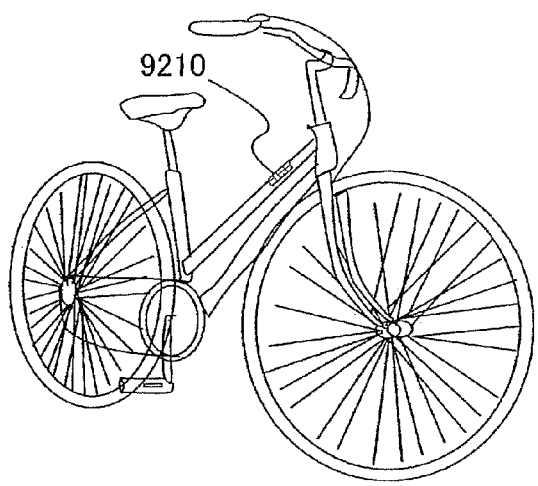
Figure 14E:
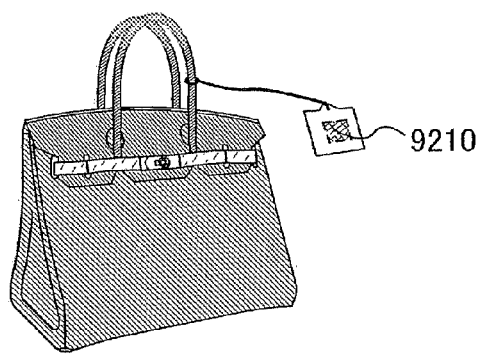
Figure 14F:
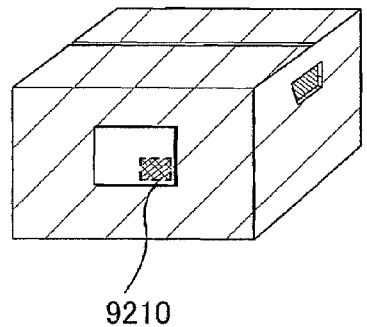

14B), means of transportation (e.g., bicycles; see FIG. 14D), personal belongings (e.g., shoes or glasses), food, plants, animals, clothing, daily commodities, or tags on goods such as electronic devices or on bags (see FIGS. 14E and 14F). An electronic device is, for example, a liquid crystal display device, an EL display device, a television device (also referred to as simply a television, or as a TV receiver or a television receiver), a portable telephone, or the like.

The semiconductor device 9210 of this embodiment mode may be fixed to an article by being mounted on a printed board, attached to a surface of the article, embedded in the article, and so on. For example, if the product is a book, the semiconductor device may be fixed to the book by embedding it inside paper of the book, and if the product is a package made of an organic resin, the semiconductor device may be fixed to the package by being embedded inside the organic resin. Since the semiconductor device 9210 of this embodiment mode can be compact, thin, and lightweight, the design quality of the article itself is not degraded even after the device is fixed to the article. Further, by providing bills, coins, securities, bearer bonds, documents, and the like with the semiconductor device 9210 of this embodiment mode, they can be provided with an identification function, and forgery can be prevented by making use of the identification function. Moreover, when the semiconductor device of this embodiment mode is provided in containers for packaging, recording media, personal belongings, food, clothes, daily commodities, electronic appliances, and the like, systems such as inspection systems can be made more efficient.

Embodiment Mode 5

Examples which can be given of electronic appliances having a semiconductor device described in a preceding embodiment mode include television devices (also referred to as simply televisions, or as television receivers), cameras, such as digital cameras or digital video cameras, portable telephone devices (also referred to as simply portable telephones, or mobile phones), portable information terminals such as PDAs, portable game machines, monitors for computers, computers, sound reproducing devices, such as car audio devices, image reproducing devices equipped with a recording medium, such as home-use game machines, or the like. Specific examples of these are described with reference to FIGS. 15A to 15F.

Figure 15A:
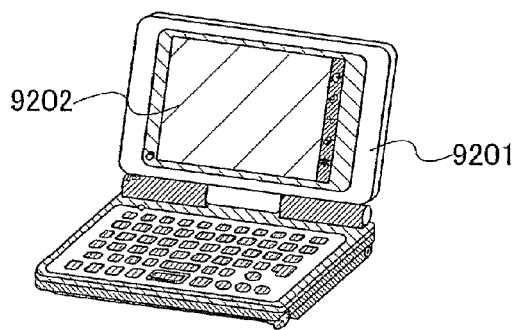
FIGS. 15A to 15F illustrate electronic devices which employ a semiconductor device of the invention.

A portable information terminal shown in FIG. 15A includes a main body 9201, a display portion 9202, and the like. By employing a semiconductor device described in a preceding embodiment mode in the display portion 9202, a portable information terminal capable of high-definition display can be provided at a low price.

Figure 15B:
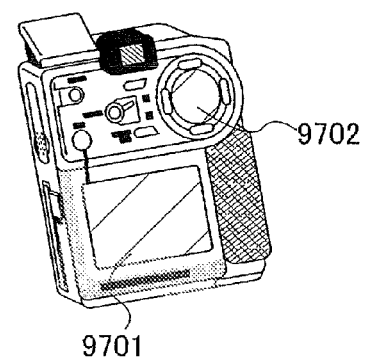

A digital video camera shown in FIG. 15B includes a display portion 9701, a display portion 9702, and the like. By employing a semiconductor device described in a preceding embodiment mode in the display portion 9701, a digital video camera capable of high-definition display can be provided at a low price.

Figure 15C:
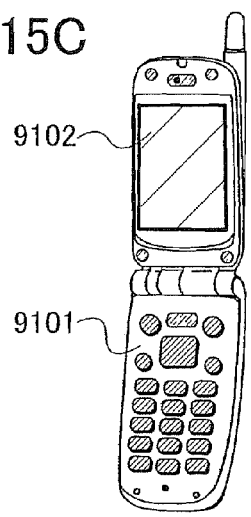

A portable terminal shown in FIG. 15C includes a main body 9101, a display portion 9102, and the like. By employing a semiconductor device described in a preceding embodiment mode in the display portion 9102, a portable terminal with high reliability can be provided at a low price.

Figure 15D:
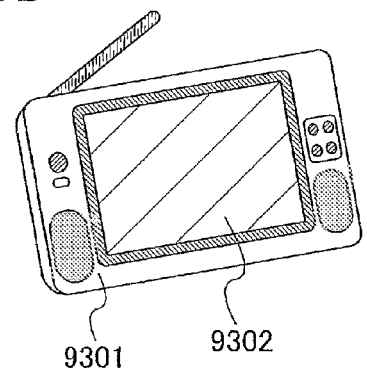

A portable television device shown in FIG. 15D includes a main body 9301, a display portion 9302, and the like. By employing a semiconductor device described in a preceding embodiment mode in the display portion 9302, a portable television device capable of high-definition display can be provided at a low price. Such a television device can be applied to a wide range of television devices, from small-sized devices that are mounted on portable terminals such as portable phones to medium-sized devices that are portable and large-sized devices (for example, 40 inches or more).

Figure 15E:
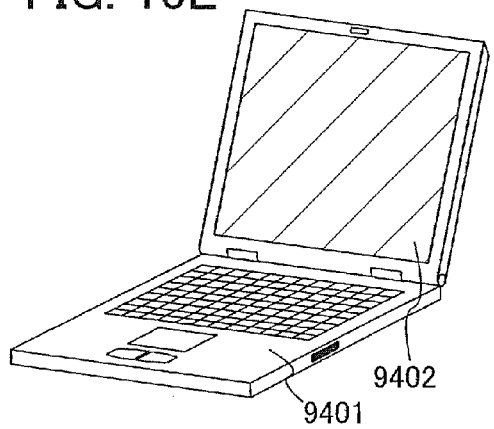

A portable computer shown in FIG. 15E includes a main body 9401, a display portion 9402, and the like. By employing a semiconductor device described in a preceding embodiment mode in the display portion 9402, a portable computer capable of high-definition display can be provided at a low price.

Figure 15F:
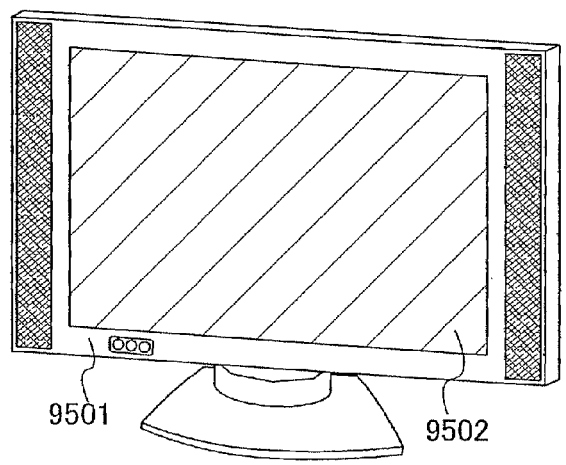

A television device shown in FIG. 15F includes a main body 9501, a display portion 9502, and the like. By employing a semiconductor device described in a preceding embodiment mode in the display portion 9502, a television device capable of high-definition display can be provided at a low price.

A structure of the television device will now be described, with reference to FIG. 16.

Figure 16:
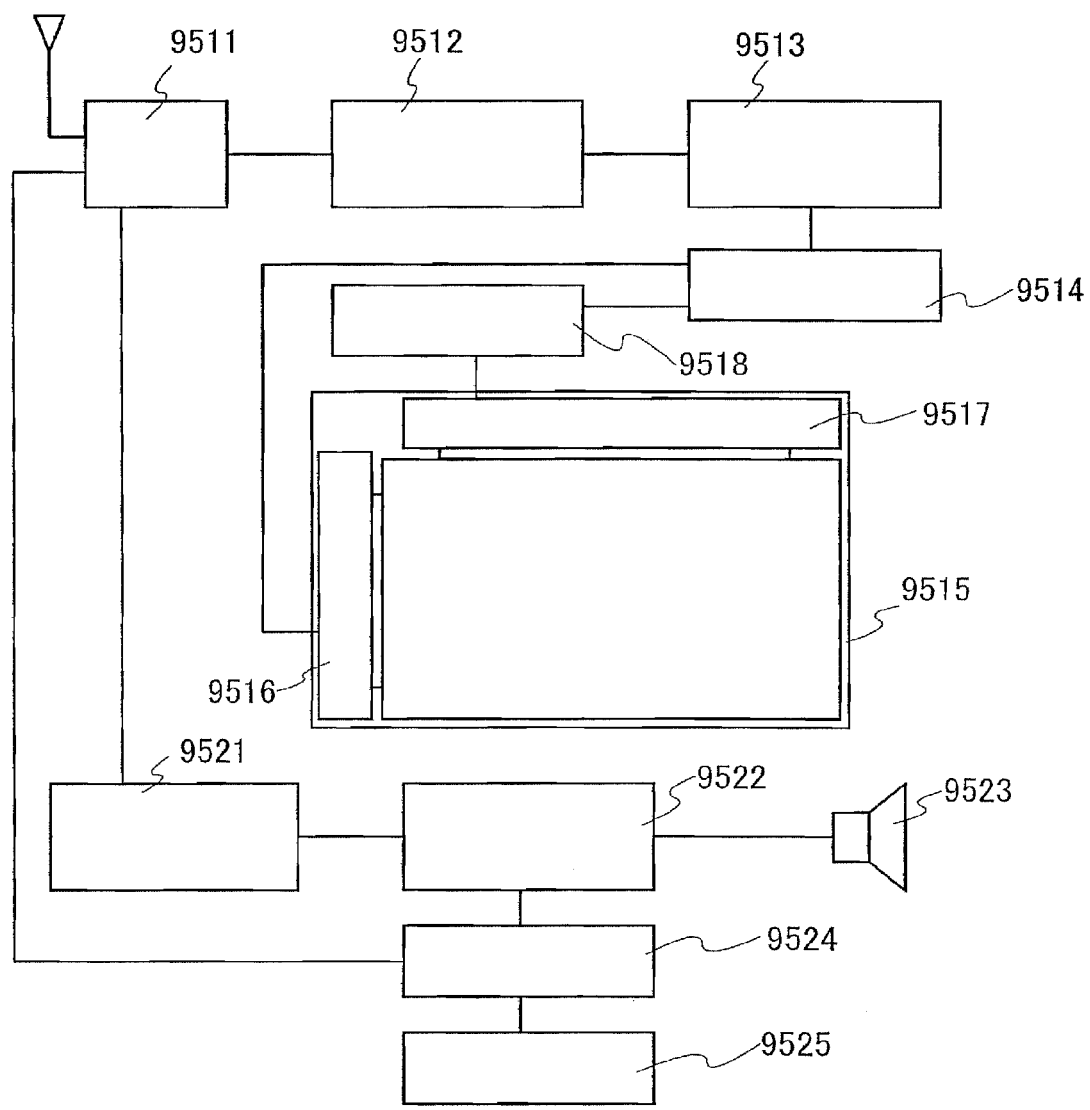
FIG. 16 illustrates a structure of an electronic device which employs a semiconductor device of the invention.

FIG. 16 is a block diagram showing the main structure of the television device. A tuner 9511 receives a video signal and an audio signal. The video signal is processed through a video detection circuit 9512, a video signal processing circuit 9513 which converts the signal outputted from the video detection circuit 9512 into a color signal corresponding to red, green, or blue, and a control circuit 9514 for converting the video signal in accordance with input specifications of a driver IC. The control circuit 9514 outputs signals to a scanning line driver circuit 9516 and a signal line driver circuit 9517 of a display panel 9515. In a case where digital driving is used, a signal dividing circuit 9518 may be provided on a signal line side so that the inputted digital signal is divided into m number of signals to be supplied.

Of the signals received by the tuner 9511, the audio signal is sent to an audio detection circuit 9521 and its output is supplied to a speaker 9523 through an audio signal processing circuit 9522. The control circuit 9524 receives control information such as a receiving station (a receiving frequency) and sound volume from an input portion 9525, and sends signals to the tuner 9511 and the audio signal processing circuit 9522.

By faulting the television device so as to include the display panel 9515, the television device can have low power consumption. Further, a television device which can display high-definition images can be manufactured.

The present invention is not limited to television receivers, and can be applied to various uses, for example to display mediums, particularly ones with a large area, such as an information display board at a railway station, an airport, or the like, or an advertisement display board on the street, as well as to monitors of personal computers.

Figure 17:
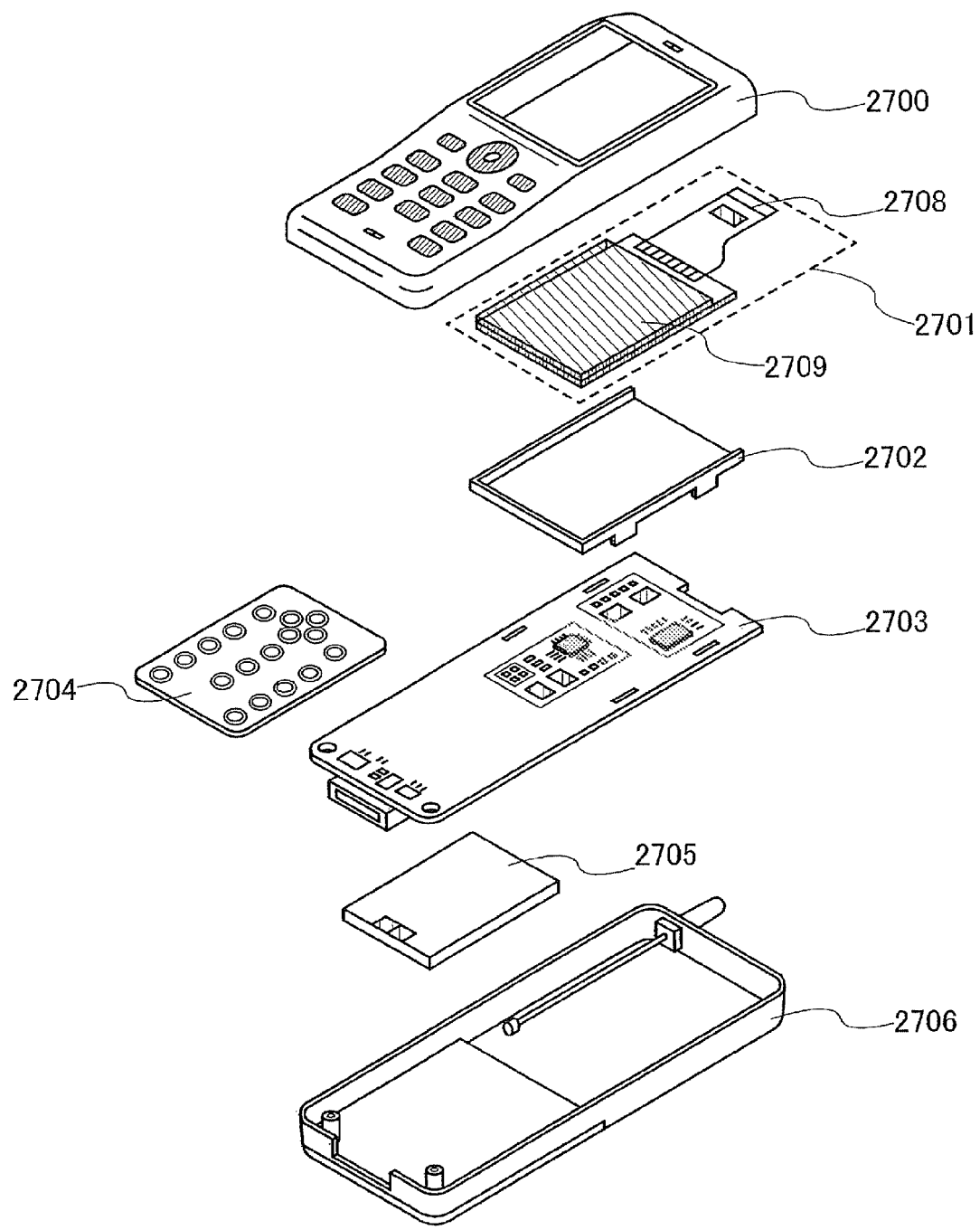
FIG. 17 is a development view illustrating an electronic device which employs a semiconductor device of the invention.

Next, a portable phone appliance is described as a mode of an electronic appliance to which the semiconductor device of the invention is mounted, with reference to FIG. 17. The portable phone appliance includes cases 2700 and 2706, a display panel 2701, a housing 2702, a printed wiring board 2703, operation buttons 2704, and a battery 2705 (see FIG. 17). The display panel 2701 is detachably incorporated into the housing 2702, and the housing 2702 is fitted to the printed wiring board 2703. The shape and size of the housing 2702 are changed as appropriate in accordance with the electronic appliance into which the display panel 2701 is incorporated. A plurality of semiconductor devices that are packaged are mounted on the printed wiring board 2703. A semiconductor device of the invention can be used as one of them. The plurality of semiconductor devices mounted on the printed wiring board 2703 have functions such as the function of a controller, a central processing unit (CPU), a memory, a power supply circuit, an audio processing circuit, a sending/receiving circuit, or the like.

The display panel 2701 is connected to the printed wiring board 2703 with a connection film 2708 interposed therebetween. The display panel 2701, the housing 2702, and the printed wiring board 2703 are housed in the cases 2700 and 2706, together with the operation buttons 2704 and the battery 2705. A pixel region 2709 in the display panel 2701 is disposed such that it can be observed through a window opening provided in the case 2700.

Figure 18A:
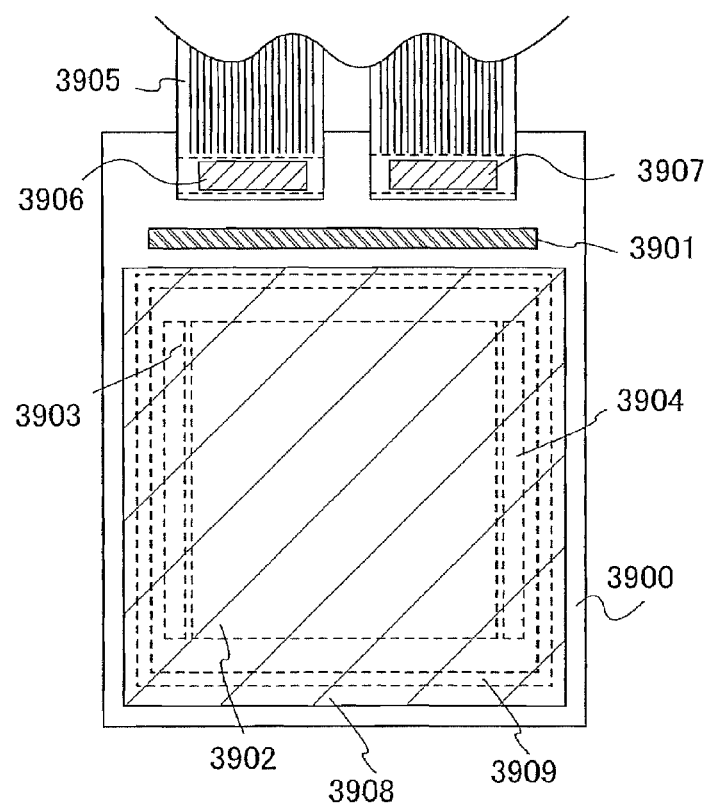
FIGS. 18A and 18B are top views illustrating a semiconductor device of the invention.

In the display panel 2701, a pixel portion and one or more peripheral driver circuits (in a plurality of driver circuits, the driver circuits which have a low operating frequency) may be formed over one substrate using TFTs, whereas some other peripheral driver circuits (in a plurality of driver circuits, the driver circuits which have a high operating frequency) may be formed over an IC chip. The IC chip may be mounted on the display panel 2701 using COG (chip on glass) technology, or the IC chip may be connected to a glass substrate by using TAB (tape automated bonding) or a printed board. Note that FIG. 18A shows an example of a structure of a display panel in which a pixel portion and a part of a peripheral driver circuit are formed over one substrate and an IC chip including the other part of the peripheral driver circuit is mounted by COG or the like. The display panel shown in FIG. 18A includes a substrate 3900, a signal line driver circuit 3901, a pixel portion 3902, a scanning line driver circuit 3903, a scanning line driver circuit 3904, an FPC 3905, an IC chip 3906, an IC chip 3907, a sealing substrate 3908, and a sealant 3909. By employing such a structure, the power consumption of a display device can be reduced, and a portable phone appliance can be used for a longer period per charge. Further, the cost of a portable phone appliance can be reduced.

Figure 18B:
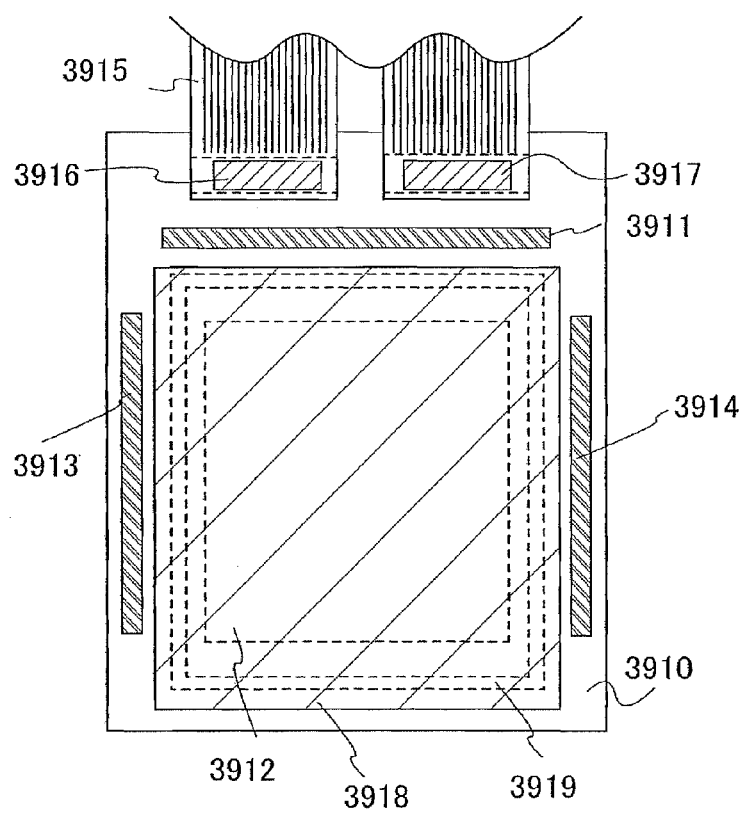

In order to further reduce power consumption, a pixel portion may be formed over a substrate using TFTs and all the peripheral driving circuits may be formed over an IC chip, and then the IC chip may be mounted on a display panel using COG (chip on glass) technology, or the like, as shown in FIG. 18B. A display panel shown in FIG. 18B includes a substrate 3910, a signal line driver circuit 3911, a pixel portion 3912, a scanning line driver circuit 3913, a scanning line driver circuit 3914, an FPC 3915, an IC chip 3916, an IC chip 3917, a sealing substrate 3918, and a sealant 3919.

As described above, a semiconductor device of the invention is compact, thin, and lightweight. With these features, the limited space within the cases 2700 and 2706 of the electronic appliance can be used efficiently. Further, cost reduction is possible, and an electronic appliance having a semiconductor device with high reliability can be manufactured.

Embodiment 1

In this embodiment, substrates in which cracks easily form when irradiation with a laser beam is performed will be described. Further, concerning the substrates, the total stress after heating (a calculated value) of layers including a semiconductor film which are formed over the substrates, and the occurrence or non-occurrence of crack formation after heating will be described.

First, the formation of cracks when a layer including a semiconductor film is irradiated with a laser beam after being formed over a substrate, and types of substrate will be described with reference to FIG. 19.

A layer including a semiconductor film was formed over each of a substrate 1, a substrate 2, and a substrate 3. Here, as the layer including a semiconductor film, a silicon nitride oxide film with a thickness of 50 nm, a silicon oxynitride film with a thickness of 100 nm, and an amorphous silicon film with a thickness of 66 nm were each formed by a plasma CVD method in that order.

An EAGLE2000 substrate (manufactured by Corning, Inc.) with a thickness of 0.7 mm was used as the substrate 1, an AN100 substrate (manufactured by Asahi Glass Co., Ltd) with a thickness of 0.7 mm was used as the substrate 2, and an AQ (quartz) substrate (manufactured by Asahi Glass Co., Ltd) with a thickness of 0.7 mm was used as the substrate 3.

Figure 19:
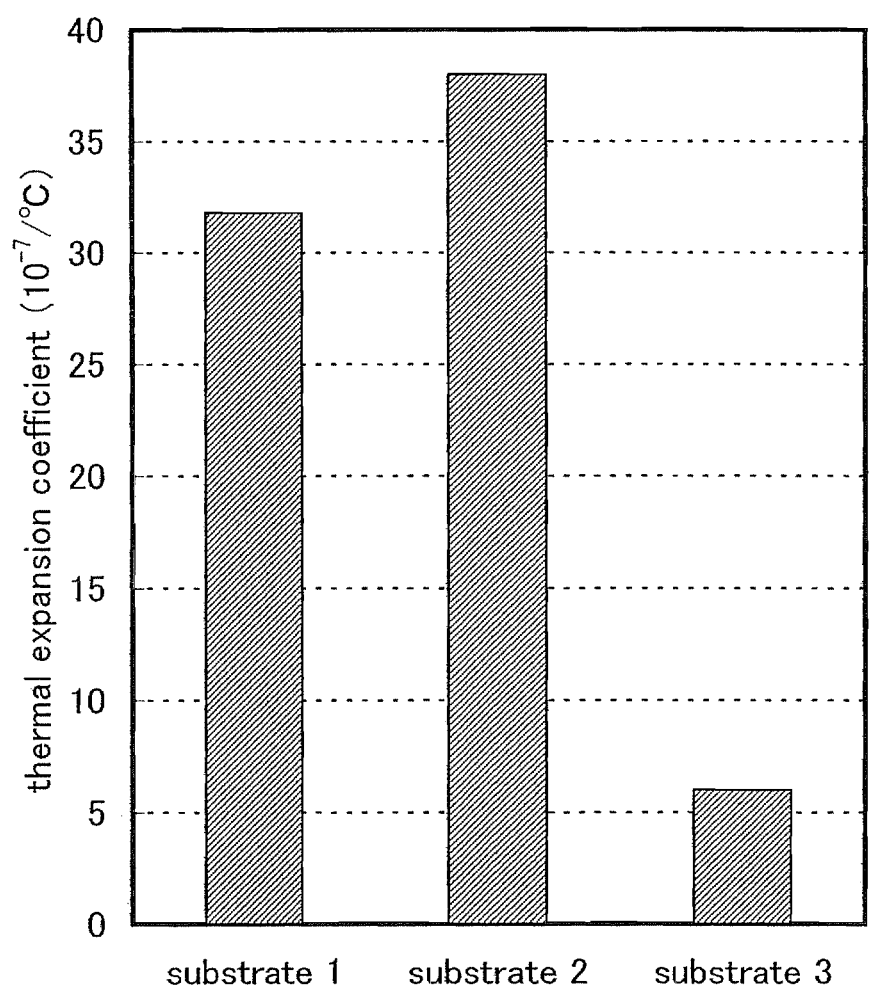
FIG. 19 is a graph showing thermal expansion coefficient of substrates used in an embodiment.

The thermal expansion coefficient of each substrate is shown in Table 1 and FIG. 19.

[Table 1]

TABLE 1

| | thermal expansion coefficient ($10^{-7}/°$ C.) |
|---|---|
| substrate 1 | 31.8 |
| substrate 2 | 38 |
| substrate 3 | 6 |

Film formation conditions for each of the silicon nitride oxide film, the silicon oxynitride film, and the amorphous silicon film are shown in Table 2.

[Table 2]

TABLE 2

| film | temperature of substrate (° C.) | SiH$_4$ (sccm) | N$_2$O (sccm) | NH$_3$ (sccm) | H$_2$ (sccm) | N$_2$ (sccm) | pressure (Pa) | RF frequency (MHz) | RF power (W) | distance between electrodes (mm) |
|---|---|---|---|---|---|---|---|---|---|---|
| silicon nitride oxide film | 330 | 55 | 35 | 400 | 400 | 400 | 100 | 13.56 | 150 | 24.5 |
| silicon oxynitride film | 330 | 30 | 1200 | 0 | 0 | 0 | 40 | 13.56 | 50 | 24.5 |
| amorphous silicon film | 330 | 280 | 0 | 0 | 300 | 0 | 170 | 13.56 | 60 | 24.5 |

Next, the substrates 1 to 3 were heated at 500° C. for one hour in a furnace, and then heated at 550° C. for four hours.

Next, the substrates 1 to 3 were irradiated with a laser beam. Concerning the irradiating conditions of the laser beam at this time, as a laser oscillator, a second harmonic of an Nd:YVO$_4$ laser was used, scanning speed was 35 cm/sec, power was 18 W, and the number of times scanned was ten.

The presence or otherwise of cracks in the substrates 1 to 3 and the average number of cracks in the substrates 1 to 3 are shown in Table 3. At this time the average number of cracks refers to the average number of cracks per scan in an end portion of the substrate and the average number of cracks per scan 1 cm inside the end portion of the substrate.
[Table 3]

TABLE 3

|  |  | average number of cracks per scan | |
| --- | --- | --- | --- |
|  | presence or otherwise of cracks | end portion of substrate | average number of cracks per scan 1 cm inside end portion of substrate |
| substrate 1 | presence | 1.5 | 0 |
| substrate 2 | presence | 4.5 | 0 |
| substrate 3 | nothing | 0 | 0 |

From FIG. 19, Table 1, and Table 3, it can be seen that in the substrates having a thermal expansion coefficient of greater than $6\times10^{-7}/°$ C. and less than or equal to $38\times10^{-7}/°$ C., preferably greater than $6\times10^{-7}/°$ C. and less than or equal to $31.8\times10^{-7}/°$ C., when a layer including a semiconductor film was formed, heating was performed, and subsequently irradiation with a laser beam was performed, a crack formed in the substrate and the layer including a semiconductor film.

Next, we investigated conditions of a layer including a semiconductor film in a substrate having a thermal expansion coefficient of greater than $6\times10^{-7}/°$ C. and less than or equal to $38\times10^{-7}/°$ C., preferably greater than $6\times10^{-7}/°$ C. and less than or equal to $31.8\times10^{-7}/°$ C., in which cracks did not form in the substrate and the layer including a semiconductor film even when the layer including a semiconductor film was formed, then heating was performed, and subsequently irradiation with a laser beam was performed. The results are described below, with reference to FIGS. 20A to 20C, FIG. 21, and FIG. 22.

AN100 substrates (manufactured by Asahi Glass Co., Ltd) with a thermal expansion coefficient of $38\times10^{-7}/°$ C. and a thickness of 0.7 mm were used as substrates, and a layer including a semiconductor film was formed over each of the substrates. Heating was performed, and subsequently irradiation with a laser beam was performed. The relationship between whether or not cracks formed in the substrate and the layer including a semiconductor film at this time and the total stress of the layer including a semiconductor film, which was calculated from the film stresses and film thicknesses of films included in the layer including a semiconductor film, is shown in FIG. 21.

Figure 20A:
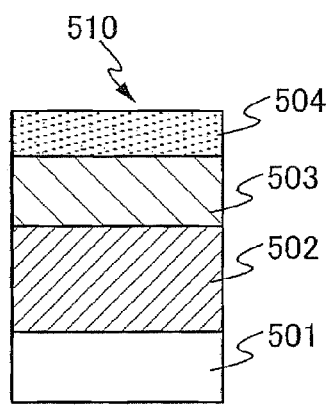
FIGS. 20A to 20C are cross-sectional views illustrating structures of a layer including a semiconductor film, which is over a substrate, which are used in an embodiment.
Figure 21:
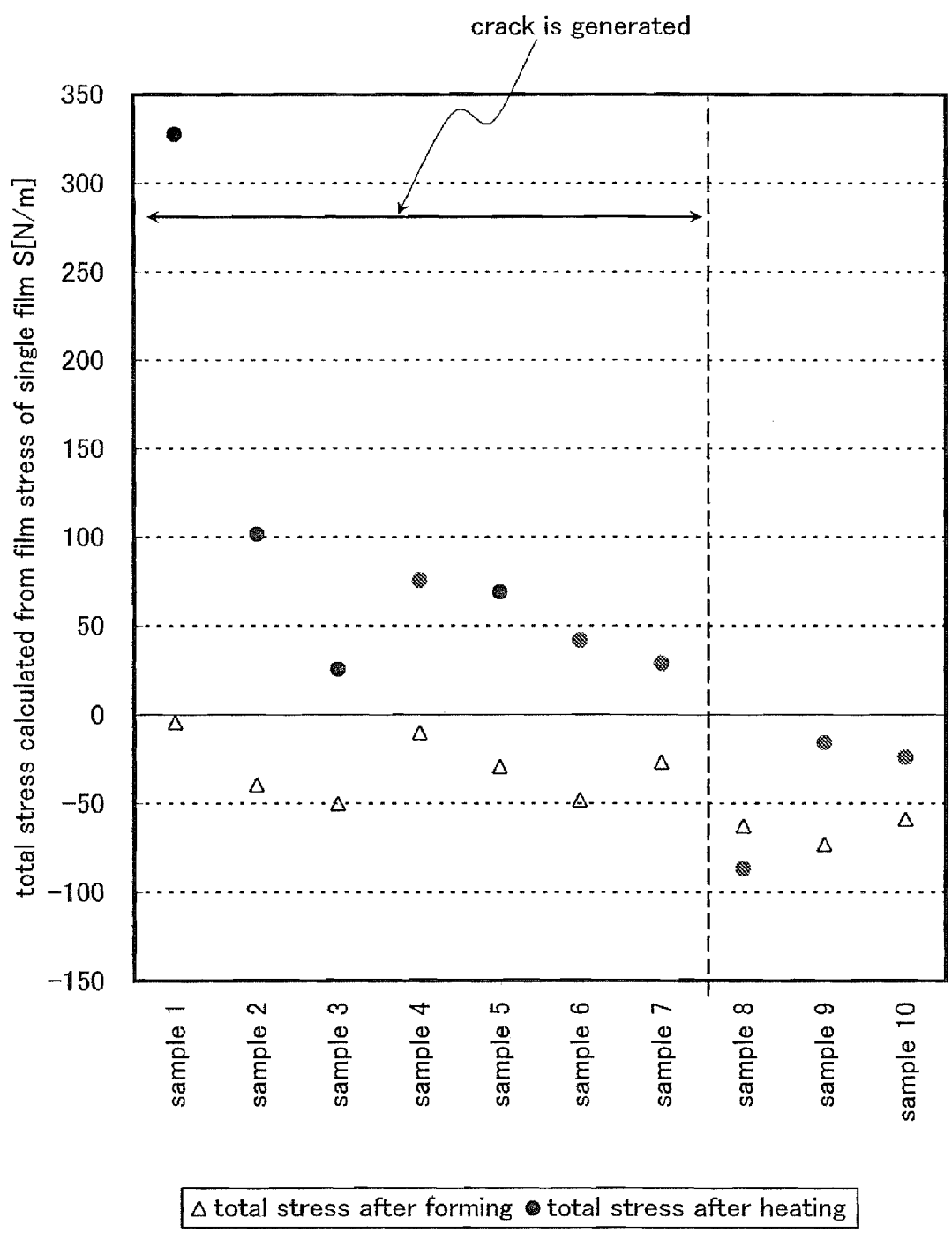
FIG. 21 is a graph showing total stress calculated from the film stress of single films.

Concerning FIG. 21, Sample 1 had a structure 510 shown in FIG. 20A. Over a substrate 501, as the layer including a semiconductor film, a silicon nitride oxide film 502 with a thickness of 140 nm, a silicon oxynitride film 503 with a thickness of 100 nm, and an amorphous silicon film 504 with a thickness of 66 nm were each formed by a plasma CVD method in that order.

Figure 20B:
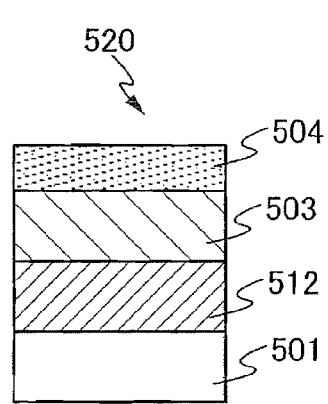

Samples 2 to 9 had a structure 520 shown in FIG. 20B. Over a substrate 501, as the layer including a semiconductor film, a silicon nitride oxide film 512 with a thickness of 50 nm, a silicon oxynitride film 503 with a thickness of 100 nm, and an amorphous silicon film 504 with a thickness of 66 nm were each formed by a plasma CVD method in that order.

Figure 20C:
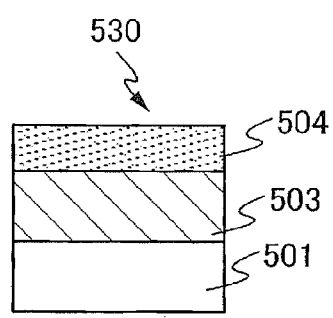

Sample 10 had a structure 530 shown in FIG. 20C. Over a substrate 501, as the layer including a semiconductor film, a silicon oxynitride film 503 with a thickness of 100 nm and an amorphous silicon film 504 with a thickness of 66 nm were each formed by a plasma CVD method in that order.

Film formation conditions for Samples 1 to 10 are shown in Table 4.
[Table 4]

TABLE 4

| film | sample | temperature of substrate (° C.) | SiH$_4$ (sccm) | N$_2$O (sccm) | NH$_3$ (sccm) | H$_2$ (sccm) | N$_2$ (sccm) | pressure (Pa) | RF frequency (MHz) | RF power (W) | distance between electrodes (mm) |
| --- | --- | --- | --- | --- | --- | --- | --- | --- | --- | --- | --- |
| silicon nitride oxide film | 1, 2, 11, 12 | 330 | 110 | 70 | 800 | 800 | 800 | 100 | 13.56 | 320 | 28 |
|  | 3, 13 | 330 | 30 | 30 | 300 | 800 | 0 | 120 | 13.56 | 320 | 28 |
|  | 4 | 330 | 55 | 35 | 400 | 400 | 400 | 100 | 13.56 | 80 | 24.5 |
|  | 5 | 330 | 55 | 35 | 400 | 400 | 400 | 100 | 13.56 | 150 | 24.5 |
|  | 6 | 330 | 55 | 35 | 400 | 400 | 400 | 100 | 13.56 | 300 | 24.5 |
|  | 7, 14 | 400 | 14 | 20 | 150 | 500 | 0 | 160 | 27.13 | 50 | 20 |
|  | 8, 15 | 400 | 10 | 20 | 100 | 400 | 0 | 40 | 27.13 | 50 | 30 |
|  | 9 | 330 | 15 | 20 | 150 | 1200 | 0 | 40 | 13.56 | 250 | 24.5 |
|  | 10, 16 | — | — | — | — | — | — | — | — | — | — |
| silicon oxynitride film | 1, 2, 3, 10, 11, 12, 13, 16 | 330 | 10 | 1200 | 0 | 0 | 0 | 22 | 13.56 | 30 | 28 |
|  | 4, 5, 6, 9 | 330 | 30 | 1200 | 0 | 0 | 0 | 40 | 13.56 | 50 | 24.5 |
|  | 7, 14 | 400 | 4 | 500 | 0 | 0 | 0 | 40 | 27.13 | 100 | 20 |
|  | 8, 15 | 400 | 4 | 800 | 0 | 0 | 0 | 40 | 27.13 | 10 | 25 |
| amorphous silicon film | 1, 2, 3, 10, 11, 12, 13, 16 | 330 | 220 | 0 | 0 | 220 | 0 | 160 | 13.56 | 160 | 28 |
|  | 4, 5, 6, 9 | 330 | 280 | 0 | 0 | 300 | 0 | 170 | 13.56 | 60 | 24.5 |
|  | 7, 14 | 250 | 25 | 0 | 0 | 150 | 0 | 66.5 | 27.13 | 30 | 25 |
|  | 8, 15 | 300 | 100 | 0 | 0 | 0 | 0 | 33.3 | 27.13 | 50 | 25 |

In addition, each film included in the layers including a semiconductor film in Samples 1 to 10 was formed over a separate silicon substrate. For each of these films, Table 5 shows the post-formation film stress and the film stress after heat treatment was performed at 650° C. for six minutes. Further, Table 5 shows values of the total stress of layers including a semiconductor film, which were calculated from the post-formation film stresses and film thicknesses. Also shown in Table 5 are values of the total stress of layers including a semiconductor film which are formed over substrates, which were calculated from the film stresses and film thicknesses from when after heating was performed at 650° C. for six minutes. Further, values of the total stress of layers including a semiconductor film which were calculated from the post-formation film stresses and film thicknesses of the films included in the layers including a semiconductor film in Samples 1 to 10, which were each formed over separate silicon substrates, are shown by triangular symbols in FIG. 21. Further, values of the total stress of layers including a semiconductor film which are formed over substrates, which were calculated from the film stresses and film thicknesses from when after the Samples 1 to 10 were heated at 650° C. for six minutes, are shown by black dots in FIG. 21. Note that the total stress S of the layers including a semiconductor film was calculated using Mathematical Formula 1 shown above.

[Table 5]

Further, when the total stress after heating of the layer including a semiconductor film, which is formed over the substrate, is less than −150 N/m, particularly less than −500 N/m, a problem occurs in that the layer including a semiconductor film peels from the substrate. Therefore, it is desirable that the total stress after heating of the layer including a semiconductor film, which is formed over the substrate, is a total stress after heating at which the layer including a semiconductor film does not peel from the substrate, that is, greater than or equal to −500 N/m, preferably, greater than or equal to −150 N/m.

Figure 22:
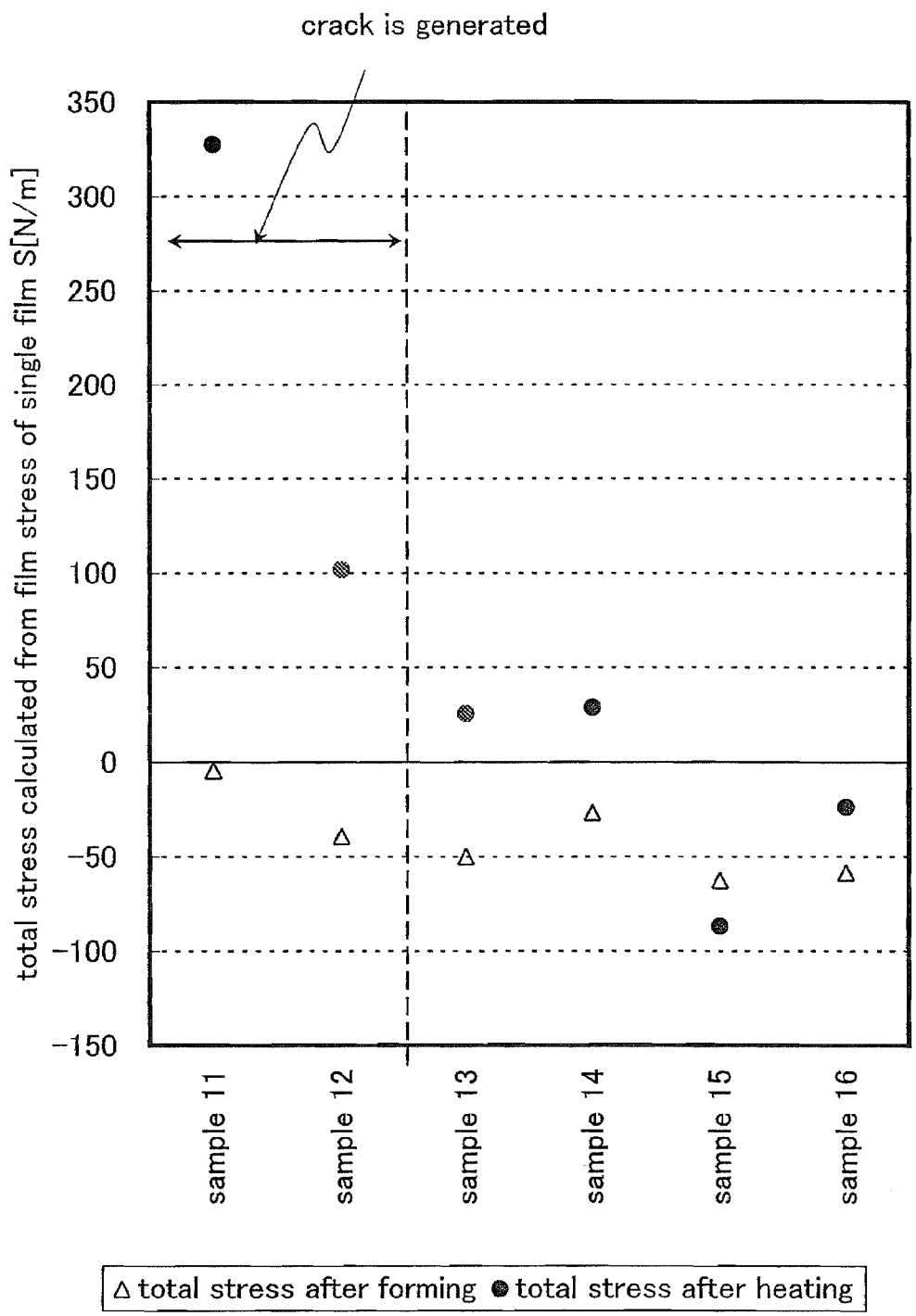
FIG. 22 is a graph showing total stress calculated from the film stress of single films.

Next, EAGLE2000 substrates (manufactured by Corning, Inc.) with a thermal expansion coefficient of $31.8 \times 10^{-7}/°C$ and a thickness of 0.7 mm were used as substrates. FIG. 22 shows the relationship between whether or not cracks formed in the substrate and a layer including a semiconductor film, which was formed over the substrate, when the layer including a semiconductor film was irradiated with a laser beam after being heated, and the total stress, calculated from the film stresses and film thicknesses of the films included in the layer including a semiconductor film.

TABLE 5

| | silicon nitride oxide film film stress σ · d[N/m] | | | silicon oxynitride film film stress σ · d[N/m] | | | amorphous silicon film film stress σ · d[N/m] | | | total stress S [N/m] | | presence or otherwise of cracks |
|---|---|---|---|---|---|---|---|---|---|---|---|---|
| | after forming | after heat treatment | fluctuation | after forming | after heat treatment | fluctuation | after forming | after heat treatment | fluctuation | after forming | after heat treatment | |
| sample 1 | 54.2 | 351.5 | 297.3 | −40.1 | −26.8 | 13.2 | −18.5 | 2.9 | 21.4 | −4.4 | 327.6 | presence |
| sample 2 | 19.4 | 125.5 | 106.2 | −40.1 | −26.8 | 13.2 | −18.5 | 2.9 | 21.4 | −39.2 | 101.6 | presence |
| sample 3 | 8.7 | 49.5 | 40.8 | −40.1 | −26.8 | 13.2 | −18.5 | 2.9 | 21.4 | −49.9 | 25.6 | presence |
| sample 4 | 31.0 | 79.8 | 48.9 | −18.6 | −6.9 | 11.7 | −22.4 | 2.7 | 25.1 | −10.0 | 75.7 | presence |
| sample 5 | 11.7 | 73.1 | 61.4 | −18.6 | −6.9 | 11.7 | −22.4 | 2.7 | 25.1 | −29.2 | 69.0 | presence |
| sample 6 | −6.9 | 46.0 | 52.9 | −18.6 | −6.9 | 11.7 | −22.4 | 2.7 | 25.1 | −47.9 | 41.8 | presence |
| sample 7 | 18.8 | 49.2 | 30.4 | −28.1 | −21.6 | 6.5 | −17.4 | 1.1 | 18.5 | −26.6 | 28.7 | presence |
| sample 8 | −23.7 | −38.9 | −15.3 | −20.7 | −46.7 | −26.1 | −18.3 | −1.2 | 17.1 | −62.6 | −86.9 | nothing |
| sample 9 | −31.8 | −11.7 | 20.1 | −18.6 | −6.9 | 11.7 | −22.4 | 2.7 | 25.1 | −72.7 | −15.9 | nothing |
| sample 10 | 0.0 | 0.0 | 0.0 | −40.1 | −26.8 | 13.2 | −18.5 | 2.9 | 21.4 | −58.6 | −23.9 | nothing |

Changes in the total stress of the layers including a semiconductor film after heating such as those shown in Table 5 are mainly due to the film formation conditions and film densities of the silicon nitride oxide films 502 and 512. When the silicon nitride oxide films 502 and 512 are formed with conditions which result in them being formed as dense films, the film stress of the silicon nitride oxide films 502 and 512 after heating is likely to be compressive stress. Further, comparing the film stress of the silicon oxynitride film and the amorphous silicon film before they are heated and after they are heated, there is not much change in the film stress. Therefore, due to the film stress of the silicon nitride oxide film becoming compressive stress, the total stress of the layer including a semiconductor film after heating becomes less than 0 N/m, preferably less than or equal to −16 N/m, so it becomes compressive stress.

As shown in FIG. 21, in Samples 1 to 7, a crack formed in the substrate and the layer including a semiconductor film. Meanwhile, in Samples 8 to 10, a crack did not form in the substrate and the layer including a semiconductor film.

From FIG. 21 and Table 5, it can be seen that when layers including a semiconductor film which have a total stress after heating of less than 0 N/m, preferably less than or equal to −16 N/m, are formed over AN100 substrates (manufactured by Asahi Glass Co., Ltd) with a thermal expansion coefficient of $38 \times 10^{-7}/°C$ and a thickness of 0.7 mm, even when the layers including a semiconductor film are irradiated with a laser beam, a crack does not form in the substrates and the layers including a semiconductor film.

Sample 11 had the structure 510 of FIG. 20A. A silicon nitride oxide film 502 with a thickness of 140 nm, a silicon oxynitride film 503 with a thickness of 100 nm, and an amorphous silicon film 504 with a thickness of 66 nm were each formed by a plasma CVD method in that order over a substrate 501 as the layer including a semiconductor film.

Samples 12 to 15 had the structure 520 of FIG. 20B. A silicon nitride oxide film 512 with a thickness of 50 nm, a silicon oxynitride film 503 with a thickness of 100 nm, and an amorphous silicon film 504 with a thickness of 66 nm were each formed by a plasma CVD method in that order over a substrate 501 as the layer including a semiconductor film.

Sample 16 had the structure 530 of FIG. 20C. A silicon oxynitride film 503 with a thickness of 100 nm and an amorphous silicon film 504 with a thickness of 66 nm were each formed by a plasma CVD method in that order over a substrate 501 as the layer including a semiconductor film.

Film formation conditions for Samples 11 to 16 are shown in Table 4 above.

In addition, each film included in the layers including a semiconductor film in Samples 11 to 16 was formed over a separate silicon substrate. For each of these films, Table 6 shows the post-formation film stress and the film stress after heat treatment was performed at 650° C. for six minutes. Further, Table 6 shows values of the total stress of layers including a semiconductor film which were calculated from the post-formation film stresses and film thicknesses. Also shown in Table 6 are values of the total stress of layers including a semiconductor film which are formed over substrates, which were calculated from the film stresses and film thicknesses from when after heating was performed at 650° C. for six minutes. Further, values of the total stress of layers including a semiconductor film which were calculated from the post-formation film stresses and film thicknesses of the films in the samples, which were each formed over separate silicon substrates, are shown by triangular symbols in FIG. 22. Further, values of the total stress of layers including a semiconductor film which are formed over substrates, which were calculated from the film stresses and film thicknesses from when after the Samples 11 to 16 were heated at 650° C. for six minutes, are shown by black dots in FIG. 22.
[Table 6]

TABLE 6

| | silicon nitride oxide film film stress σ · d[N/m] | | | silicon oxynitride film film stress σ · d[N/m] | | | amorphous silicon film film stress σ · d[N/m] | | | total stress S [N/m] | | presence or otherwise of cracks |
|---|---|---|---|---|---|---|---|---|---|---|---|---|
| | after forming | after heat treatment | fluctu-ation | after forming | after heat treatment | fluctu-ation | after forming | after heat treatment | fluctu-ation | after forming | after heat treatment | |
| sample 11 | 54.2 | 351.5 | 297.3 | −40.1 | −26.8 | 13.2 | −18.5 | 2.9 | 21.4 | −4.4 | 327.6 | presence |
| sample 12 | 19.4 | 125.5 | 106.2 | −40.1 | −26.8 | 13.2 | −18.5 | 2.9 | 21.4 | −39.2 | 101.6 | presence |
| sample 13 | 8.7 | 49.5 | 40.8 | −40.1 | −26.8 | 13.2 | −18.5 | 2.9 | 21.4 | −49.9 | 25.6 | nothing |
| sample 14 | 18.8 | 49.2 | 30.4 | −28.1 | −21.6 | 6.5 | −17.4 | 1.1 | 18.5 | −26.6 | 28.7 | nothing |
| sample 15 | −23.7 | −38.9 | −15.3 | −20.7 | −46.7 | −26.1 | −18.3 | −1.2 | 17.1 | −62.6 | −86.9 | nothing |
| sample 16 | 0.0 | 0.0 | 0.0 | −40.1 | −26.8 | 13.2 | −18.5 | 2.9 | 21.4 | −58.6 | −23.9 | nothing |

Changes in the total stress of the layers including a semiconductor film after heating such as those shown in Table 6 are mainly due to the film formation conditions and film densities of the silicon nitride oxide films 502 and 512. When the silicon nitride oxide films 502 and 512 are formed with conditions such as a slow film formation speed or a high temperature, for example, a dense film results. As a result, the value of the total stress at which the layer including a semiconductor film does not peel from the substrate after heating is less than +50 N/m, preferably less than or equal to +28 N/m.

As shown in FIG. 22, in Samples 11 and 12, a crack formed in the substrate and the layer including a semiconductor film. Meanwhile, in Samples 13 to 16, a crack did not form in the substrate and the layer including a semiconductor film.

From FIG. 22 and Table 6, it can be seen that when a layer including a semiconductor film which has a total stress after heating of less than +50 N/m, preferably less than or equal to +28 N/m, is formed over an EAGLE2000 substrate (manufactured by Corning, Inc.) with a thermal expansion coefficient of $31.8 \times 10^{-7}/°$ C. and a thickness of 0.7 mm, even when the layer including a semiconductor film is irradiated with a laser beam, cracks do not form in the substrate and the layer including a semiconductor film.

Further, when the total stress after heating of the layer including a semiconductor film, which is formed over the substrate, is less than −150 N/m, particularly less than −500 N/m, a problem occurs in that the layer including a semiconductor film peels from the substrate. Therefore, it is desirable that the total stress after heating of the layer including a semiconductor film, which is formed over the substrate, is greater than or equal to −500 N/m, preferably greater than or equal to −150 N/m.

When a layer including a semiconductor film which has a total stress after heating of greater than or equal to −500 N/m and less than 0 N/m, preferably greater than or equal to −150 N/m and less than or equal to −16 N/m, is formed over an AN100 substrate (manufactured by Asahi Glass Co., Ltd) with a thermal expansion coefficient of $38 \times 10^{-7}/°$ C. and a thickness of 0.7 mm, and subsequently the layer is irradiated with a laser beam, the number of cracks that form in the substrate and the layer including a semiconductor film can be reduced.

Further, it can be seen that when a layer including a semiconductor film, which has a total stress after heating of greater than or equal to −500 N/m and less than +50 N/m, preferably greater than or equal to −150 N/m and less than or equal to +28 N/m, is formed over an EAGLE2000 substrate (manufactured by Corning, Inc.) with a thermal expansion coefficient of $31.8 \times 10^{-7}/°$ C. and a thickness of 0.7 mm, even when the layer including a semiconductor film is irradiated with a laser beam, cracks do not form in the substrate and the layer including a semiconductor film.

Therefore, when a layer including a semiconductor film, which has a total stress after heating of −500 N/m to +50 N/m, inclusive, preferably −150 N/m to 0 N/m, inclusive, is formed over a substrate having a thermal expansion coefficient of greater than $6 \times 10^{-7}/°$ C. and less than or equal to $38 \times 10^{-7}/°$ C., preferably greater than $6 \times 10^{-7}/°$ C. and less than or equal to $31.8 \times 10^{-7}/°$ C., and subsequently the layer is irradiated with a laser beam, the number of cracks that form in the substrate and the layer including a semiconductor film can be reduced.

Embodiment 2

In this embodiment, the stress of a layer including an amorphous semiconductor film, which is formed over a substrate, after the layer has been heated (experimental value), and the number of cracks that formed when the amorphous semiconductor film was irradiated with a laser beam will be described with reference to FIG. 23.

A layer including an amorphous semiconductor film was formed over a substrate. Here, an AN100 substrate with a thermal expansion coefficient of $38 \times 10^{-7}/°$ C. and a thickness of 0.7 mm was used as the substrate.

For Samples 21-1 to 21-3, a silicon nitride oxide film with a thickness of 50 nm, a silicon oxynitride film with a thickness of 100 nm, and an amorphous silicon film with a thickness of 66 nm were formed in that order over the substrate as the layer including a semiconductor film.

For Samples 22-1 to 22-3, a silicon nitride oxide film with a thickness of 50 nm, a silicon oxynitride film with a thickness of 100 nm, and an amorphous silicon film with a thickness of 66 nm were formed in that order over the substrate as the layer including a semiconductor film.

For Samples 23-1 to 23-3, a silicon oxynitride film with a thickness of 100 nm and an amorphous silicon film with a thickness of 66 nm were formed over the substrate in that order as the layer including a semiconductor film.

Film formation conditions for each of the films included in the layers including a semiconductor film in Samples 21-1 to 21-3, Samples 22-1 to 22-3, and Samples 23-1 to 23-3 are shown in Table 7.

[Table 7]

TABLE 7

| film | sample | temperature of substrate (° C.) | SiH$_4$ (sccm) | N$_2$O (sccm) | NH$_3$ (sccm) | H$_2$ (sccm) | N$_2$ (sccm) | pressure (Pa) | RF frequency (MHz) | RF power (W) | distance between electrodes (mm) |
|---|---|---|---|---|---|---|---|---|---|---|---|
| silicon nitride oxide film | 21-1~21-3 22-1~22-3 23-1~23-3 | 330 330 — | 110 30 — | 70 30 — | 800 300 — | 800 800 — | 800 0 — | 100 120 — | 13.56 13.56 — | 320 320 — | 28 28 — |
| silicon oxynitride film | 21-1~21-3 22-1~22-3 23-1~23-3 | 330 | 10 | 1200 | 0 | 0 | 0 | 22 | 13.56 | 30 | 28 |
| amorphous silicon film | 21-1~21-3 22-1~22-3 23-1~23-3 | 330 | 220 | 0 | 0 | 220 | 0 | 160 | 13.56 | 160 | 28 |

Next, Samples 21-1 to 21-3 were heated in a furnace at 500° C. for one hour and then at 550° C. for four hours, to dehydrogenate the amorphous semiconductor film.

Figure 24:
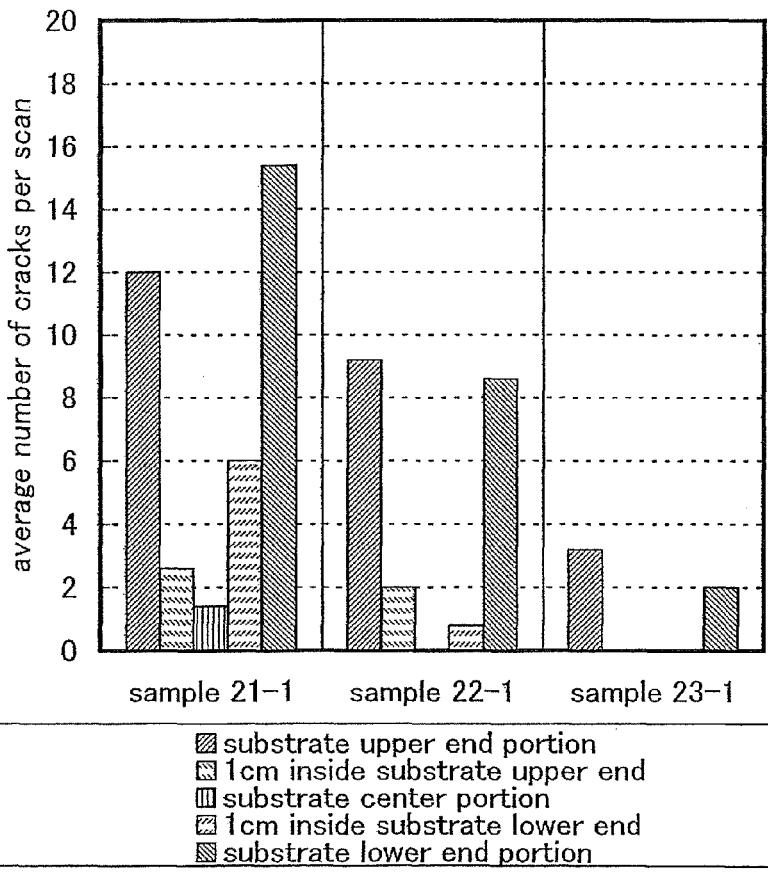
FIG. 24 is a graph showing the generation of cracks when layers including a semiconductor film which are formed over substrates were irradiated with a laser beam.

The number of cracks that formed in Sample 21-1, Sample 22-1, and Sample 23-1 after they were irradiated with a laser beam is shown in FIG. 24. The number of cracks at this time in the substrate upper end portion, the substrate center portion, the substrate lower end portion, 1 cm inside the substrate upper end, and 1 cm inside the substrate lower end are each shown.

Irradiating conditions of the laser beam at this time were a second harmonic of an Nd:YVO$_4$ laser, a scanning speed of 35 cm/sec, and a power of 18 W.

Figure 23:
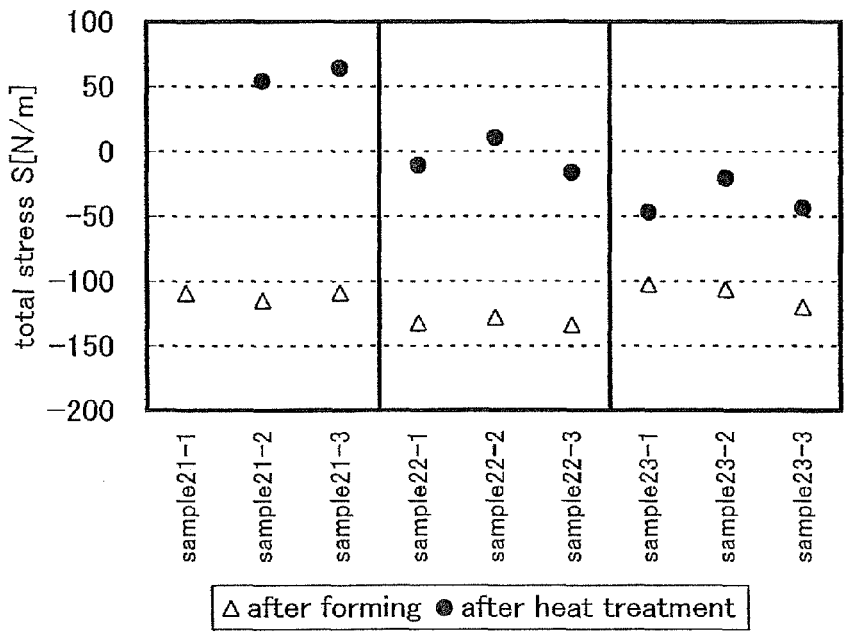
FIG. 23 is a graph showing the total stress of layers including a semiconductor film which are formed over substrates.

From FIG. 23, it can be seen that the total stress after heating of the layer including a semiconductor film in Samples 21-1 to 21-3 is tensile stress. Note that since the total stress of Sample 21-1 was tensile stress with a value of greater than 100, it is not plotted in the graph in FIG. 23. The total stress after heating of the layer including a semiconductor film in Samples 22-1 to 22-3 is approximately zero. The total stress after heating of the layer including a semiconductor film in Samples 23-1 to 23-3 is compressive stress, which is lower than zero.

Note that in this embodiment, AN100 substrates were used as substrates. Further, for Samples 21-1 to 21-3, the same film formation conditions as those for Sample 2 in Embodiment 1 were used; for Samples 22-1 to 22-3, the same film formation conditions as those for Sample 3 in Embodiment 1 were used; and for Samples 23-1 to 23-3, the same film formation conditions as those for Sample 10 in Embodiment 1 were used.

For Sample 2, Sample 3 and Sample 10 of Embodiment 1, each film in the layer including a semiconductor film, which was formed over a substrate, was formed over a separate silicon substrate and then heated, and the total stress of the layer including a semiconductor film was calculated by adding together the products of the film stresses and the film thicknesses. Meanwhile, for each sample in this embodiment, an AN100 substrate was used as a substrate. When an AN100 substrate is heated at 550° C., a certain amount of compressive stress is generated. Therefore, for the samples in Embodiment 2, the total stress of the layers formed over the substrates also shifted toward the compressive stress side somewhat, compared with their corresponding samples in Embodiment 1.

From FIG. 24, it can be seen that Sample 22-1, that is, the sample in which the total stress of the layer including a semiconductor film after heating was approximately zero, has a lower number of cracks compared with Sample 21-1, that is, the sample in which the total stress of the layer including a semiconductor film after heating was tensile stress.

Further, it can be seen that Sample 23-1, that is, the sample in which the total stress of the layer including a semiconductor film after heating was compressive stress which was lower than approximately zero, has a lower number of cracks compared with Sample 22-1, that is, the sample in which the total stress of the layer including a semiconductor film after heating was approximately zero.

That is, when the total stress of a layer including an amorphous silicon film, which is formed over a substrate, after it has been heated is less than or equal to 0 N/m, the number of cracks in the substrate can be reduced. Further, it can be seen that the formation of cracks in the center of the substrate can be prevented. That is, when the total stress of a layer including an amorphous silicon film, which is formed over a substrate, after it has been heated is less than or equal to 50 N/m, preferably less than or equal to 0 N/m, the formation of cracks in the center of the substrate can be prevented.

Note that the reason that the number of cracks in the substrate upper end portion and the substrate lower end portion is higher compared with the number of cracks in the substrate center portion, the number of cracks in the area 1 cm inside the substrate upper end, and the number of cracks in the area 1 cm inside the substrate lower end in FIG. 24 is that tensile stress concentrates in flaws in the substrate ends, so cracks progress easily therein.

Accordingly, when a layer including a semiconductor film, which has a total stress after being heated of −500 N/m to +50 N/m, inclusive, preferably −150 N/m to 0 N/m, inclusive, is formed over a substrate having a thermal expansion coefficient of greater than $6 \times 10^{-7}$/° C. and less than or equal to $38 \times 10^{-7}$/° C., preferably greater than $6 \times 10^{-7}$/° C. and less than or equal to $31.8 \times 10^{-7}$/° C., and subsequently the layer is irradiated with a laser beam, the number of cracks that form in the substrate and the layer including a semiconductor film can be reduced. Further, the formation of cracks in the substrate center can be prevented.

This application is based on Japanese patent application serial no. 2006-199241 filed in Japan Patent Office on Jul. 21, 2006, the entire contents of which are hereby incorporated by reference.

What is claimed is:

1. A semiconductor device comprising:
   a glass substrate;
   an insulating layer over the glass substrate; and
   a semiconductor layer over the insulating layer,
   wherein the insulating layer is formed by using a source gas of a mixture of SiH$_4$, N$_2$O, NH$_3$ and H$_2$,
   wherein the source gas does not substantially comprise N$_2$,
   wherein the insulating layer and the semiconductor layer are irradiated with a laser beam after a heating treatment, wherein the semiconductor layer has tensile stress,
wherein the insulating layer has compressive stress,
wherein total stress of the insulating layer and the semiconductor layer is −150 N/m to 0 N/m after the heating treatment, and
wherein the glass substrate has a thermal expansion coefficient of greater than $6\times10^{-7}/°$ C. and less than or equal to $31.8\times10^{-7}/°$ C.

2. The semiconductor device according to claim 1, wherein the insulating layer is a silicon nitride oxide layer.

3. The semiconductor device according to claim 1,
wherein the semiconductor layer has a melted region that extends down to the insulating layer by irradiating with the laser beam.

4. An electronic apparatus having the semiconductor device according to claim 1.

5. The electronic apparatus according to claim 4,
wherein the electronic apparatus is a portable information terminal, a digital video camera, a portable terminal, a portable television device, a portable computer, or a television device.

6. A semiconductor device comprising:
a silicon nitride oxide layer over a glass substrate;
a silicon oxynitride layer over the silicon nitride oxide layer; and
a semiconductor layer over the silicon oxynitride layer,
wherein the silicon nitride oxide layer is formed by using a source gas of a mixture of $SiH_4$, $N_2O$, $NH_3$ and $H_2$,
wherein the source gas does not substantially comprise $N_2$,
wherein the silicon nitride oxide layer, the silicon oxynitride layer and the semiconductor layer are irradiated with a laser beam after a heating treatment,
wherein the semiconductor layer has tensile stress,
wherein the silicon nitride oxide layer has compressive stress,
wherein total stress of the silicon nitride oxide layer, the silicon oxynitride layer and the semiconductor layer is −150 N/m to 0 N/m after the heating treatment, and
wherein the glass substrate has a thermal expansion coefficient of greater than $6\times10^{-7}/°$ C. and less than or equal to $31.8\times10^{-7}/°$ C.

7. The semiconductor device according to claim 6,
wherein the semiconductor layer has a melted region that extends down to the silicon oxynitride layer by irradiating with the laser beam.

8. An electronic apparatus having the semiconductor device according to claim 6.

9. The electronic apparatus according to claim 8,
wherein the electronic apparatus is a portable information terminal, a digital video camera, a portable terminal, a portable television device, a portable computer, or a television device.

10. A semiconductor device comprising:
a silicon nitride oxide layer over a glass substrate;
a silicon oxynitride layer over the silicon nitride oxide layer; and
a semiconductor layer over the silicon oxynitride layer,
wherein thicknesses of the silicon nitride oxide layer, the silicon oxynitride layer, and the semiconductor layer are 40 to 60 nm, 80 to 120 nm, and 50 to 80 nm, respectively,
wherein the silicon nitride oxide layer, the silicon oxynitride layer, and the semiconductor layer are formed by a plasma CVD method,
wherein the silicon nitride oxide layer is formed by using a source gas of a mixture of $SiH_4$, $N_2O$, $NH_3$ and $H_2$,
wherein the source gas does not substantially comprise $N_2$,
wherein the silicon nitride oxide layer, the silicon oxynitride layer, and the semiconductor layer are irradiated with a laser beam after a heating treatment,
wherein the semiconductor layer has tensile stress,
wherein the silicon nitride oxide layer has compressive stress,
wherein total stress of the silicon nitride oxide layer, the silicon oxynitride layer and the semiconductor layer is −150 N/m to 0 N/m after the heating treatment, and
wherein the glass substrate has a thermal expansion coefficient of greater than $6\times10^{-7}/°$ C. and less than or equal to $31.8\times10^{-7}/°$ C.

11. The semiconductor device according to claim 10,
wherein the semiconductor layer has a melted region that extends down to the silicon oxynitride layer by irradiating with the laser beam.

12. An electronic apparatus having the semiconductor device according to claim 10.

13. The electronic apparatus according to claim 12,
wherein the electronic apparatus is a portable information terminal, a digital video camera, a portable terminal, a portable television device, a portable computer, or a television device.

* * * * *